US 8,809,148 B2

(12) United States Patent
Lee et al.

(10) Patent No.: US 8,809,148 B2
(45) Date of Patent: Aug. 19, 2014

(54) EEPROM-BASED, DATA-ORIENTED COMBO NVM DESIGN

(75) Inventors: Peter Wung Lee, Saratoga, CA (US); Fu-Chang Hsu, San Jose, CA (US)

(73) Assignee: Aplus Flash Technology, Inc., Fremont, CA (US)

( * ) Notice: Subject to any disclaimer, the term of this patent is extended or adjusted under 35 U.S.C. 154(b) by 309 days.

(21) Appl. No.: 13/200,142

(22) Filed: Sep. 19, 2011

(65) Prior Publication Data

US 2012/0069651 A1    Mar. 22, 2012

Related U.S. Application Data

(60) Provisional application No. 61/403,555, filed on Sep. 17, 2010.

(51) Int. Cl.
 *H01L 21/336* (2006.01)
(52) U.S. Cl.
 USPC .................. 438/263; 257/E21.639; 257/321
(58) Field of Classification Search
 CPC .................................................. H01L 27/11517
 USPC .................................................. 257/E21.639
 See application file for complete search history.

(56) References Cited

U.S. PATENT DOCUMENTS

| | | | |
|---|---|---|---|
| 4,599,707 A | 7/1986 | Fang | |
| 5,960,285 A * | 9/1999 | Hong | 438/264 |
| 6,365,929 B2 * | 4/2002 | Smolen | 257/315 |
| 6,479,347 B1 | 11/2002 | Dalla Libera et al. | |
| 2004/0079972 A1 | 4/2004 | Yoon | |
| 2005/0009276 A1 | 1/2005 | Rudeck | |
| 2009/0190402 A1 | 7/2009 | Hsu et al. | |
| 2010/0171168 A1 | 7/2010 | Yu et al. | |

OTHER PUBLICATIONS

PCT Search Report—PCT/US 11/01610 Mail date—Mar. 26, 2012, Aplus Flash Technology, Inc.
Co-pending U.S. Appl. No. 13/199,785, filed Sep. 9, 2011, "A Most Compact FLOTOX-Based Combo NVM Design Without Sacrificing EEPROM Endurance Cycles for 1-Die Data and Code Storage," assigned to the same assignees as the present invention, 111 pgs.
Co-pending U.S. Appl. No. 13/200,010, filed Sep. 15, 2011, "An EEPROM-Based, Data-Oriented Combo NVM Design," assigned to the same assignee as the present invention, 111 pgs.
Co-pending U.S. Appl. No. 61/403,479, filed Sep. 15, 2010, assigned to the same assignee as the present invention, 55 pgs.

* cited by examiner

*Primary Examiner* — Eva Yan Montalvo
*Assistant Examiner* — Christopher Johnson
(74) *Attorney, Agent, or Firm* — Saile Ackerman LLC; Stephen B. Ackerman; Billy Knowles

(57) ABSTRACT

A nonvolatile memory device has a combination of FLOTOX EEPROM nonvolatile memory arrays. Each FLOTOX-based nonvolatile memory array is formed of FLOTOX-based nonvolatile memory cells that include at least one floating gate tunneling oxide transistor such that a coupling ratio of the control gate to the floating gate of the floating gate tunneling oxide transistor is from approximately 60% to approximately 70% and a coupling ratio of the floating gate to the drain region of the floating gate tunneling oxide transistor is maintained as a constant of is from approximately 10% to approximately 20% and such that a channel length of the channel region is decreased such that during the programming procedure a negative programming voltage level is applied to the control gate and a moderate positive programming voltage level is applied to the drain region to prevent the moderate positive programming voltage level from exceeding a drain-to-source breakdown voltage.

7 Claims, 26 Drawing Sheets

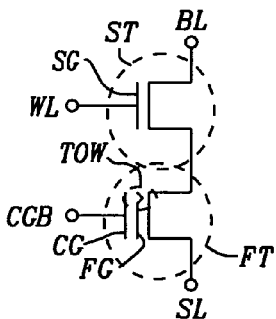
FIG. 1a – Prior Art
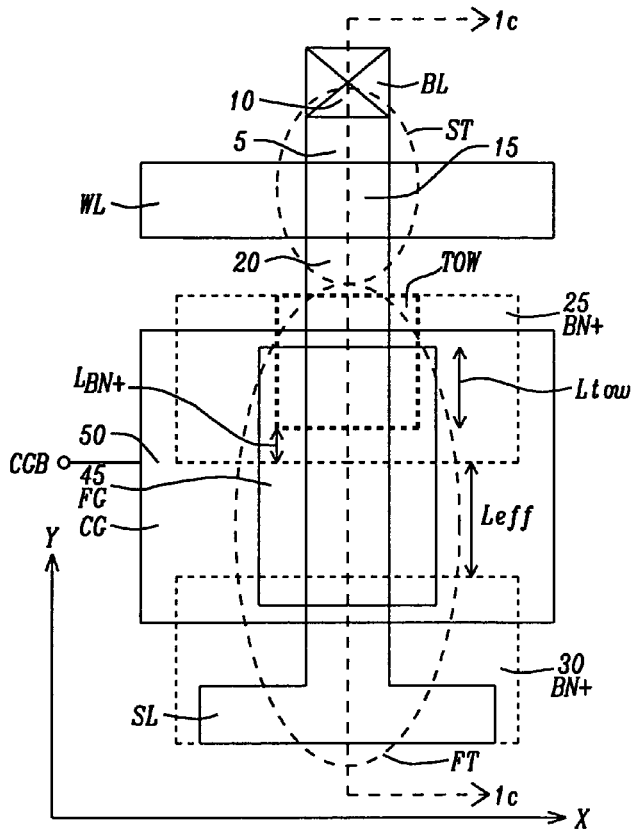
FIG. 1b – Prior Art
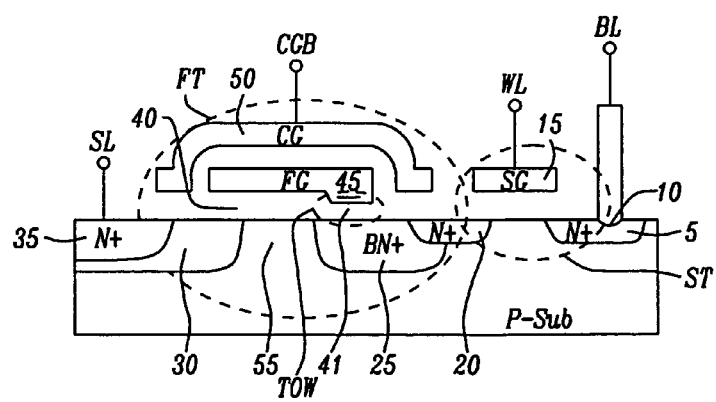
FIG. 1c – Prior Art

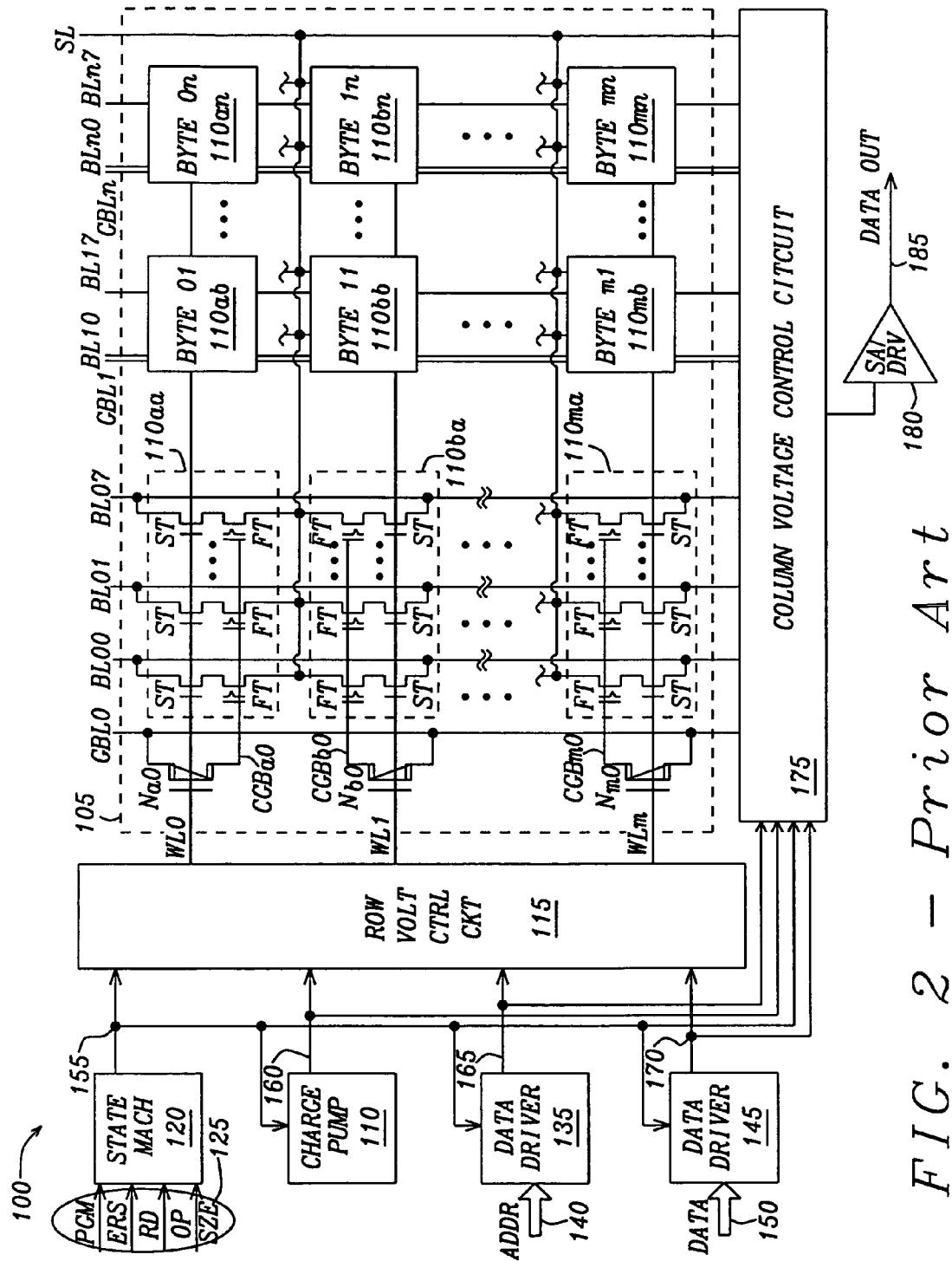
FIG. 2 – Prior Art

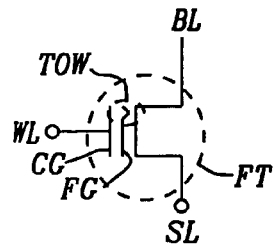
FIG. 3a – Prior Art
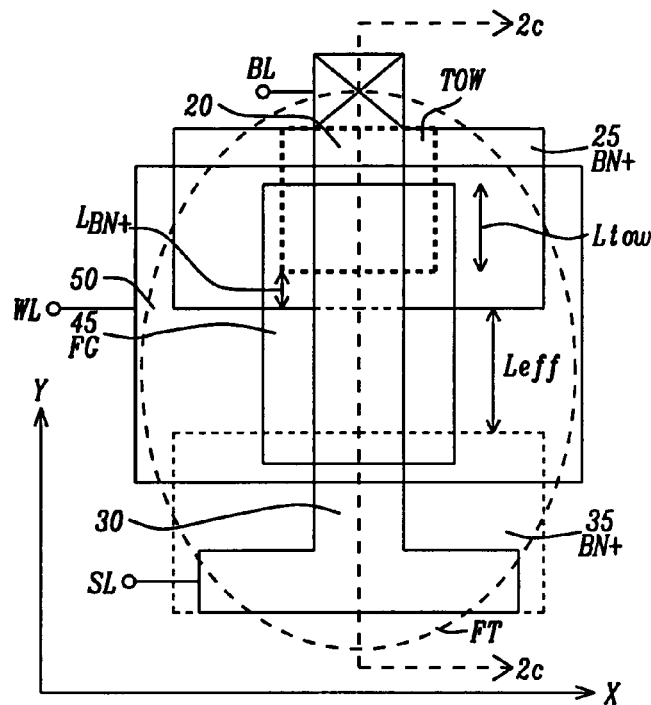
FIG. 3b – Prior Art
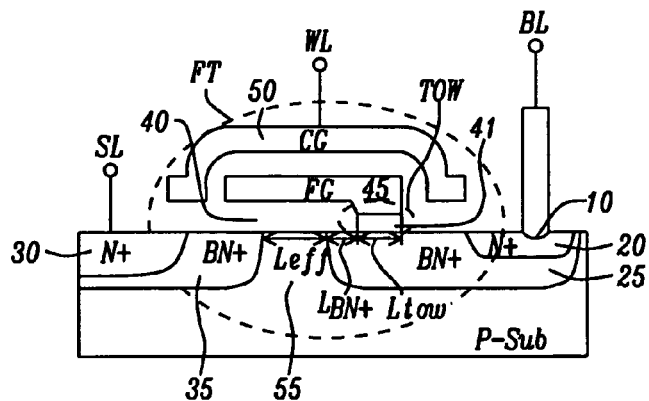
FIG. 3c – Prior Art

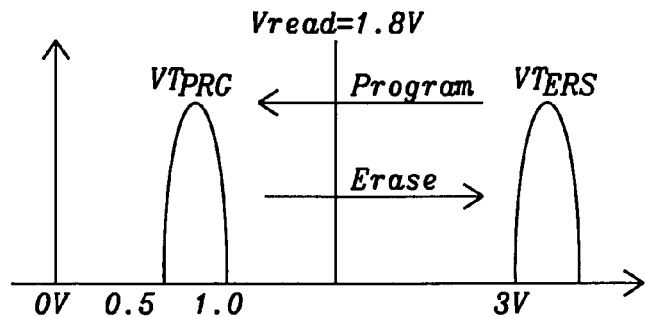

FIG. 8b

|  | Selected WL | Unselected WL | Selected BL | Unselected BL | Selected SL | Unselected SL |
|---|---|---|---|---|---|---|
| Erase | VPP1 | 0V | 0V | N/A | 0V | N/A |
| Program | 0V | VPP2 | VPP1 | VPP3 | FL | FL |
| Read | Vread | 0V | <1.0V | FL | 0V | 0V |

VPP1=14.0V~16.0V, VPP2=8.0V~10.0V, VPP3=3.0V~5.0V,
Vread=1.8 to ~3.0V

FIG. 8c

|  | Selected WL | Unselected WL | Selected BL | Unselected BL | Selected SL | Unselected SL |
|---|---|---|---|---|---|---|
| Erase | VPP1 | 0V | 0V | N/A | 0V | N/A |
| Program | VNN1 | VPP3 | VPP2 | 0V | FL | FL |
| Read | Vread | 0V | <1.0V | FL | 0V | 0V |

VPP1=14.0V~16.0V, VPP2=8.0V~10.0V, VPP3=3.0V~5.0V,
VNN1=-3.0V to -5.0V, Vread=1.8~3.0V

| | Selected Paired WL (WL0) | Unselected Paired WL (WL1) | Other Unselected WL | Selected BL | Unselected BL | Selected SL | Unselected SL |
|---|---|---|---|---|---|---|---|
| Erase | VPP1 | 0V | 0V | N/A | N/A | N/A | N/A |
| Program | 0V | VPP2 | VPP2 | VPP1 | VPP3 | FL | FL |
| Read | Vread | Vpass | 0V | <1.0V | FL | 0V | 0V |

VPP1=14.0V~16.0V, VPP2=8.0V~10.0V, VPP3=3.0V~5.0V, Vread=~1.8V, Vpass=4.0V~5.0V

FIG. 9c

| | Selected Paired WL (WL0) | Unselected Paired WL (WL1) | Other Unselected WL | Selected BL | Unselected BL | Selected SL | Unselected SL |
|---|---|---|---|---|---|---|---|
| Erase | VPP1 | 0V | 0V | N/A | N/A | N/A | N/A |
| Program | VNN1 | VPP2 | VPP3 | VPP2 | 0V | FL | FL |
| Read | Vread | Vpass | 0V | <1.0V | FL | 0V | 0V |

VPP1=14.0V~16.0V, VPP2=8.0V~10.0V, VPP3=3.0V~5.0V,
VNN1=~3.0V to -5.0V, Vread=~1.8V, Vpass=4.0V~5.0V

|  | Selected Bytes | | | | Unselected Bytes | | | |
|---|---|---|---|---|---|---|---|---|
|  | WL | CG | BL | SL | WL | CG | BL | SL |
| Selected Page ERS | VPP1 | VPP1 | 0V | FL | VPP1 | VPP1 | VPP2 | FL |
| Unselected Pages ERS | VPP3 | 0V | 0V | FL | VPP3 | 0V | VPP2 | FL |
| Selected Page PGM | VPP1 | 0V | VPP1 | FL | VPP1 | 0V | 0V | FL |
| Unselected Pages PGM | VPP3 | 0V | VPP1 | FL | VPP3 | 0V | 0V | FL |
| Selected Page Read | VDD | Vread | <1V | 0V | VDD | Vread | FL | 0V |
| Unselected Pages Read | 0V | Vread | <1V | 0V | 0V | Vread | FL | 0V |

VPP1=14.0V~16.0V, VPP2=8.0V to ~16.0V, VPP3=0~VDD, Vread=0V~1.0V, VDD=1.8V~3.0V

FIG. 10b

|  | Selected Bytes | | | | Unselected Bytes | | | |
|---|---|---|---|---|---|---|---|---|
|  | WL | CG | BL | SL | WL | CG | BL | SL |
| Selected Page ERS | VPP1 | VPP1 | 0V | FL | VPP1 | VPP1 | VPP2 | FL |
| Unselected Pages ERS | VPP3 | 0V | 0V | FL | VPP3 | 0V | VPP2 | FL |
| Selected Page PGM | VPP1 | VPP1 | VPP5 | FL | VPP1 | VNN1 | FL | FL |
| Unselected Pages PGM | VPP3 | 0V | VPP5 | FL | VPP3 | 0V | FL | FL |
| Selected Page Read | VDD | Vread | <1V | 0V | VDD | Vread | FL | 0V |
| Unselected Pages Read | 0V | Vread | <1V | 0V | 0V | Vread | FL | 0V |

VPP1=14.0V to 16.0V, VPP2=8.0V~16.0V, VPP3=0.0V to ~VDD,
VNN1=3.0V to -5.0V, VPP5=8.0V~10.0V, Vread=0V~1.0V, VDD=1.8V~3.0V

FIG. 10c

EEPROM-BASED, DATA-ORIENTED COMBO NVM DESIGN

This application claims priority under 35 U.S.C. §119 to U.S. Provisional Patent Application U.S. Provisional Patent Application Ser. No. 61/403,555, filed on Sep. 17, 2010, assigned to the same assignee as the present invention, and incorporated herein by reference in its entirety.

RELATED PATENT APPLICATIONS

U.S. patent application Ser. No. 13/200,010, filed on Sep. 15, 2011, assigned to the same assignee as the present invention, and incorporated herein by reference in its entirety.

U.S. Provisional Patent Application Ser. No. 61/403,479, filed on Sep. 15, 2010, assigned to the same assignee as the present invention, and incorporated herein by reference in its entirety.

BACKGROUND OF THE INVENTION

1. Field of the Invention

This invention relates generally to nonvolatile memory devices, circuits, systems, and methods of operation. More particularly, this invention relates to floating gate tunnel oxide (FLOTOX) Electrical Erasable Programmable Read Only Memory (EEPROM) devices, circuits, systems, and methods of operation.

2. Description of Related Art

Nonvolatile memory is well known in the art. The different types of nonvolatile memory that employ a charge retention mechanism include Read-Only-Memory (ROM), Electrically Programmable Read Only Memory (EPROM), Electrically Erasable Programmable Read Only Memory (EEPROM), NOR Flash Memory, and NAND Flash Memory. The charge retention mechanism may be charge storage, as in a floating gate memory cell, and charge trapping, as in a Silicon-Oxide-Nitride-Oxide-Silicon (SONOS) or Metal-Oxide-Nitride-Oxide-Silicon (MONOS) memory cell A NAND Flash memory is formed of strings of serially connected charge retaining transistors with contact metallurgy between the memory cells to save silicon area. Since NAND Flash memory cell does not require any contact metallurgy in the drain and source terminals of the charge retaining transistors, the single cell size is the smallest of the nonvolatile memory circuits.

The NAND Flash memory cell design has several advantages. Firstly, its cell size is highly scalable and is able to have a cell size that is a factor of approximately four times (4×) larger than the minimum feature size ($\lambda^2$) of the manufacturing technology. This has held in technologies with feature sizes from 0.25 µm down to 20 nm. This is the smallest nonvolatile memory cell when compared to other nonvolatile cell types. Secondly, NAND Flash memory cell design uses a low-current Fowler-Nordheim tunneling phenomena for both program and erase operations. The Fowler-Nordheim Tunneling allows the program and erase operations to be performed in relatively larger memory unit sizes and a faster speed. The Fowler-Nordheim erase operation is typically performed in a unit of a large sector with sizes ranging from 512 Kb to 2 Mb and 1 mS fast erase time in current specifications. The Fowler-Nordheim program is performed in a unit of a large page size varying from 512 B to 2 KB with a fast speed of 200 µS typically in the current specifications.

The only disadvantage of NAND Flash memory array is the read operation that can only be performed in serial mode with a slow speed of 10 µs per page. The NAND Flash memory array is commonly and extensively used as a slow, serial data storage memory for audio and video applications. A NAND Flash memory array is not suitable for code storage in embedded MCU applications. The highest density of a NAND Flash memory device at the current lithographic minimum feature size of 20 nm for current manufacturing technology is 64 Gb (bits).

By contrast, NOR Flash memory device is formed of an array of less-compact charge retaining transistors that are fundamentally connected in parallel, rather than serially in a NAND Flash memory array. Like a NAND Flash memory charge storage transistor, the NOR Flash memory charge storage transistor is also made of the stack-gate cell structure for the floating gate transistors. In the charge retaining transistors, the NOR Flash memory charge trapping transistors are essentially identical to the NAND Flash memory charge trapping transistors. Each NOR Flash memory cell has a contact metallurgy at each drain and source node to connect each NOR Flash memory cell to the common bit lines and source lines. The cell size for the NOR Flash memory, therefore, is larger than the NAND Flash memory.

A disadvantage of the NOR Flash memory cell is that dimensions of the cell are not as highly scalable as NAND Flash memory cell counterpart. In current manufacturing technology, the NOR Flash memory cell technology is approximately three generations behind that of the NAND Flash memory cell technology. The nominal cell size at the manufacturing technology at 65 nm. The relative cell size as compared to the smallest feature size possible with the current manufacturing technology is getting large as the manufacturing technology migrates below 65 nm. In the manufacturing technology process nodes of 45 nm and below, the one-transistor NOR Flash memory cell is realized with an area of 15 times the minimum feature size ($\lambda^2$).

A second disadvantage of a NOR Flash memory cell is the usage of the high-current channel-hot electron (CHE) phenomena for programming. On the average, each NOR flash memory cell has a high cell current of more than 100 uA for a period of 5 µS flowing through it for program operation. As a result, the NOR flash memory program operation can only be performed in units of byte or word when an on-chip weak high voltage charge-pump circuit is employed rather than an external programming power supply voltage source ($V_{PP}$). The programming speed of the NOR flash memory array is for a page size of 512 B or 2 KB and is much slower than NAND flash memory array and EEPROM memory array in roughly equivalent array densities that use a low-current Fowler-Nordheim phenomena.

A third disadvantage of a NOR Flash memory cell is the long erase time due to the long-held concern for over-erase. Although a one-transistor NOR flash memory cells employs similar low-current Fowler-Nordheim scheme like NAND and EEPROM for its erase operation, the organization of one-transistor cell array is connected in parallel-form and is prone to a high cell leakage current as a result of the erase operation. The NOR Flash memory array erase is performed in a large unit of a block with a size ranging from 512 Kb to 2 Mb.

The only advantage of NOR Flash memory array is that its read operation. The NOR Flash memory is read randomly with a fast speed of 100 ns or below in a unit of byte or word in an array density of approximately 1 Gb. The NOR Flash memory array read speed is approximately 200 faster than the read speed of its NAND flash memory array counterpart. As a result, a NOR flash memory array is commonly and extensively used as a fast random code storage memory for embedded MCU applications. The current NOR Flash memory array technology has migrated to a minimum feature size of 45 nm for mass production and the highest density achieved is up to 2 Gb in a single chip.

As is known in the art, an EEPROM memory array is structured to be a byte-wise erasable structure as compared to block-wise erasable NAND flash memory arrays. EEPROM memory array require more die area than a NAND flash memory of the same capacity because each EEPROM memory cell requires a read, write and erase transistor. Conversely, in a NAND flash memory array, the erase circuits are shared by large blocks of cells (often 512×8 bits).

An EEPROM memory array design has its own set of advantages and disadvantages. The first disadvantage is a large cell size that is the largest among the nonvolatile memory structures. Currently, the EEPROM manufacturing technology process, in real production, is about four (4) generations behind NOR Flash memory manufacturing technology and seven (7) generations behind the NAND Flash memory manufacturing technology. The cell size will be relatively larger as technology migrates below 0.15 µm. In the manufacturing process node above and including 0.18 µm, the EEPROM cell has been realized with a cell area size of about 90 times the minimum feature size ($\lambda^2$) but will have an area larger than 100 times the minimum feature size ($\lambda^2$) when migrating below 0.15 µm.

The second disadvantage of the EEPROM memory array design is that a very high programming voltage is required. The programming voltage is as high as 16V in the cell channel region between its drain and source nodes for performing proper Fowler-Nordheim Program operation. As a result, the EEPROM memory array program operation is the most critical one as compared to NAND Flash memory array and NOR Flash memory array. The very high programming voltage requirement in cell's channel region between the drain and source prevents the EEPROM memory cell area from further scaling below the 0.15 µm minimum feature size. During a page program operation, almost 1K bit lines and one word line is charged to the very high programming voltage of 16V in the worst-case. The page size varies from 8 bytes in low-density 2 kb part to 256 Bytes for high-density parts such as 1-2 Mb with page program speed of around 1 mS.

The first advantage of EEPROM memory array design is the short program time which is attributed to two major advantages. As opposed to the conventional NOR Flash design, the threshold voltage (Vt) of EEPROM memory cells is decreased after program and is increased after erase. Therefore the concern of over-erase in a one-transistor NOR Flash memory array is not a concern in a two-transistor EEPROM array design. The EEPROM memory cell has a two-transistor structure with a single polycrystalline silicon bit line select transistor connected in series with a charge retaining transistor (floating-gate or SONOS) double polycrystalline silicon storage cell. The threshold voltage (Vt) of the bit line select transistor is a positive voltage level of 0.7V. The effective threshold voltage (Vt) of the two-transistor EEPROM memory cell is a positive voltage level of approximately 0.7V even the charge retaining transistor threshold voltage level (Vt) becomes negative after over-program operation. As a result, the two-transistor EEPROM memory cell has no concern for over-programming of the charge retaining transistor. Thus the program operation is fast in unit of page with a speed of about 1 mS in the two-transistor EEPROM memory cell.

The second advantage of the two-transistor EEPROM memory array design is the number of Program and Erase (P/E) endurance cycles that the two-transistor EEPROM memory array is able to endure. Currently the two-transistor EEPROM memory array can endure at least 1 million program and erase cycle in units of byte or page. Therefore, the two-transistor EEPROM memory array is the best nonvolatile storage memory for those extremely high-frequency changing rate of byte-alterable or page-alterable data applications.

The third advantage of the EEPROM memory array is the fast random read operation. The read operation of the EEPROM memory array is as fast as the read operation of NOR Flash memory array. The EEPROM memory array read operation can be performed in a random mode similar to that of the NOR memory array and an SRAM memory array with a fast read speed of 100 ns or below in units of bytes or words in the widest operating ranges of the power supply voltage source (i.e. 1.8V to 5.5V). Currently, the EEPROM memory array technology has migrated to a manufacturing process having a feature size of 0.15 nm in mass production and has achieved the highest density up to 2 Mb in a single chip.

The cell threshold voltages of the three nonvolatile memories are optimally defined differently for different cell array architectures, different program and erase physics schemes, and different applications in market. For example, the preferred threshold voltage of NAND Flash memory cell operation decreases after erase and is commonly set to a voltage level of approximately −2.0V and the program threshold voltage is increased to a positive threshold voltage level of approximately +2.0V. The NAND Flash memory cell has a negative threshold voltage because the array is constructed of multiple NAND cell strings with each string having one additional bit line select transistor connected to an associated bit line at the top of the NAND cell string. A source select transistor is located at the bottom of the NAND cell string and is connected to an associated source line. The bit line and source line transistors have a positive threshold value of approximately 0.7V. There is no leakage current due to the negative-threshold voltage of the NAND cells can occur in the unselected NAND strings when a voltage level of approximately 0.0V is coupled to one of gates of the bit line and source line transistors.

Like the NAND Flash memory array, a FLOTOX-based EEPROM memory cell is virtually a two-transistor cell structure with one bit line select transistor on top with a threshold voltage set to a positive voltage level of approximately 0.7V in series with one bottom charge retention transistor with two threshold voltage levels representing the logic level of the data states. The threshold voltage level for an erase operation is approximately +2.0V and the threshold voltage level for a program operation is approximately −2.0V. There is no concern for bit line leakage because of the negative threshold voltage level of the charge retaining transistors of each two-transistor EEPROM memory cell because of the bit line select transistor preventing the leakage.

Unlike the NAND Flash memory cell or the EEPROM memory cell, the NOR Flash memory cell is virtually a one-transistor memory cell structure without a bit line or source line select transistor. As a result, the two threshold voltage levels of the NOR Flash memory cell are tuned positive to prevent the false reading due to the negative voltage level threshold voltage induced leakage in the bit lines of the array. The erase threshold voltage level is a lower positive threshold voltage level and is usually defined to be somewhat greater than +2.0V, for avoiding over-erase issue. The program threshold voltage level is high positive threshold voltage level and is defined to be greater than 3.5V.

Typically, the three types of nonvolatile memory structures are targeted three different storage markets and technologies are not compatible. The NAND Flash memory has been extensively used as a slow-serial-read, extreme-high-density, block-alterable memory array for huge data storage. Conversely, the NOR Flash memory is used as a fast-random-read medium-high-density, sector-alterable memory array for program code storage. Unlike the NAND and NOR Flash memories, the EEPROM memory is broadly used as a fast-random-read, byte-alterable memory array for small data storage.

In the past years, the market for nonvolatile memory has strongly demanded a low-cost hybrid storage solution that allows code and data to be integrated on a same die. In the prior art, there have been claims for ultimate universal combinations of nonvolatile memory design. Most of the designs were based on Flash NAND and NOR technology that has a wide variety in cell structures, program and erase schemes, and manufacturing processes. None of the prior is based on the mainstream two-transistor FLOTOX EEPROM memory technology. As a result, the Flash based combination structures are unable to meet EEPROM memory array reliability requirements of 1 million program/erase cycles in units of byte for 10-year product cycle. The Flash-based combination nonvolatile memory chips are able to meet the reliability criteria of the EEPROM memory now and for-seeable future. In other words, those Flash-based combination memories of the prior art are more focused for a Block-alterable, code-oriented design, rather than a byte-alterable data-oriented solution. There is a need in the market for a byte-alterable and data oriented combination of NAND, NOR, and EEPROM integrated on to one semiconductor substrate die.

SUMMARY OF THE INVENTION

An object of this invention is to provide one-transistor FLOTOX-based NOR nonvolatile memory cell.

Another object of this invention is to provide an array of one-transistor FLOTOX-based NOR nonvolatile memory cells.

Further, another object of this invention is to provide a method of operation of a one-transistor FLOTOX NOR nonvolatile memory array.

Still further, an object of this invention is to provide two-transistor/two-bit NAND-like FLOTOX-based NOR nonvolatile memory cell.

Still further, another object of this invention is to provide an array of two-transistor/two-bit NAND-like FLOTOX-based NOR nonvolatile memory cells.

Even further, another object of this invention is to provide a method of operation of a two-transistor/two-bit NAND-like FLOTOX nonvolatile memory array.

Still even further, another object of this invention is to provide charge pumps and level shifting circuits for generating negative voltage levels for programming the FLOTOX nonvolatile memory cells.

Further yet, another object of this invention is to provide a combination FLOTOX memory device having a combination of one-transistor FLOTOX-based NOR nonvolatile memory arrays, multiple transistor FLOTOX-based NAND nonvolatile memory arrays, two-transistor NAND-like FLOTOX-based NOR nonvolatile memory arrays, and two-transistor FLOTOX EEPROM nonvolatile memory arrays.

Still further yet, another object of this invention is to provide a method for forming one-transistor FLOTOX-based NOR nonvolatile memory integrated circuits, multiple transistor FLOTOX-based NAND nonvolatile memory integrated circuits, two-transistor NAND-like FLOTOX-based NOR nonvolatile memory integrated circuits, and two-transistor FLOTOX EEPROM nonvolatile memory integrated circuits for maintaining a constant coupling ratio as the dimensions of the one-transistor FLOTOX-based NOR nonvolatile memory cell is decreased and the high program voltage and erase voltages across the channel are reduced.

To accomplish at least one of these objects, one-transistor FLOTOX-based NOR nonvolatile memory cell has a floating gate transistor formed of a floating gate tunneling oxide transistor having a drain connected to a bit line and a source connected to a source line. A floating gate is formed of a first polycrystalline silicon layer over a gate insulation layer. In some embodiments, the gate insulation layer has an overlap region that is thinned to form a tunneling oxide window that allows charges to tunnel between the drain region and the floating gate during programming and erasing the one-transistor FLOTOX-based NOR nonvolatile memory cell. The overlap region extends over the drain region such that a coupling ratio of the control gate to the floating gate of the charge retaining FLOTOX transistor is from approximately 60% to approximately 70%. The coupling ratio of the floating gate to the drain region of the FLOTOX transistor is maintained as a constant of from approximately 10% to approximately 20%. In other embodiments, the gate insulation layer is thinned from a approximately a midpoint of a drain region to approximately a midpoint of a source region and from a first overlapping area of a first shallow trench isolation to a second overlapping area of a second shallow trench isolation where the one-transistor FLOTOX-based NOR nonvolatile memory cell is formed between the first and second shallow trench isolations. The floating gate is extended as a first overlapping wing of the first shallow trench isolation and a second overlapping wing of the second shallow trench isolation.

A control gate is formed of a second polycrystalline silicon layer on an interlayer dielectric placed over the first polycrystalline silicon layer and is connected to a word line. In some embodiments the first and second polycrystalline silicon layers are placed on a surface of a substrate prior to the formation of the drain and source. The first and second polycrystalline silicon layers, the gate oxide, and the interlayer dielectric are etched to open the surface of substrate. An impurity of a first conductivity type (N-type in a P-type substrate) is diffused into the opening of the first and second polycrystalline silicon layers are placed on a surface of a substrate to form a self aligned floating gate tunneling oxide transistor. In other embodiments, the impurity of the first conductivity type is diffused into the surface of the substrate to form the drains and source of the floating gate tunneling oxide transistor prior to forming the first and second polycrystalline layers to form the floating gate and the control gate. This provides a non-self aligned floating gate tunneling oxide transistor.

At least one more object is accomplished by a NAND-like two-transistor FLOTOX-based NOR nonvolatile memory cell formed of a pair of charge retaining FLOTOX transistors connected in a series string such that one of the of charge retaining FLOTOX transistors functions as a select gate transistor to prevent leakage current through the charge retaining FLOTOX transistors when the pair of charge retaining FLOTOX transistors is not selected for reading a logic state of the programmable integrated logic device. A drain of a topmost charge retaining FLOTOX transistor of the NAND-like two-transistor FLOTOX-based NOR nonvolatile memory cell is connected to a bit line associated with and parallel to a column on which each NAND-like two-transistor FLOTOX-based NOR nonvolatile memory cell resides. A drain of a bottommost of the charge retaining FLOTOX transistors of each of the NAND-like two-transistor FLOTOX-based NOR nonvolatile memory cell is connected to a source line associated with the associated NAND-like two-transistor FLOTOX-based NOR nonvolatile memory cell and parallel with the associated bit line. The control gate of the charge retaining FLOTOX transistors is connected to a word line. The sources of the pair of charge retaining FLOTOX transistors are commonly merged in a single source region.

In each of the charge retaining FLOTOX transistors, a floating gate is formed of a first polycrystalline silicon layer over a gate insulation layer. The gate insulation layer has an overlap region that is thinned to form a tunneling oxide window that allows charges to tunnel between the drain region and the floating gate during programming and erasing the NAND-like two-transistor FLOTOX-based NOR nonvolatile memory cell. The overlap region extends over the drain region such that a coupling ratio of the control gate to the floating gate of the charge retaining FLOTOX transistor is from approximately 60% to approximately 70%. The coupling ratio of the floating gate to the drain region of the FLOTOX transistor is maintained as a constant of from 10% to approximately 20%. In other embodiments, the gate insulation layer is thinned from a approximately a midpoint of the drain region the topmost charge retaining FLOTOX transistors of each of the NAND-like two-transistor FLOTOX-based NOR nonvolatile memory cell to approximately a midpoint of the drain region of the bottommost charge retaining FLOTOX transistors of each of the NAND-like two-transistor FLOTOX-based NOR nonvolatile memory cell and from a first overlapping area of a first shallow trench isolation to a second overlapping area of a second shallow trench isolation where the one-transistor FLOTOX-based NOR nonvolatile memory cell is formed between the first and second shallow trench isolations. The floating gate is extended as a first overlapping extension wing over the first shallow trench isolation and a second overlapping extensions wing over the second shallow trench isolation.

A control gate is formed of a second polycrystalline silicon layer on an interlayer dielectric placed over the first poly crystalline silicon layer and is connected to a word line. In some embodiments the first and second polycrystalline silicon layers are placed on a surface of a substrate prior to the formation of the drains and sources. The first and second polycrystalline silicon layers, the gate oxide, and the interlayer dielectric are etched to open the surface of substrate. An impurity of a first conductivity type (N-type in a P-type substrate) is diffused into the opening of the first and second polycrystalline silicon layers are placed on a surface of a substrate to form a self aligned charge retaining FLOTOX transistors. In other embodiments, the impurity of the first conductivity type is diffused into the surface of the substrate to form the drains and sources of the charge retaining FLOTOX transistors prior to forming the first and second polycrystalline layers to form the floating gates and the control gates. This provides a non-self aligned charge retaining FLOTOX transistors.

At least one more object of this invention is accomplished with a method of operating an array of FLOTOX-based NOR nonvolatile memory cells that are arranged in rows and columns. In an erase procedure, a word line connected to the control gates of a selected row of FLOTOX-based NOR nonvolatile memory cells is set to a very large positive erase voltage level of from approximately 14.0V to approximately 16.0V. All bit lines connected to the drains of the columns of the selected FLOTOX-based NOR nonvolatile memory cells and source lines connected to the sources of the selected FLOTOX-based NOR nonvolatile memory cells are connected to the ground reference voltage level (0.0V). The erase operation sets the threshold voltage of the selected FLOTOX-based NOR nonvolatile memory cells to a positive erase voltage level of greater than 3.0V In an erase inhibit operation, the word lines connected to the control gates of unselected rows of the FLOTOX-based NOR nonvolatile memory cells is connected to the ground reference voltage level (0.0V). In a program operation, a word line connected to the control gates of a selected row of FLOTOX-based NOR nonvolatile memory cells is set to the ground reference voltage level. All bit lines connected to the drains of the columns of the selected FLOTOX-based NOR nonvolatile memory cells are connected to a large programming voltage of from approximately 14.0V to approximately 16.0V. The source lines connected to the sources of the selected and unselected FLOTOX-based NOR nonvolatile memory cells are disconnected to float the sources of the FLOTOX-based NOR nonvolatile memory cells. The program operation sets the threshold voltage of the selected FLOTOX-based NOR nonvolatile memory cells to a positive program threshold voltage level of from approximately 0.5V to approximately 1.0V. In a program inhibit operation, the bit lines connected to the unselected FLOTOX-based NOR nonvolatile memory cells are connected to a moderate program inhibiting voltage level of approximately of from 3.0V to approximately 5V. The word lines connected to the unselected FLOTOX-based NOR nonvolatile memory cells are connected to a moderate program inhibiting voltage level of from approximately 8V to approximately 10V.

In some embodiments of a method of operation, the program procedure has a word line connected to the control gates of a selected row of FLOTOX-based NOR nonvolatile memory cells set to a negative programming voltage level of from approximately −3.0V to approximately −5.0V. All bit lines connected to the drains of the columns of the selected FLOTOX-based NOR nonvolatile memory cells are connected to a moderate programming voltage of from approximately 8V to approximately 10V. The source lines connected to the sources of the selected and unselected FLOTOX-based NOR nonvolatile memory cells are disconnected to float the sources of the FLOTOX-based NOR nonvolatile memory cells. In a program inhibit operation, the bit lines connected to the unselected FLOTOX-based NOR nonvolatile memory cells are connected to a lower program inhibiting voltage level of approximately 0.0V. The word lines connected to the unselected FLOTOX-based NOR nonvolatile memory cells are connected to a moderate program inhibiting voltage level of from approximately 3.0V to approximately 5V.

In various embodiments of the method of operation, a read procedure has the word line connected to the control gates of the selected FLOTOX-based NOR nonvolatile memory cells set to the read voltage level that is from approximately 1.8V to approximately 3.0V. The word lines connected to the control gates of the unselected FLOTOX-based NOR nonvolatile memory cells is set to the ground reference voltage level (0.0V). The bit line connected to the drains of the selected FLOTOX-based NOR nonvolatile memory cells are set to a read sense voltage level that is less than 1.0V. The bit lines connected to the drains of the unselected FLOTOX-based NOR nonvolatile memory cells are disconnected and allowed to float. The source lines connected to the sources of the selected and unselected FLOTOX-based NOR nonvolatile memory cell are set to the ground reference voltage level (0.0V).

In embodiments of the FLOTOX-based NOR nonvolatile memory devices executing the method having a negative programming voltage applied to the selected word lines, a negative charge pump circuit generates the negative programming voltage level of from approximately −3.0V to approximately −5.0V. The negative charge pump circuit has multiple PMOS diode connected transistors connected to multiple capacitors connected for pumping a positive power supply voltage source of from approximately 1.2V to approximately 3.3V to the negative programming voltage level.

At least one more object of this invention is accomplished by a method for verifying programming of selected FLOTOX-based NOR nonvolatile memory cells. The program operation is applied iterative with a verify operation executed between each iteration of the program operation until the selected FLOTOX-based NOR nonvolatile memory cell have a threshold voltage level of the positive program voltage level. The verify operation has the word line connected to the control gates of the selected FLOTOX-based NOR nonvolatile memory cells set to a first verify voltage level that is approximately 0.5V followed by a second verify operation where a second verify voltage level is approximately 1.0V. The word lines connected to the control gates of the unselected FLOTOX-based NOR nonvolatile memory cells is set to the ground reference voltage level (0.0V). The bit line connected to the drains of the selected FLOTOX-based NOR nonvolatile memory cells are set to a voltage level that is less than 1.0V. The bit lines connected to the drains of the unselected FLOTOX-based NOR nonvolatile memory cells are disconnected and allowed to float. The source lines connected to the sources of the selected and unselected FLOTOX-based NOR nonvolatile memory cell are set to the ground reference voltage level (0.0V). The verify operation insures that the programmed threshold voltage level is never negative to prevent an over program negative voltage level that will lead to read errors in the FLOTOX-based NOR nonvolatile memory cell array.

At least one more object of this invention is accomplished with a row voltage decoder comprising a level-shifter with local pump for driving each row of an array of FLOTOX-based nonvolatile memory cells. The level shifter switches a very large positive erasing voltage level, a very large positive programming voltage level and a negative programming voltage level for erasing and programming selected FLOTOX-based nonvolatile memory cells. The level shifter has two sections—a positive level shifter and a negative level shifter. The positive level shifter switches the very large positive erasing voltage level and the very large positive programming voltage level and the negative level shifter switches the negative programming voltage level. The positive level shifter is formed of a first and second PMOS transistors, a first and second NMOS transistors and an inverter configured for switching the very large positive erasing voltage level and the very large positive programming voltage level. The first and second PMOS transistors, a first and a second capacitor, a first and a second NAND gate are configured to form the negative level shifter. A third and a fourth PMOS transistor are configured to isolate the first and second NMOS transistors from the negative programming voltage level to prevent a forward current resulting from the negative programming voltage being applied to the source/drain of the first and second NMOS transistors causing a forward current flowing from the P-substrate connected to the ground reference voltage level to the N-type source/drain diffusions of the first and second NMOS transistors.

At least one more object of this invention is accomplished with a nonvolatile memory device including at least one two transistor FLOTOX EEPROM cell array in combination with at least one FLOTOX-based NOR nonvolatile memory cell array, at least one FLOTOX-based NAND nonvolatile memory cell array, and at lease one NAND-like two-transistor FLOTOX-based NOR nonvolatile memory cell array.

At least one more object of this invention is accomplished with a method for forming charge retaining FLOTOX-based NOR nonvolatile memory cells that begins with providing a substrate of a first conductivity type. Shallow trench isolation regions are formed in the surface of the substrate to define an area into which the charge retaining FLOTOX-based NOR nonvolatile memory cells are to be formed. A gate insulation layer is placed on the surface of the substrate and is then thinned from a first overlapping region of a first shallow trench isolation region to a second overlapping region of a second shallow trench isolation region to form a tunneling insulation layer. A first polycrystalline silicon conductor is placed on the surface of the gate insulation layer and the tunneling insulation layer. The first polycrystalline silicon conductor is removed to form a floating gate for the charge retaining FLOTOX-based NOR nonvolatile memory transistors of the charge retaining FLOTOX-based NOR nonvolatile memory cells. The floating gate has a length that defines a channel region in the substrate beneath the floating gate and a width that extends from approximately a midpoint of the first shallow trench isolation to approximately a midpoint of the second shallow trench isolation with the sections of the floating gate overlapping the first and second shallow trench isolations providing a first extension wing and a second extension wing. The first and second extension wings of the floating gate increase a control gate to floating gate capacitance for determining a coupling ratio of the charge retaining FLOTOX-based NOR nonvolatile memory transistors of the charge retaining FLOTOX-based NOR nonvolatile memory cells. An interlayer dielectric layer is deposited on the surface of the exposed gated insulation layer and the floating gates. A second polycrystalline silicon conductor is placed on the surface of the interlayer dielectric layer and selectively removed to form the control gates of the charge retaining FLOTOX-based NOR nonvolatile memory transistors of the charge retaining FLOTOX-based NOR nonvolatile memory cells. The control gates, the interlayer dielectric layer, the floating gates, and the tunneling oxide layer are etched to create a self aligning stack defining the length of the channel region of the charge retaining FLOTOX-based NOR nonvolatile memory transistors of the charge retaining FLOTOX-based NOR nonvolatile memory cells. An impurity species of a second conductivity type is implanted in the surface of the substrate to form the sources and drains of the charge retaining FLOTOX-based NOR nonvolatile memory transistors of the charge retaining FLOTOX-based NOR nonvolatile memory cells. The dimensions of the length of the channel region and the width of the channel region determine the floating gate to channel capacitance. To maintain a constant coupling ratio for the control gate to the floating gate of the charge retaining FLOTOX transistors the length of the first and second extension wings of the floating gates of the charge retaining FLOTOX-based NOR nonvolatile memory transistors of the charge retaining FLOTOX-based NOR nonvolatile memory cells is modified appropriately. To maintain a constant coupling for the floating gate to the drain regions of the FLOTOX transistor the width of the channel and an amount that the floating gate overlaps the drain regions is appropriately modified. The coupling ratio of the control gate to the floating gate of the charge retaining FLOTOX transistor is from approximately 60% to approximately 70%. The coupling ratio of the floating gate to the drain region of the FLOTOX transistor is maintained as a constant of from 10% to approximately 20%.

BRIEF DESCRIPTION OF THE DRAWINGS

FIG. 1a is a schematic diagram of a two transistor FLOTOX EEPROM nonvolatile memory cell of the prior art.

FIG. 1b is a diagram of a top view of the two transistor FLOTOX EEPROM nonvolatile memory cell of the prior art.

FIG. 1c is a diagram of a cross sectional view of the two transistor FLOTOX EEPROM nonvolatile memory cell of the prior art.

FIG. 2 is block diagram of a FLOTOX EEPROM memory device that is formed of byte-alterable units of two transistor FLOTOX EEPROM nonvolatile memory cells of the prior art.

FIG. 3a is a schematic diagram of a one-transistor FLOTOX-based NOR nonvolatile memory cell of the prior art.

FIG. 3b is a diagram of a top view of the one-transistor FLOTOX-based NOR nonvolatile memory cell of the prior art.

FIG. 3c is a diagram of a cross sectional view of the one-transistor FLOTOX-based NOR nonvolatile memory cell of the prior art.

FIG. 8b is a plot of the threshold voltage levels of the one-transistor FLOTOX-based NOR nonvolatile memory cell embodying the concepts of the present invention.

FIGS. 8c and 8d are tables of the embodiments of voltage conditions applied to an array of one-transistor FLOTOX-based NOR nonvolatile memory cells in a method of operation embodying the concepts of the present invention.

FIGS. 9b and 9c are tables of the embodiments of voltage conditions applied to an array of two-transistor NAND-like FLOTOX-based NOR nonvolatile memory cells in a method of operation embodying the concepts of the present invention.

FIGS. 10b and 10c are tables of the embodiments of voltage conditions applied to an array of two transistor FLOTOX EEPROM nonvolatile memory cells in a method of operation embodying the concepts of the present invention.

FIGS. 16a, 16b-1, 16b-2, 16c-1, 16c-2, 16c-3, 16d-1, 16d-2, 16e-1, 16e-2, 16f-1, 16f-2, 16g-1, 16g-2, 16h-1, 16h-2, and 16i are cross sectional drawings of a process for forming a one-transistor FLOTOX-based NOR nonvolatile memory cell embodying the concepts of the present invention.

DETAILED DESCRIPTION OF THE INVENTION

Figure 4A:
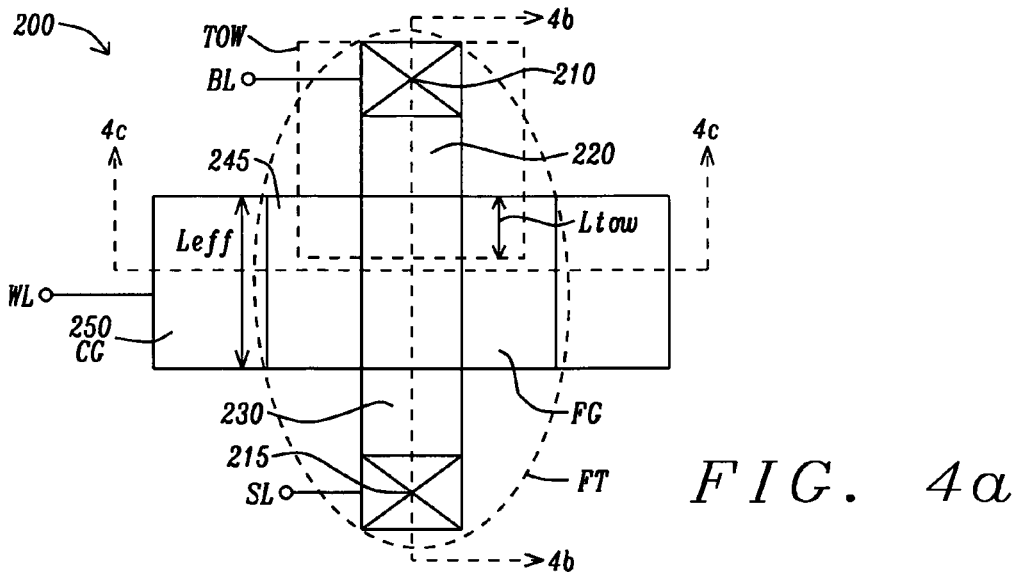
FIG. 4a is a diagram of a top view of a self-aligned one-transistor FLOTOX-based NOR nonvolatile memory cell embodying the concepts of the present invention.

The application trends nonvolatile memory devices demands a low-cost hybrid storage solution that allows sector-alterable NOR Flash memory arrays generally used for program code data structures, huge block-alterable NAND Flash memory arrays generally used for larger data structures, and byte-alterable EEPROM memory arrays used for smaller data structures to be placed on the same integrated circuit substrate. The hybrid solutions described in the prior art are virtually based on Flash memory technology structures. The Flash memory structure is basically a floating-gate transistor cell structure that implements the byte alterable nonvolatile memory arrays the sector alterable nonvolatile memory arrays, and the block alterable memory arrays with Flash memory cells. The Flash memory array cells employ the program and erase methods of operation for the three array structures. Using the NAND or NOR based Flash cells of the prior art do not achieve the one million program/erase cycles required of the EEPROM memory cell structures at the units of a byte or page.

The NOR and NAND FLOTOX nonvolatile memory cells that embody the principles of the current invention employ floating gate-tunneling oxide transistors to form the NOR and NAND FLOTOX nonvolatile memory cells on one integrated circuit substrate. This EEPROM-based combination nonvolatile memory device keeps all the features of an EEPROM memory array unchanged. These features include endurance of one-million program/erase cycles in the array units of a byte and a page, fast write speed, and a relatively simple manufacturing process not requiring any high voltage NMOS devices that are formed in a triple P-well in a deep N-well on top of a P-substrate. The EEPROM-based combination nonvolatile memory device permits the integration of the two-transistor EEPROM cell, a multiple transistor NAND string, a single transistor NOR cell, and a two-transistor NAND-like NOR cells one the same substrate.

FIG. 1a is a schematic diagram of a two transistor FLOTOX EEPROM nonvolatile memory cell of the prior art. FIG. 1b is a diagram of a top view of the two transistor FLOTOX EEPROM nonvolatile memory cell of the prior art. FIG. 1c is a diagram of a cross sectional view of the two transistor FLOTOX EEPROM nonvolatile memory cell of the prior art. The EEPROM cell of the prior art includes of two transistors ST and FT. The select transistor, ST is a polycrystalline silicon (polysilicon) NMOS device with its gate SG connected to a word line WL. The source of the select transistor ST is connected to the drain of the floating gate tunnel oxide (FLOTOX) EEPROM transistor FT. The FLOTOX transistor FT is a double polycrystalline silicon floating gate device. A first layer of polycrystalline silicon is the floating-gate FG that is used to store the charges representing the binary "0" and binary "1" of the stored data. The second layer of the polycrystalline silicon is a control gate CG that is connected to the control gate biasing voltage line CGB. The drain of the select transistor ST is connected to a vertical metal bit line BL. The source of the EEPROM transistor FT is connected to a common horizontal implanted source line SL.

FIGS. 1b and 1c illustrate the physical layout for the two-transistor two transistor FLOTOX EEPROM nonvolatile memory cell of FIG. 1a of the traditional two-transistor two transistor FLOTOX EEPROM nonvolatile memory cell as formed in a substrate P-sub. A first layer polycrystalline silicon conductor 15 forms the control gate of the select transistor ST and runs horizontally to form the control gate of the select transistors ST of adjacent two-transistor FLOTOX EEPROM nonvolatile memory cells to form the word line WL. The overlapping area of the first layer polycrystalline silicon conductor 15 and N+ active layers 5 (drain) and 20 (source) form the polycrystalline silicon NMOS select transistor ST. The drain region 5 of the select transistor ST has a contact 10 for the connection with the global metal bit line BL. The FLOTOX transistor FT is a double-poly floating gate device and is formed above the N+ layer 20 and 35 and the buried implant layers BN+ 25 and 30. The first layer polycrystalline silicon conductor 45 forms the floating gate FG and is placed below the second layer polycrystalline silicon conductor 50 that forms the control gate CG. A square box of a tunnel oxide window opening layer TOW is a region 41 of the gate oxide 40 that is thinned to about 100 Å thickness to allow Fowler-Nordheim programming and erasing during the normal write operation of the FLOTOX transistor FT. The source of the FLOTOX EEPROM nonvolatile memory cell FT is formed of the buried implant layer BN+ 30 and the N+ implant 35. The N+ implant 35 is a horizontal implant that forms the common source line SL for each of the FLOTOX EEPROM transistors FT of a row of two transistor FLOTOX EEPROM nonvolatile memory cells.

The control gate CG is connected to a control gate biasing voltage line CGB that provides the necessary voltages to the control gate CG for programming, erasing, and reading the data from the two transistor FLOTOX EEPROM nonvolatile memory cell.

This two transistor FLOTOX EEPROM nonvolatile memory cell typically has a cell size of 100 times the minimum feature size ($\lambda^2$) of the processing technology and is the largest nonvolatile memory cell size as described above. During operation, a program and erase operation needs a maximum program voltage level and a maximum erase voltage level of approximately +16V.

The coupling ratio from the second level of the polycrystalline silicon 50 of the control gate 50 to the first polycrystalline silicon 45 of the floating gate FG is from approximately 60% to approximately 70%. The coupling ratio from drain 20 to the floating gate FG is from approximately 10% to approximately 20%.

The buried implant layer BN+ 25 surrounds the tunneling oxide window opening TOW at the drain 20 side of the FLOTOX transistor FT with enough margin for the FLOTOX transistor FT transistor to achieve 1M program/erase endurance cycles and to prevent the channel 55 of the FLOTOX transistor's FT in the region beneath the tunneling oxide window opening TOW from disconnecting from the bit line BL. A buried implant layer BN+ 30 is formed at the source side of FLOTOX transistor FT to ensure that the source line SL is not disconnected from the source node of FLOTOX transistor FT at the channel region 55 beneath the floating gate FG. The distance between the two buried implant layers BN+ 25 and 30 effectively defines the channel length, Leff of the FLOTOX transistor's FT. Typically, the channel length Leff of the FLOTOX transistor FT is designed to be identical or slightly smaller than the channel length of select transistor ST. Both select transistor ST and the FLOTOX transistor FT are formed on top of P-type substrate P-Sub. The P-type substrate P-sub is connected to the ground reference voltage level.

Figure 16A:
Figures 1, 16B:
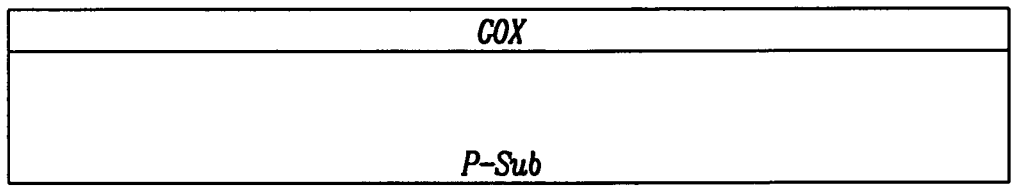
Figures 2, 16B:
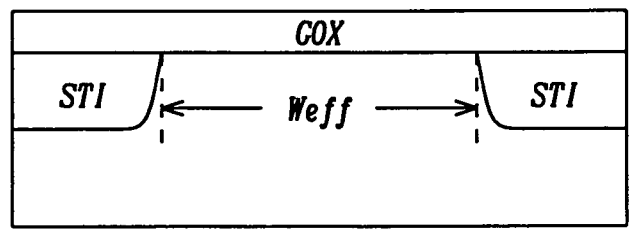

FIG. 2 is block diagram of a FLOTOX EEPROM memory device 100 that is formed of byte-alterable units 110aa, 110ab, . . . , 110mn of two transistor FLOTOX EEPROM nonvolatile memory cells. The byte-alterable units 110aa, 110ab, . . . , 110mn are arranged such that each of the two-transistor FLOTOX EEPROM cells is ordered in rows and columns. Each of the byte-alterable units 110aa, 110ab, . . . , 110mn have a bit line gating transistor Na0, Na1 (not shown), . . . , Nan (not shown), . . . , Nb0, Nb1 (not shown), . . . , Nbn (not shown), . . . , Nm0, Nm1, . . . , Nmn (not shown) associated with each of the byte-alterable units 110aa, 110ab (not shown), . . . , 110mn (not shown), Each row of the two-transistor FLOTOX EEPROM cells of the byte-alterable units 110aa, 110ab, . . . , 110mn are connected to a word line WL0, WL1, . . . , WLm with the word lines WL0, WL1, . . . , WLm connected to the bit line gating transistor Na0, Na1, . . . , Nan, . . . , Nb0, Nb1, . . . , Nbn, . . . , Nm0, Nm1, . . . , Nmn and the gates of the select transistors ST of the rows of the two-transistor FLOTOX EEPROM cells of the byte-alterable units 110aa, 110ab, . . . , 110mn. The drain of each of the bit line gating transistors Na0, Na1, . . . , Nan, . . . , Nb0, Nb1, . . . , Nbn, . . . , Nm0, Nm1, . . . , Nmn on each column of the byte-alterable units 110aa, 110ab, . . . , 110mn is connected to an associated one of the gated bit lines GBL0, GBL1, . . . , GBLn. The source of the bit line gating transistors Na0, Na1, . . . , Nan, . . . , Nb0, Nb1, . . . , Nbn, . . . , Nm0, Nm1, . . . , Nmn are connected respectively to the control gate bias lines CGBa0, CGBa1 (not shown), . . . , CGBan (not shown), . . . , CGBb0, CGBb1 (not shown), . . . , CGBbn (not shown), . . . , CGBm0, CGBm1 (not shown), . . . , CGBmn (not shown). The control gate bias lines CGBa0, CGBa1, . . . , CGBan, . . . , CGBb0, CGBb1, . . . , CGBbn, . . . , CGBm0, CGBm1, . . . , CGBmn are connected to the control gates of the floating gate transistors of the byte-alterable units of the byte-alterable units 110aa, 110ab, . . . , 110mn on the associated row.

The bit lines BL00, BL01, . . . , BL07, BL10, . . . , BL17, . . . , BLn0, . . . , BLn7 are connected to the drains of the select transistors ST of the two-transistor FLOTOX EEPROM cells on the associated column. The sources of the floating gate transistors FT of the two-transistor FLOTOX EEPROM cells are connected to a common source line that is commonly connected to the ground reference voltage level. Each of the bit lines BL00, BL01, . . . , BL07, BL10, . . . , BL17, . . . , BLn0, . . . , BLn7 are formed as metal lines in parallel with the columns of the two-transistor FLOTOX EEPROM cells. The source line SL is formed of the N+ diffusion 35 of FIGS. 1b and 1c.

The bit lines BL0, BL1, . . . , BL7 and the source line SL are connected to the column voltage control circuit 175 to receive the necessary voltage levels for reading, erasing, and programming the selected two-transistor FLOTOX EEPROM cells within chosen byte-alterable units 110aa, 110ab, . . . , 110mn. The word lines WL0, WL1, . . . , WLm are connected to a row voltage control circuit 115 and the row voltage control circuit 115 similarly provides the necessary voltage levels for the reading, erasing, and programming of the selected two-transistor FLOTOX EEPROM cells of the chosen byte-alterable units 110aa, 110ab, . . . , 110mn. A state machine 120 receives the external command signals 125 (program PGM, erase ERS, Read RD, and operation size OP SIZE). The program signal PGM commands the state machine 120 to generate the necessary timing, command, and control signals 155 for programming selected byte-alterable units 110aa, 110ab, . . . , 110mn. The erase signal ERS commands the state machine 120 to generate the necessary timing, command, and control signals 155 for erasing selected byte-alterable units 110aa, 110ab, . . . , 110mn. The read signal RD commands the state machine 120 to generate the necessary timing, command, and control signals 155 for reading selected byte-alterable units 110aa, 110ab, . . . , 110mn. The operation size signal OP SIZE determines the number of byte-alterable units 110aa, 110ab, . . . , 110mn to be programmed, erased, or read. The timing, command, and control signals 155 for the programming, erasing, or reading the selected byte-alterable units 110aa, 110ab, . . . , 110mn are transferred to the row voltage control circuit 115 and the column voltage control circuit 175.

The charge pump 130 receives the timing, command, and control signals 155 and based on the timing, command, and control signals 155 generates the very large programming voltage, the very large erasing voltage, and any other voltage levels required that will be larger than the voltage level of the power supply voltage source. The programming, erasing, and reading voltage levels 160 are transferred to the row voltage control circuit 115 and the column voltage control circuit 175 for transfer to the byte-alterable units 110aa, 110ab, . . . , 110mn. The address 140 is the group of input signals to the address decoder 135. The address decoder 135 decodes the address 140 to provide the necessary selection signals 165 for steering the timing, command, and control signals 155 and programming, erasing, and reading voltage levels 160 to the byte-alterable units 110aa, 110ab, . . . , 110mn.

The data 150 to be written to the array 105 is received by the data driver 145. The data driver 145 conditions the received data 150 and transfers the internal data 170 to the row voltage controller 115 and column voltage control circuit 175. The data state of each bit of the selected byte-alterable units 110aa, 110ab, . . . , 110mn determines whether bits are to be erased and reprogrammed or just erased.

The output of the column voltage control circuit 175 is applied to the sense amplifier/driver 180. The bit lines BL00, BL01, . . . , BL07, BL10, . . . , BL17, . . . , BLn0, . . . , BLn7 are connected through the column voltage control circuit 175 to the input of the sense amplifier/driver 180 for determining the logic state of selected two transistor FLOTOX EEPROM nonvolatile memory cells and creating the data output signal 185.

FIG. 3a is a schematic diagram of a one-transistor FLOTOX-based NOR nonvolatile memory cell of the prior art. FIG. 3b is a diagram of a top view of the one-transistor FLOTOX-based NOR nonvolatile memory cell of the prior art. FIG. 3c is a diagram of a cross sectional view of the one-transistor FLOTOX-based NOR nonvolatile memory cell of the prior art. In various embodiments, the one-transistor FLOTOX-based NOR nonvolatile memory cell is a double polycrystalline FLOTOX transistor FT and does not have the select transistor ST as shown in FIG. 1a. The basic structure of the one-transistor FLOTOX-based NOR nonvolatile memory cell is identical to that of FIGS. 1b and 1c with no change in layout to the FLOTOX transistor FT. This results in no reduction in the cell size in X-dimension. In the embodiment, as shown, the reduction of the cell size is in Y-dimension with a reduction of approximately 40%.

The buried implant layer BN+ 25 surrounds the tunneling oxide window opening TOW at the drain 20 side of the FLOTOX transistor FT to prevent the FLOTOX EEPROM transistor's FT channel 55 in the region beneath the tunneling oxide window opening TOW from disconnecting from the bit line BL. A buried implant layer BN+ 30 is formed at the source side of FLOTOX transistor FT to ensure that the source line SL is not disconnected from the source node of FLOTOX transistor FT at the channel region 55 beneath the floating gate FG. The distance between the two buried implant layers BN+ 25 and 30 effectively defines the channel length, Leff, of the FLOTOX transistor FT and is determined such that the voltage applied to the bit line BL through the bit line contact 10 to the drain N+ diffusion 20 and the buried implant layer BN+ 25 does not cause punch through of the channel. In the prior art, the voltage applied to the bit line in the FLOTOX transistor FT of the prior art during programming is generally greater than 16V. This forces the effective channel length to be large and not able to be decreased.

Figure 4B:
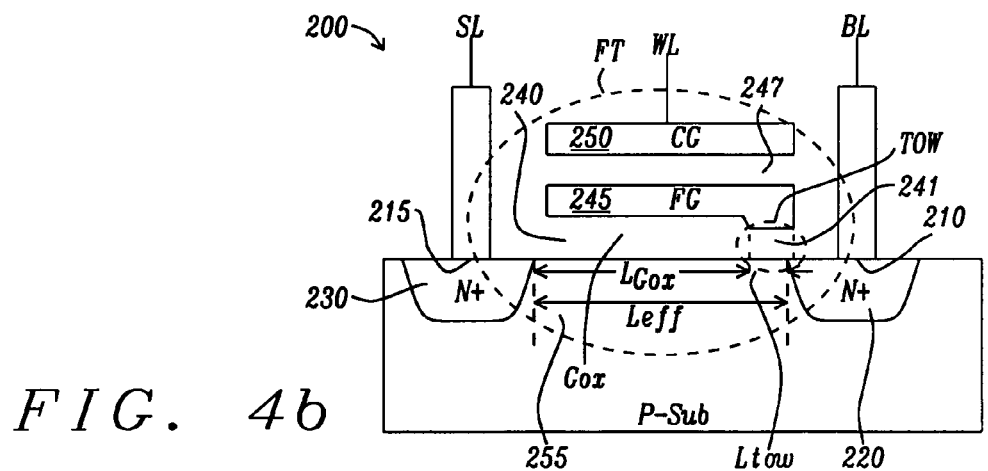
FIG. 4b is a diagram of a longitudinal cross sectional view of the self-aligned one-transistor FLOTOX-based NOR nonvolatile memory cell embodying the concepts of the present invention.
Figure 4C:
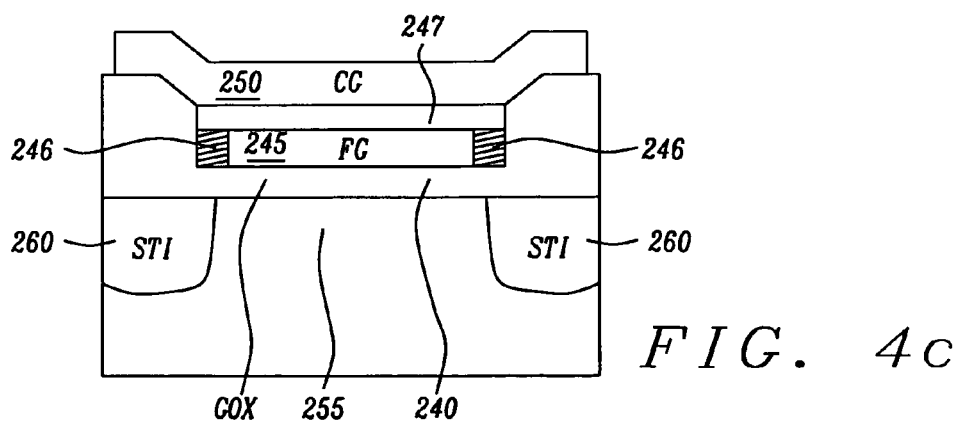
FIG. 4c is a diagram of a lateral cross sectional view of the self-aligned one-transistor FLOTOX-based NOR nonvolatile memory cell embodying the concepts of the present invention.

FIG. 4a is a diagram of a top view of a self-aligned one-transistor FLOTOX-based NOR nonvolatile memory cell 200 embodying the concepts of the present invention. FIG. 4b is a diagram of a longitudinal cross sectional view of the self-aligned one-transistor FLOTOX-based NOR nonvolatile memory cell 200 embodying the concepts of the present invention. FIG. 4c is a diagram of a lateral cross sectional view of the self-aligned one-transistor FLOTOX-based NOR nonvolatile memory cell embodying the concepts of the present invention. In various embodiments, the one-transistor FLOTOX-based NOR nonvolatile memory cell 200 is formed as a self-aligned floating gate transistor. The gate oxide 240 is deposited on the surface of the P-type substrate P-sub. The gate oxide 240 is thinned to about 100 Å thickness to form the tunnel oxide window opening TOW 241 to allow Fowler-Nordheim programming and erasing during the normal write operation of the one-transistor FLOTOX-based NOR nonvolatile memory cell 200. The first level of the polycrystalline silicon 245 is deposited on the surface of the gate oxide 240 and the tunnel oxide window opening TOW to form the floating gate FG. An interlayer insulation layer 247 is formed of deposited silicon oxide-silicon nitride-silicon oxide (ONO). A second polycrystalline silicon layer 250 is laid down on the interlayer insulation layer 247 to form the control gate CG. The control gate is connected to the word line WL in an array of the one-transistor FLOTOX-based NOR nonvolatile memory cells 200. The second polycrystalline silicon layer 250, interlayer insulation layer 247, first level of the polycrystalline silicon 245, and the gate oxide 240 are collectively etched to form opening for receiving the implantation of an N+ impurity species that forms the N+ drain diffusion 220 and the N+ source diffusion 230. The bit line contact 210 is formed to attach the bit line BL to the N+ drain diffusion 220. The source line contact 215 is formed to attach the source line SL to the N+ source diffusion 230

As in the prior art, the coupling ratio from the second level of the polycrystalline silicon 250 of the control gate CG to the first polycrystalline silicon 245 of the floating gate FG is maintained to be from approximately 60% to approximately 70%. The coupling ratio from drain 20 to the floating gate FG is maintained to be from approximately 10% to approximately 20%. In order to keep the identical coupling ratio from the second level polycrystalline silicon layer 250 of the control gate CG to the first level of the polycrystalline silicon 245 of the floating gate FG or from the channel region 255 to first level of the polycrystalline silicon 245 of the floating gate FG, the ratio of the area of the tunneling oxide 241 to the area of the non-tunneling gate oxide 240 is kept the same. The tunneling area is formed by the overlapping area of the second polycrystalline silicon layer 250 and the tunneling oxide 241 of the tunnel oxide window opening TOW at the N+ drain diffusion 220 edge complying with the minimum design rule. The tunneling oxide window opening TOW is formed under the floating gate with a length of the length of the tunneling oxide window opening Ltow and is extended in the design to the bit line contact 210. Since the oxide thickness is formed before placing the floating gate, it is removed before the following process step of implantation to the drain diffusion.

There are two ways to reduce the effective cell size of this one-transistor FLOTOX-based NOR nonvolatile memory cell 200. The first way is to keep the same width of the first level of the polycrystalline silicon 245 wings 246 of the floating gate FG in left and right by reducing the both channel lengths Ltow of tunneling thin-oxide region 241 and the length $L_{Gox}$ of the channel 255 in the area of the thick gate oxide 240 with a constant ratio of approximately 1:4.5. The second way to reduce the effective cell size and maintain the constant coupling ratio is to increase the width of first level of the polycrystalline silicon 245 wings 246 of the floating gate FG with the channel length Leff reduction without keeping the area ratio constant of 1:4.5. The ratio of the channel length Ltow in tunneling thin-oxide region 241 and the length $L_{Gox}$ of the channel 255 in the area of the thick gate oxide 240 between N+ drain diffusion 220 and the N+ source diffusion 235 can be approximately 1:1 for example by increasing the width of wing 246 by 1.5×. As a result, the new cell size reduction in Y-dimension is about 70% as compared to the dimension in the Y-direction of FIG. 1A. The dimensions of the one-transistor FLOTOX-based NOR nonvolatile memory cell 200 in the x-dimension may remain constant or be varied as described above.

The elimination of the buried implant layers BN+ 225 and 235 of FIGS. 1b and 1c to surround the whole tunneling oxide window opening TOW at the N+ drain diffusion 220, now the bit line contact 210 overlaps the tunneling oxide window opening TOW occurs at the edge of the N+ drain diffusion 220, rather than the whole tunneling oxide window opening TOW FIG. 1c. The boundary line between the thin tunnel-oxide channel 241 and channel 255 beneath the region of the thick gate oxide 240 can be an arbitrary ratio and is the design trade-off of cell size and cell write performance.

The program/erase cycle endurance of these embodiments of the one-transistor FLOTOX-based NOR nonvolatile memory cell 200 will be degraded and is not as great as the program/erase cycle endurance performance of two-transistor FLOTOX-based NOR nonvolatile memory cell of FIGS. 1a, 1b, and 1c, but the one-transistor FLOTOX-based NOR nonvolatile memory cell 200 dimension are reduced drastically by a factor of approximately 70%. In nonvolatile EEPROM FLOTOX memory devices, the low-cost one-transistor FLOTOX-based NOR nonvolatile memory cell 200 provides a block-alterable nonvolatile memory array for code storage on same chip as an array of two-transistor FLOTOX-based NOR nonvolatile memory cells that are byte alterable. The one-transistor FLOTOX-based NOR nonvolatile memory cell 200 has a lower program/erase endurance of 200K cycles. This is satisfactory for a block-alterable nonvolatile memory array for code storage that is not modified constantly.

Figure 5A:
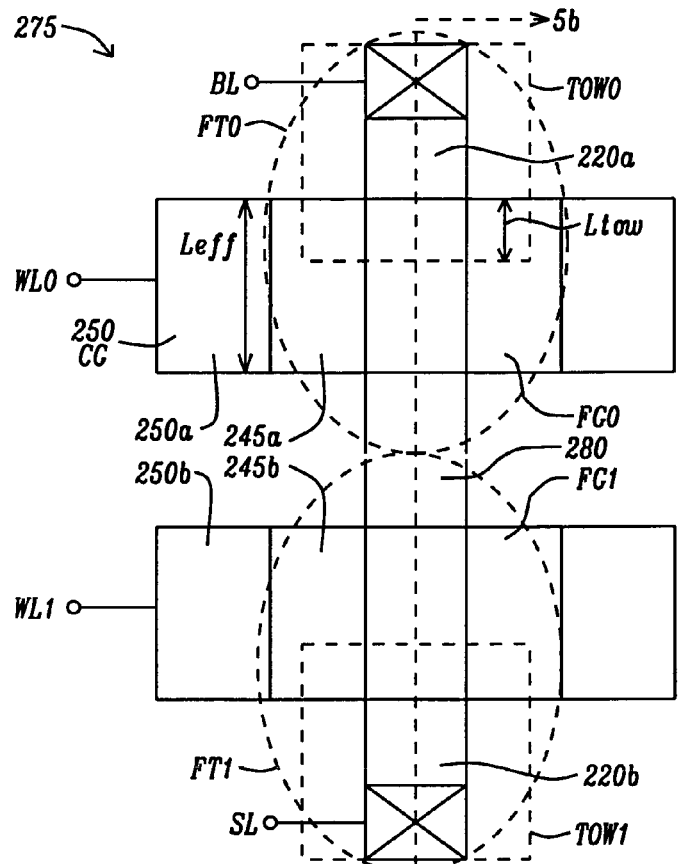
FIG. 5a is a diagram of a top view of a self-aligned two-transistor NAND-like FLOTOX-based NOR nonvolatile memory cell embodying the concepts of the present invention.
Figure 5B:
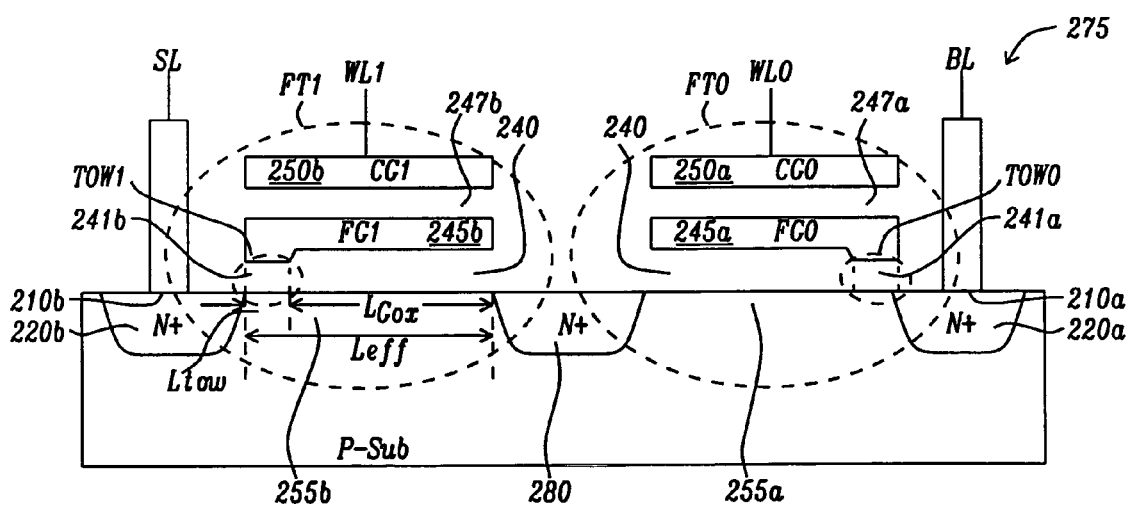
FIG. 5b is a diagram of a cross sectional view of the self-aligned two-transistor NAND-like FLOTOX-based NOR nonvolatile memory cell embodying the concepts of the present invention.

FIG. 5a is a diagram of a top view of a self-aligned two-transistor NAND-like FLOTOX-based NOR nonvolatile memory cell 275 embodying the concepts of the present invention. FIG. 5b is a diagram of a cross sectional view of the self-aligned two-transistor NAND-like FLOTOX-based NOR nonvolatile memory cell 275 embodying the concepts of the present invention. Two of the self-aligned one-transistor FLOTOX-based NOR nonvolatile memory cells 200 of FIGS. 4a and 4b are mirrored and connected in series to form the self-aligned two-transistor NAND-like FLOTOX-based NOR nonvolatile memory cell 275. A first of the self-aligned one-transistor FLOTOX-based NOR nonvolatile memory cell FT0 has its drain connected to the contact metallurgy 210a that is connected to an associated bit line BL. The tunneling oxide window opening TOW0 area is placed adjacent the drain diffusion 220a. The drain diffusion of the second self-aligned one-transistor FLOTOX-based NOR nonvolatile memory cell FT1 is connected to the contact metallurgy 210b that is connected to an associated source line SL. In this embodiment, the tunneling oxide window opening TOW0 is adjacent to the drain diffusion 220a that is connected to the bit line BL. The tunneling oxide window opening TOW1 is adjacent to the drain diffusion 220b that is connected to the source line SL.

Two regions 250a and 250b of the second level polycrystalline silicon layer form the control gates CG0 and CG1 respectively. The control gate CG0 is connected to the word line WL0 and the control gate CG1 is connected to the word line WL1. Two regions 245a and 245b of the first level polycrystalline silicon layer form the floating gates FG0 and FG1 respectively. The floating gates FG0 and FG1 are separated from the P-type substrate by the gate oxide 240. The gate oxide 240 is thinned as described above to form the two tunneling oxide regions TOW0 and TOW1.

The two self-aligned one-transistor FLOTOX-based NOR nonvolatile memory cells FT0 and FT1 have a common source diffusion 280. The common source diffusion 280 has no contact metallurgy for connecting externally and therefore permits the size of the joint cell to be smaller than two separate self-aligned one-transistor FLOTOX-based NOR nonvolatile memory cell 200 of FIGS. 4a and 4b. The self-aligned two-transistor NAND-like FLOTOX-based NOR nonvolatile memory cell 275 requires only one bit line BL and one source line SL for the operation of the two self-aligned one-transistor FLOTOX-based NOR nonvolatile memory cells FT0 and FT1. The lack of contact for the common source diffusion 280 and the single bit line BL and the single source line SL permits a reduction in cell size of approximately 15% over two self-aligned one-transistor FLOTOX-based NOR nonvolatile memory cells 200 of FIGS. 4a and 4b.

The effective length $L_{eff}$ of channels 255a and 255b and the length $L_{TOW}$ of the tunneling oxide windows TOW0 and TOW1 are determined as shown for the self-aligned one-transistor FLOTOX-based NOR nonvolatile memory cell 200 of FIGS. 4a and 4b. The operational voltages are essentially the same for programming and erasing operations. Since one of the two self-aligned one-transistor FLOTOX-based NOR nonvolatile memory cells FT0 and FT1 functions as a select transistor during a read operation, the select voltage differs from the select voltage of a two-transistor FLOTOX-based nonvolatile memory cell 200 of the prior art. In the read operation, the word line WL0 and WL1 for the self-aligned one-transistor FLOTOX-based NOR nonvolatile memory cell FT0 and FT1 functioning as the select transistor is set to a read select voltage level of from approximately 4.0V to approximately 5.0V. As a consequence of the read select voltage level the row read control circuitry is more complicated than that of the prior art.

Figure 6A:
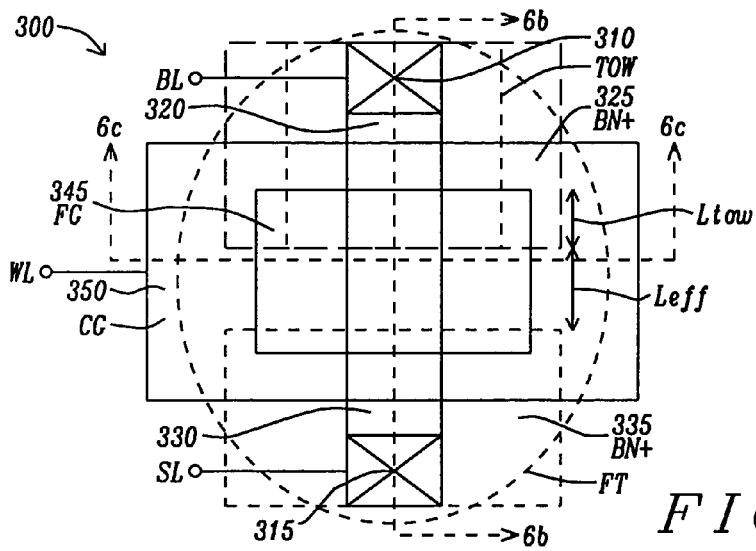
FIG. 6a is a diagram of a top view of a non-self-aligned one-transistor FLOTOX-based NOR nonvolatile memory cell embodying the concepts of the present invention.
Figure 6B:
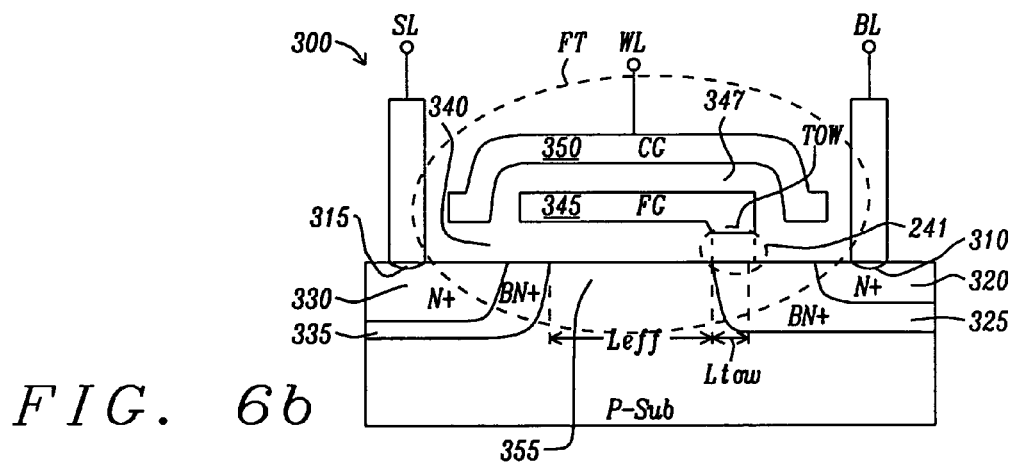
FIG. 6b is a diagram of a cross sectional view of the non-self-aligned one-transistor FLOTOX-based NOR nonvolatile memory cell embodying the concepts of the present invention.
Figure 6C:
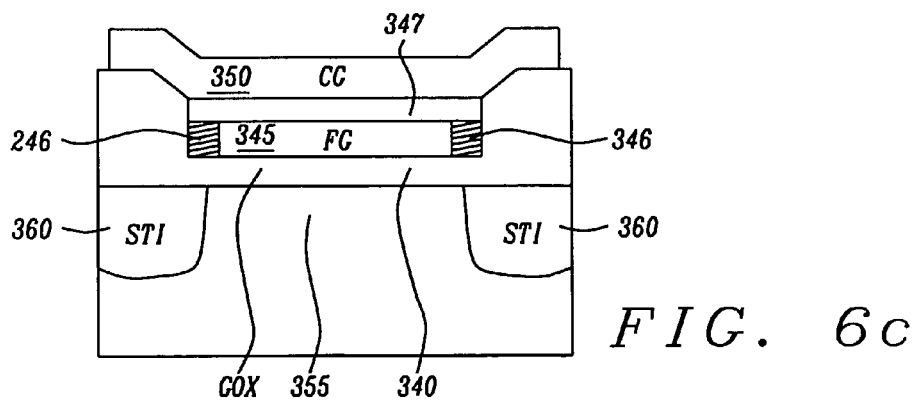
FIG. 6c is a diagram of a lateral cross sectional view of the non-self aligned one-transistor FLOTOX-based NOR nonvolatile memory cell embodying the concepts of the present invention.

FIG. 6a is a diagram of a top view of a non-self-aligned one-transistor FLOTOX-based NOR nonvolatile memory cell embodying the concepts of the present invention. FIG. 6b is a diagram of a cross sectional view of the non-self-aligned one-transistor FLOTOX-based NOR nonvolatile memory cell embodying the concepts of the present invention. FIG. 6c is a diagram of a lateral cross sectional view of the non-self-aligned one-transistor FLOTOX-based NOR nonvolatile memory cell embodying the concepts of the present invention. In various embodiments, the one-transistor FLOTOX-based NOR nonvolatile memory cell 300 is formed as a non-self-aligned floating gate transistor. A P-type substrate is has a shallow trench removed and filled with an insulating material to form the shallow trench isolation 360 that defines the width of the non-self-aligned floating gate transistor. An implantation of an N+ impurity species into the surface of the P-type substrate forms the N+ drain diffusion 320 and the N+ source diffusion 330. The bit line contact 310 is formed to attach the bit line BL to the N+ drain diffusion 320. The source line contact 315 is formed to attach the source line SL to the N+ source diffusion 330.

As in the prior art, the coupling ratio from the second level of the polycrystalline silicon 350 of the control gate CG to the first polycrystalline silicon 345 of the floating gate FG is maintained to be from approximately 60% to approximately 70%. The coupling ratio from drain 320 to the floating gate FG is maintained to be from approximately 10% to approximately 20%. With voltage levels of the method of operation for programming and erasing the one-transistor FLOTOX-based NOR nonvolatile memory cell 300, the length of the channel 355 is reduced from that of the prior art shown in FIGS. 1b and 1c. In order to keep the identical coupling ratio as described above from the control gate CG to the floating gate FG or from the channel region 355 to the floating gate FG, the ratio of the tunneling area 341 to the non-tunneling area 340 is kept the same. The tunneling area 341 is formed by the overlapping area of the second polycrystalline layer 350 of the control gate CG and the tunneling layer 341 and buried implant layers BN+ 325 at drain complying with the minimum design rule. The tunneling oxide window opening TOW is formed under the floating gate with a length of the length of the tunneling oxide window opening Ltow and is extended in the design to the Bit Line contact 310. Since the oxide thickness is formed before placing the floating gate 345, it is removed before the following process step of implantation to the buried implant layers BN+ 325 and drain diffusion 320. The effective channel length $L_{eff}$ is defined as the distance between the two buried implant layers BN+ 325 and 335. As a result, the one-transistor FLOTOX-based NOR nonvolatile memory cell 300 size reduction in Y-dimension is more than 50% as compared to the dimensions in the Y-dimension of the two-transistor FLOTOX-based nonvolatile memory cell of FIG. 1b. The size of the one-transistor FLOTOX-based NOR nonvolatile memory cell 300 in the x-dimension unchanged from the two-transistor FLOTOX-based nonvolatile memory cell FIG. 1b. and is somewhat larger than the size of the one-transistor FLOTOX-based NOR nonvolatile memory cell 200 of FIGS. 4a, 4b, and 4c.

Without the buried implant layer BN+ 325 surrounding the whole tunneling oxide window opening TOW, the edge of tunneling oxide window opening TOW and the edge of the buried BN+ 325 is aligned for saving the height of memory cell in the Y-direction. It ends up with smaller cell size.

This is as opposed to the buried implant layer BN+ 25 surrounding the whole tunneling oxide window opening TOW as shown in FIG. 1c. This results in the program/erase endurance cycling of the one-transistor FLOTOX-based NOR nonvolatile memory cell 300 is degraded from the program/erase cycling endurance of the two-transistor FLOTOX-based nonvolatile memory cell of FIGS. 1b and 1c. However, the size of the one-transistor FLOTOX-based NOR nonvolatile memory cell 300 is reduced by more than 50%. As described above, nonvolatile EEPROM FLOTOX memory devices that include the low-cost one-transistor FLOTOX-based NOR nonvolatile memory cell 300 now provide a block-alterable nonvolatile memory array for code storage on same chip as an array of two-transistor FLOTOX-based NOR nonvolatile memory cells that are byte alterable. This is satisfactory for a block-alterable nonvolatile memory array for code storage that is not modified constantly.

Figure 7A:
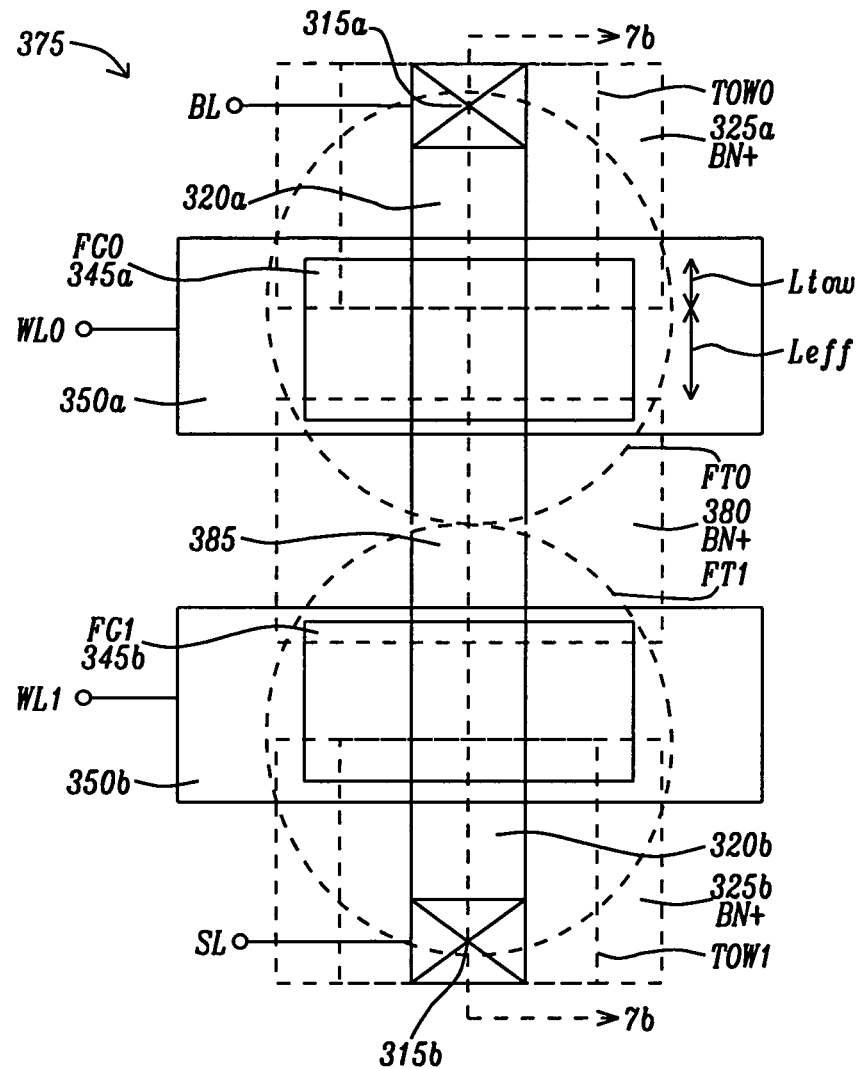
FIG. 7a is a diagram of a top view of a non-self-aligned two-transistor NAND-like FLOTOX-based NOR nonvolatile memory cell embodying the concepts of the present invention.
Figure 7B:
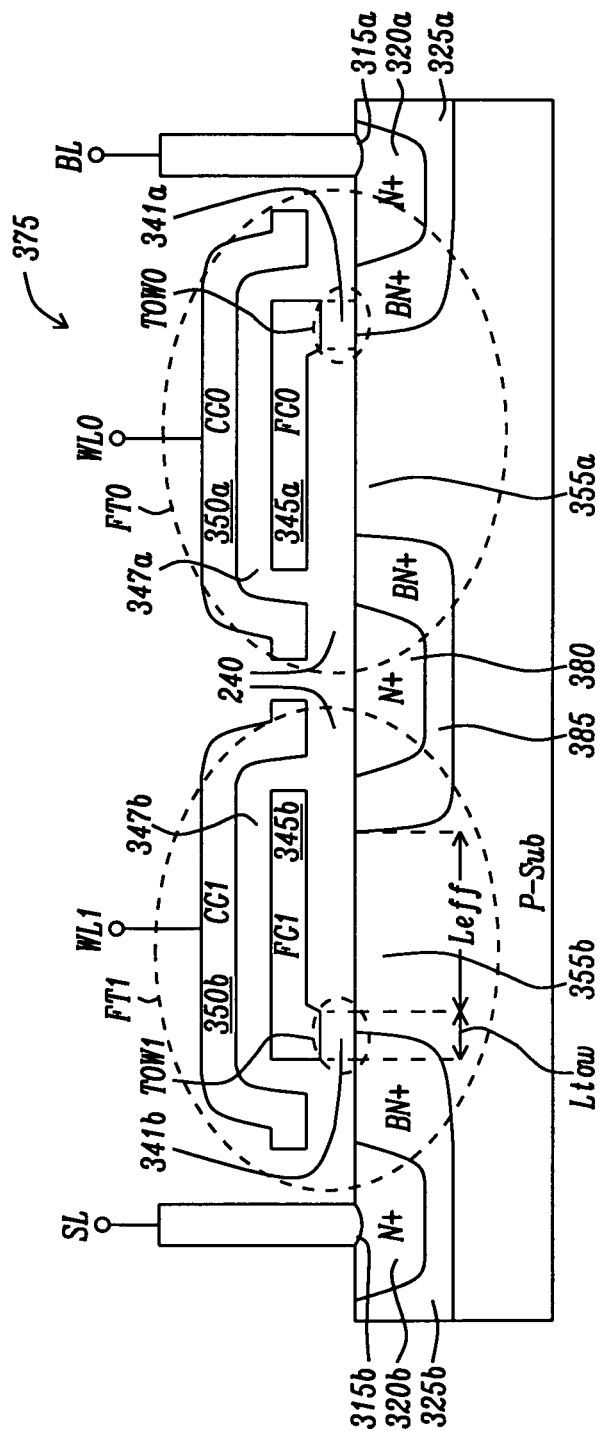
FIG. 7b is a diagram of a cross sectional view of the non-self-aligned two-transistor NAND-like FLOTOX-based NOR nonvolatile memory cell embodying the concepts of the present invention.

FIG. 7a is a diagram of a top view of a non-self-aligned two-transistor NAND-like FLOTOX-based NOR nonvolatile memory cell 375 embodying the concepts of the present invention. FIG. 7b is a diagram of a cross sectional view of the non-self-aligned two-transistor NAND-like FLOTOX-based NOR nonvolatile memory cell 375 embodying the concepts of the present invention. Two of the non-self-aligned one-transistor FLOTOX-based NOR nonvolatile memory cells 300 of FIGS. 6a and 6b are mirrored and connected in series to form the non-self-aligned two-transistor NAND-like FLOTOX-based NOR nonvolatile memory cell 375. A first of the non-self-aligned one-transistor FLOTOX-based NOR nonvolatile memory cell FT0 has its N+ drain diffusion 320a connected to the contact metallurgy 315a that is connected to an associated bit line BL and surrounded by the buried implant layers BN+ 325a. The tunneling oxide window opening TOW0 area is placed adjacent the buried implant layers BN+ 325a. The drain diffusion of the second non-self-aligned one-transistor FLOTOX-based NOR nonvolatile memory cell FT1 is connected to the contact metallurgy 315b that is connected to an associated source line SL and surrounded by the buried implant layers BN+ 325b. In this embodiment, the tunneling oxide window opening TOW0 is adjacent to the drain diffusion 215a that is connected to the bit line BL. The tunneling oxide window opening TOW1 is adjacent to the drain diffusion 215b that is connected to the source line SL.

Two regions 350a and 350b of the second level polycrystalline silicon layer form the control gates CG0 and CG1 respectively. The control gate CG0 is connected to the word line WL0 and the control gate CG1 is connected to the word line WL1. Two regions 345a and 345b of the first level polycrystalline silicon layer form the floating gates FG0 and FG1 respectively. The floating gates FG0 and FG1 are separated from the P-type substrate by the gate oxide 340. The gate oxide 340 is thinned as described above to form the two tunneling oxide regions TOW0 and TOW1.

The two non-self-aligned one-transistor FLOTOX-based NOR nonvolatile memory cells FT0 and FT1 have a common source diffusion 385 surrounded by the buried implant layer BN+ 380. The common source diffusion 385 has no contact metallurgy for connected externally and therefore permits the size of the joint cell to be smaller than two separate non-self-aligned one-transistor FLOTOX-based NOR nonvolatile memory cell 300 of FIGS. 6a and 6b. The non-self-aligned two-transistor NAND-like FLOTOX-based NOR nonvolatile memory cell 375 requires only one bit line BL and one source line SL for the operation of the two non-self-aligned one-transistor FLOTOX-based NOR nonvolatile memory cells FT0 and FT1. The lack of contact for the common source diffusion 385 and the single bit line BL and the single source line SL permits a reduction in cell size of approximately 15% over two non-self-aligned one-transistor FLOTOX-based NOR nonvolatile memory cells 300 of FIGS. 6a and 6b.

The effective length $L_{eff}$ of channels 355a and 355b and the length $L_{TOW}$ of the tunneling oxide windows TOW0 and TOW1 are determined as shown for the non-self-aligned one-transistor FLOTOX-based NOR nonvolatile memory cell 300 of FIGS. 4a and 4b. The operational voltages are essentially the same for programming and erasing operations. Since one of the two non-self-aligned one-transistor FLOTOX-based NOR nonvolatile memory cells FT0 and FT1 functions as a select transistor during a read operation, the select voltage differs from the select voltage of a two-transistor FLOTOX-based nonvolatile memory cell 300 of the prior art. In the read operation, the word line WL0 and WL1 for the non-self-aligned one-transistor FLOTOX-based NOR nonvolatile memory cell FT0 and FT1 functioning as the select transistor is set to a read select voltage level of from approximately 4.0V to approximately 5.0V. As a consequence of the read select voltage level the row read control circuitry is more complicated than that of the prior art.

Figure 8A:
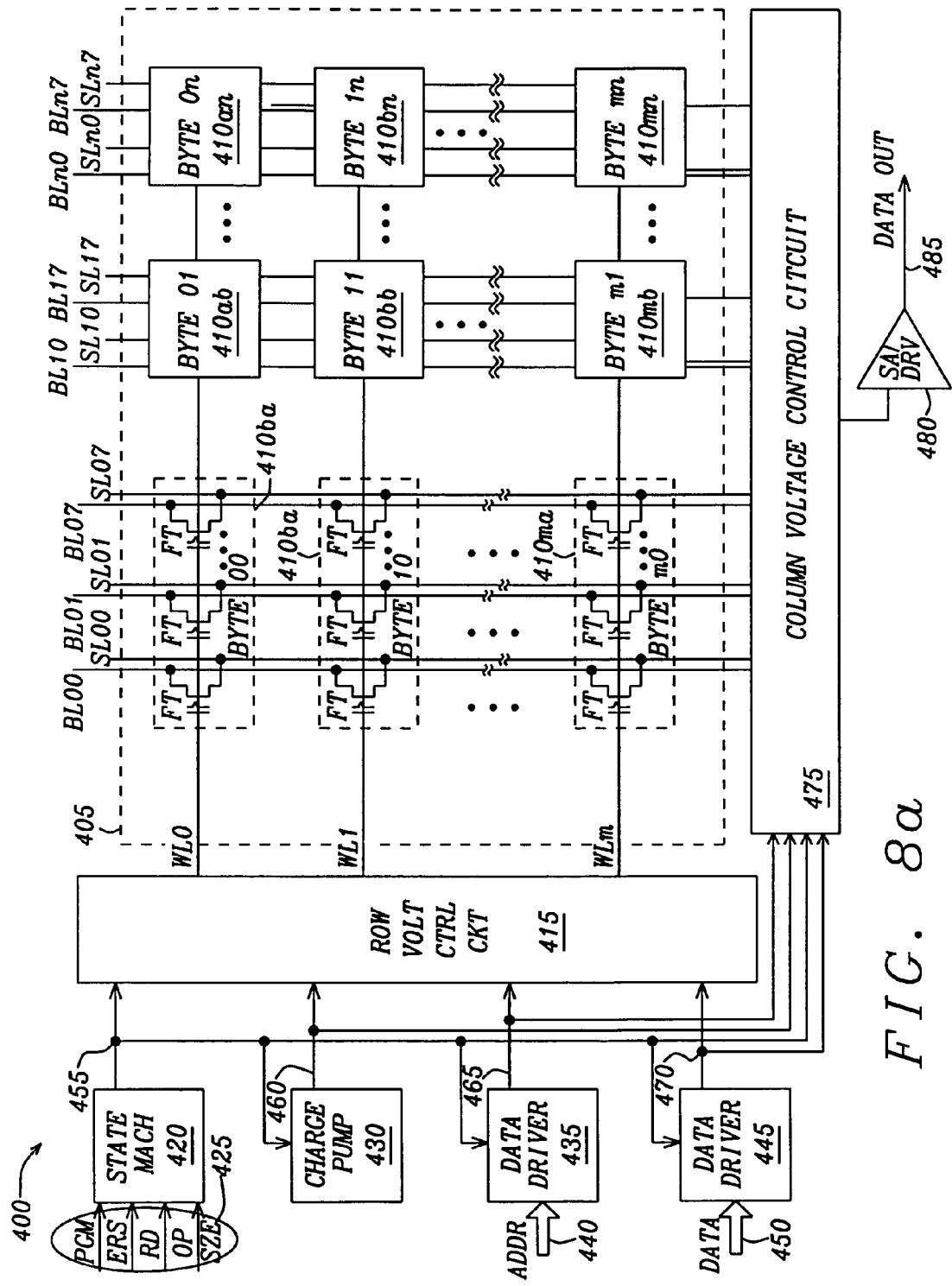
FIG. 8a is a block diagram of a nonvolatile memory device having an array of one-transistor FLOTOX-based NOR nonvolatile memory cells embodying the concepts of the present invention.

FIG. 8a is a block diagram of a nonvolatile memory device 400 having an array 405 of one-transistor FLOTOX-based NOR nonvolatile memory cells FT embodying the concepts of the present invention. The array 405 of the FLOTOX EEPROM memory device 400 is formed of byte-alterable units 410aa, 410ab, ..., 410mn of one-transistor FLOTOX-based NOR nonvolatile memory cells FT. The one-transistor FLOTOX-based NOR nonvolatile memory cells FT are arranged in rows and columns and sub-divided into the byte-alterable units 410aa, 410ab, ..., 410mn. On each row of the one-transistor FLOTOX-based NOR nonvolatile memory cells FT the gates of the one-transistor FLOTOX-based NOR nonvolatile memory cells FT are connected to a word line WL0, WL1, ..., WLm The bit lines BL00, BL01, ..., BL07, BL10, ..., BL17, ..., BLn0, ..., BLn7 are connected to the drains of the one-transistor FLOTOX-based NOR nonvolatile memory cells FT on the associated column. The sources of the one-transistor FLOTOX-based NOR nonvolatile memory cells FT are connected to a source lines SL00, SL01, ..., SL07, SL10, ..., SL17, ..., SLn0, ..., SLn7 that is associated with the column of the one-transistor FLOTOX-based NOR nonvolatile memory cells FT. Each of the bit lines BL00, BL01, ..., BL07, BL10, ..., BL17, ..., BLn0, ..., BLn7 and the source lines SL00, SL01, ..., SL07, SL10, ..., SL17, ..., SLn0, ..., SLn7 are formed as metal lines in parallel with the columns of the one-transistor FLOTOX-based NOR nonvolatile memory cells FT.

The bit lines BL00, BL01, ..., BL07, BL10, ..., BL17, ..., BLn0, ..., BLn7 and the source lines SL00, SL01, ..., SL07, SL10, ..., SL17, ..., SLn0, ..., SLn7 are connected to the column voltage control circuit 475 to receive the necessary voltage levels for reading, erasing, and programming the selected one-transistor FLOTOX-based NOR nonvolatile memory cells FT within chosen byte-alterable units 410aa, 410ab, ..., 410mn. The word lines WL0, WL1, ..., WLm are connected to a row voltage control circuit 415 and the row voltage control circuit 415 similarly provides the necessary voltage levels for the reading, erasing, and programming of the selected one-transistor FLOTOX-based NOR nonvolatile memory cells FT of the chosen byte-alterable units 410aa, 410ab, ..., 410mn. A state machine 420 receives the external command signals 425 (program PGM, erase ERS, Read RD, and operation size OP SIZE). The program signal PGM commands the state machine 420 to generate the necessary timing, command, and control signals 455 for programming selected byte-alterable units 410aa, 410ab, ..., 410mn. The erase signal ERS commands the state machine 420 to generate the necessary timing, command, and control signals 455 for erasing selected byte-alterable units 410aa, 410ab, ..., 410mn. The read signal RD commands the state machine 420 to generate the necessary timing, command, and control signals 455 for reading selected byte-alterable units 410aa, 410ab, ..., 410mn. The operation size signal OP SIZE determines the number of byte-alterable units 410aa, 410ab, ..., 410mn to be programmed, erased, or read. The timing, command, and control signals 455 for the programming, erasing, or reading the selected byte-alterable units 410aa, 410ab, ..., 410mn are transferred to the row voltage control circuit 415 and the column voltage control circuit 475.

The charge pump 430 receives the timing, command, and control signals 455 and based on the timing, command, and control signals 455 in some embodiments generates a very large positive programming voltage, the very large positive erasing voltage, and any other voltage levels required that will be larger than the voltage level of the power supply voltage source. In other embodiments, the charge pump 430 generates a large positive programming voltage, a large negative programming voltage, the very large positive erasing voltage, and any other voltage levels required that are larger than the voltage level of the power supply voltage source. The programming, erasing, and reading voltage levels 460 are transferred to the row voltage control circuit 415 and the column voltage control circuit 475 for transfer to the selected one-transistor FLOTOX-based NOR nonvolatile memory cells FT of the byte-alterable units 410aa, 410ab, ..., 410mn. The address 440 is the input signals to the address decoder 435. The address decoder 435 decodes the address 440 to provide the necessary selection signals 465 for steering the timing, command, and control signals 455 and programming, erasing, and reading voltage levels 460 to the byte-alterable units 410aa, 410ab, . . . , 410mn.

The data 450 to be written to the array 405 is received by the data driver 445. The data driver 445 conditions the received data 450 and transfers the internal data 470 to the row voltage controller 415 and column voltage control circuit 475. The data state of each bit of the selected byte-alterable units 410aa, 410ab, . . . , 410mn determines whether bits are to be erased and reprogrammed or just erased.

The output of the column voltage control circuit 475 is applied to the sense amplifier/driver 480. The source lines SL00, SL01, . . . , SL07, SL10, . . . , SL17, . . . , SLn0, . . . , SLn7 are connected through the column voltage control circuit 475 to the input of the sense amplifier/driver 480 for determining the logic state of selected FLOTOX EEPROM nonvolatile memory cells and creating the data output signal 485.

FIG. 8b is a plot of the threshold voltage levels $VT_{PRG}$ and $VT_{ERS}$ of the one-transistor FLOTOX-based NOR nonvolatile memory cell FT embodying the concepts of the present invention. The program threshold voltage level $VT_{PRG}$ and the erase threshold voltage level $VT_{ERS}$ each define the logic state of the data retained by the one-transistor FLOTOX-based NOR nonvolatile memory cells FT of the array 405 nonvolatile memory device 400. The program threshold voltage level $VT_{PRG}$ and the erase threshold voltage level $VT_{ERS}$ are defined as a positive voltage level to avoid the false data read results from a negative program threshold voltage level of the prior art. In the embodiments of the one-transistor FLOTOX-based NOR nonvolatile memory cells FT that embody the concepts of to this invention, a negative program threshold voltage level will result in the cell leakage in the selected common bit lines BL00, BL01, . . . , BL07, BL10, . . . , BL17, . . . , BLn0, . . . , BLn7 during a read operation.

The erase threshold voltage level $VT_{ERS}$, is defined to increase the threshold voltage level above a voltage level of approximately 3V. This is a non-conduction state for the one-transistor FLOTOX-based NOR nonvolatile memory cells FT and is performed by a Fowler Nordheim-channel tunneling phenomenon. Electrons are injected into the floating gate of the one-transistor FLOTOX-based NOR nonvolatile memory cells FT after a predetermined erase time of approximately 1 mS. The erase threshold voltage level of the one-transistor FLOTOX-based NOR nonvolatile memory cells FT embodying the concepts of this invention is defined to be approximately 1.0V higher than the erased threshold voltage level of the two transistor FLOTOX EEPROM nonvolatile memory cell of the prior art with a threshold voltage level of approximately 2.0V.

Conversely, the program threshold voltage level $VT_{PRG}$, is defined to decrease the threshold voltage level from the erased threshold voltage level $VT_{ERS}$ of approximately 3.0V to the programmed threshold voltage level $VT_{PRG}$ of approximately 1.0V after a program operation embodying the concepts of the present invention. The program threshold voltage level $VT_{PRG}$ is the conduction state and is accomplished with a reverse Fowler Nordheim-channel tunneling effect. The electrons stored in floating gate of the one-transistor FLOTOX-based NOR nonvolatile memory cells FT are expelled out from the floating gate into the P-type substrate P-sub through the tunneling oxide window opening TOW after the predetermined program time of approximately 1 mS. The programmed threshold voltage level $VT_{PRG}$ is defined as being approximately 1.0V higher than the threshold voltage level of the two transistor FLOTOX EEPROM nonvolatile memory cell of the prior art of approximately −2.0V. The one-transistor FLOTOX-based NOR nonvolatile memory cells FT can not allow a negative programmed threshold voltage level as noted above.

FIG. 8c is a table of the embodiments of voltage conditions applied to an array of one-transistor FLOTOX-based NOR nonvolatile memory cells. FIGS. 3a, 3b, and 3c illustrate the one-transistor FLOTOX-based NOR nonvolatile memory cells FT for a method of operation embodying the concepts of the present invention. Refer now to FIGS. 8a and 8c, for the explanation of the method of operation of the FLOTOX EEPROM memory device 400. The BYTE00 410aa of the array 405 of the one-transistor FLOTOX-based NOR nonvolatile memory cells FT contains the selected cells for the erasing procedure, the programming procedure, and the reading procedure and the remaining one-transistor FLOTOX-based NOR nonvolatile memory cells FT are the unselected cells. In an erase procedure of the method of operation embodying the concepts of this invention, the selected word line WL0 is set to a very large erasing voltage level VPP1 that has a voltage level of from approximately 14.0V to approximately 16.0V. The unselected word lines WL1, . . . , WLm are set to the voltage level of the ground reference voltage level (0.0V) to inhibit erasure of the unselected one-transistor FLOTOX-based NOR nonvolatile memory cells FT. All the bit lines BL00, BL01, . . . , BL07, BL10, . . . , BL17, . . . , BLn0, . . . , BLn7 and the source lines SL00, SL01, . . . , SL07, SL10, . . . , SL17, . . . , SLn0, . . . , SLn7 of the array 405 are similarly set to the voltage level of the ground reference voltage level (0.0V).

In the programming procedure of the method of operation of the present embodiment, the selected word line WL0 is connected to the selected one-transistor FLOTOX-based NOR nonvolatile memory cells FT is set to the ground reference voltage level (0.0V). The unselected word lines WL1, . . . , WLm are set to the large program inhibit voltage level VPP2 that is from approximately 8.0V to approximately 10V. The bit lines BL00, BL01, . . . , BL07 connected to the selected one-transistor FLOTOX-based NOR nonvolatile memory cells FT in the BYTE00 410aa are set to the very large programming voltage level VPP1 that is from approximately 14.0V to approximately 16.0V. The bit lines BL10, . . . , BL17, . . . , BLn0, . . . , BLn7 connected to the unselected one-transistor FLOTOX-based NOR nonvolatile memory cells FT are set to the lower program inhibit voltage level VPP3 that is from approximately 3.0V to approximately 5.0V. All the source lines SL00, SL01, . . . , SL07, SL10, . . . , SL17, . . . , SLn0, . . . , SLn7 of the array are disconnected and allowed to float.

In the read procedure of the method of operation of the present embodiment, the selected word line WL0 is set to the read voltage level Vread that is from approximately 1.8V to approximately 3.0V. The unselected word lines WL1, . . . , WLm are set to the ground reference voltage level (0.0V). The bit lines BL00, BL01, . . . , BL07 connected to the selected one-transistor FLOTOX-based NOR nonvolatile memory cells FT in the BYTE00 410aa are set to the read sense voltage level that is less than 1.0V. The bit lines BL10, . . . , BL17, . . . , BLn0, . . . , BLn7 connected to the unselected one-transistor FLOTOX-based NOR nonvolatile memory cells FT are disconnected and allowed to float. All the source lines SL00, SL01, . . . , SL07, SL10, . . . , SL17, . . . , SLn0, . . . , SLn7 of the array are set to the ground reference voltage level (0.0V).

FIG. 8d is a table of the embodiments of voltage conditions applied to an array of one-transistor FLOTOX-based NOR nonvolatile memory cells. FIGS. 4a, 4b, and 4c illustrate the one-transistor FLOTOX-based NOR nonvolatile memory cells FT for a method of operation embodying the concepts of the present invention. Refer now to FIGS. 8*a* and 8*d*, for the explanation of the method of operation of the FLOTOX EEPROM memory device 400, the BYTE00 410*aa* of the array 405 of the one-transistor FLOTOX-based NOR nonvolatile memory cells FT are to be the selected cells. For the erasing procedure, the programming procedure, and the reading procedure and the remaining one-transistor FLOTOX-based NOR nonvolatile memory cells FT are the unselected cells. The erase procedure of the method of operation of the present embodiment of the concepts of this invention is identical to the embodiment illustrated in FIG. 8*c*.

In the programming procedure of the method of operation of the present embodiment, the selected word line WL0 connected to the selected one-transistor FLOTOX-based NOR nonvolatile memory cells FT is set to a negative programming voltage level VNN1 that is from approximately −3.0V to approximately −5.0V. The unselected word lines WL1, . . . , WLm are set to the moderate program inhibit voltage level VPP3 that is from approximately 3.0V to approximately 5.0V. The bit lines BL00, BL01, . . . , BL07 connected to the selected one-transistor FLOTOX-based NOR nonvolatile memory cells FT in the BYTE00 410*aa* are set to a large programming voltage level VPP2 that is from approximately 8.0V to approximately 10.0V. The bit lines BL10, . . . , BL17, . . . , BLn0, . . . , BLn7 connected to the unselected one-transistor FLOTOX-based NOR nonvolatile memory cells FT are set to the ground reference voltage level (0.0V). All the source lines SL00, SL01, . . . , SL07, SL10, . . . , SL17, . . . , SLn0, . . . , SLn7 of the array are disconnected and allowed to float.

In the read procedure of the method of operation of the present embodiment, the selected word line WL0 is set to the read voltage level Vread that is from approximately 1.8V to approximately 3.0V. The unselected word lines WL1, . . . , WLm are set to the ground reference voltage level (0.0V). The bit lines BL00, BL01, . . . , BL07 connected to the selected one-transistor FLOTOX-based NOR nonvolatile memory cells FT in the BYTE00 410*aa* are set to the read sense voltage level that is less than 1.0V. The bit lines BL10, . . . , BL17, . . . , BLn0, . . . , BLn7 connected to the unselected one-transistor FLOTOX-based NOR nonvolatile memory cells FT are disconnected and allowed to float. All the source lines SL00, SL01, . . . , SL07, SL10, . . . , SL17, . . . , SLn0, . . . , SLn7 connected to the sources of the selected one transistor FLOTOX-based NOR nonvolatile memory cells FT are connected to an input of a sense amplifier 480 that has a voltage level that is essentially the ground reference voltage level (0.0V). The sense amplifier determines the logic state of the selected one-transistor FLOTOX-based NOR nonvolatile memory cells FT and generates an output signal 485.

The negative program voltage level VNN1 applied to the selected word line WL0 connected to the selected one-transistor FLOTOX-based NOR nonvolatile memory cells FT and the large positive programming voltage level VPP2 coupled to the bit lines BL00, BL01, . . . , BL07 of the selected one-transistor FLOTOX-based NOR nonvolatile memory cells FT provide an effective voltage drop between the floating gate and the channel region across tunneling oxide window layer of the selected one-transistor FLOTOX-based NOR nonvolatile memory cells FT is equal to the programming voltage of the prior art. The large program voltage applied to the bit lines BL00, BL01, . . . , BL07 results in a voltage level of from approximately 8V to approximately 10V in the channel between the drain and source of the selected one-transistor FLOTOX-based NOR nonvolatile memory cells FT. The selected one-transistor FLOTOX-based NOR nonvolatile memory cells FT must endure a drain-to-source voltage that is approximately 6.0V less than that of the prior art. This means that the drain-to-source breakdown voltage $BV_{Ds}$ requirement may be lower allowing for the channel length to be shorter while maintaining a longer program/erase endurance cycle performance. An advantage for the programming procedure of the present embodiment is that the moderate programming inhibit voltage level VPP3 is reduced to a voltage level that is approximately one half the large programming voltage level VPP2 (from approximately 8.0V to approximately 10.0V).

A method for verifying programming of selected one-transistor FLOTOX-based NOR nonvolatile memory cells FT includes executing the program procedure iteratively with a verify operation executed between each iteration of the program operation until the selected one-transistor FLOTOX-based NOR nonvolatile memory cells FT have a threshold voltage level of the positive program voltage level. The verify operation has the selected word line WL0 connected to the control gates of the selected one-transistor FLOTOX-based NOR nonvolatile memory cells FT set to a first verify voltage level that is approximately 0.5V followed by a second verify operation where a second verify voltage level is approximately 1.0V. The unselected word lines WL1, . . . , WLm connected to the control gates of the unselected one-transistor FLOTOX-based NOR nonvolatile memory cells FT are set to the ground reference voltage level (0.0V). The bit lines BL00, BL01, . . . , BL07 connected to the drains of the selected one-transistor FLOTOX-based NOR nonvolatile memory cells FT are set to a voltage level that is less than 1.0V. The bit lines BL10, . . . , BL17, . . . , BLn0, . . . , BLn7 connected to the drains of the unselected FLOTOX-based NOR nonvolatile memory cells FT are disconnected and allowed to float. The source lines SL00, SL01, . . . , SL07, SL10, . . . , SL17, . . . , SLn0, . . . , SLn7 connected to the sources of the selected one transistor FLOTOX-based NOR nonvolatile memory cells FT are connected to an input of a sense amplifier 480 that has a voltage level that is essentially the ground reference voltage level (0.0V). The sense amplifier determines the logic state of the selected one-transistor FLOTOX-based NOR nonvolatile memory cells FT and generates an output signal 485. The sources of the unselected one transistor FLOTOX-based NOR nonvolatile memory cells FT are set to the ground reference voltage level (0.0V). The verify operation insures that the programmed threshold voltage level is never negative to prevent an over program negative voltage level that will lead to read errors in the FLOTOX-based NOR nonvolatile memory cell array 405.

Figure 9A:
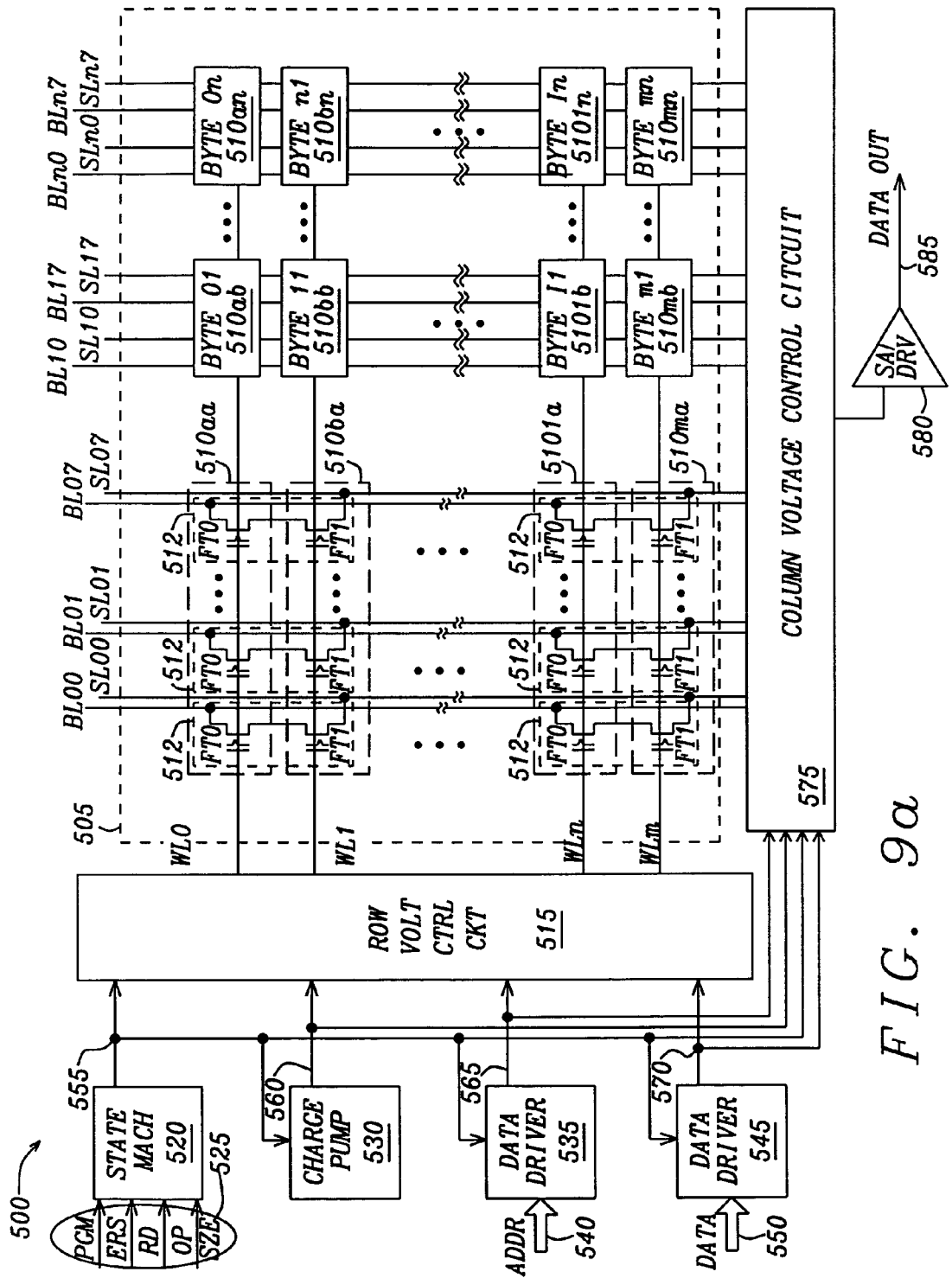
FIG. 9a is a schematic diagram of a nonvolatile memory device having an array of two-transistor NAND-like FLOTOX-based NOR nonvolatile memory cells embodying the concepts of the present invention.

FIG. 9*a* is a block diagram of a nonvolatile memory device 500 having an array 505 of two-transistor NAND-like FLOTOX-based NOR nonvolatile memory cells 512 of FIGS. 5*a*, 5*b*, 7*a*, and 7*b* embodying the concepts of the present invention. FIG. 9*b* is a table of the embodiments of voltage conditions applied to an array 505 of two-transistor NAND-like FLOTOX-based NOR nonvolatile memory cells 512 in a method of operation embodying the concepts of the present invention. The array 505 of the FLOTOX EEPROM memory device 500 is formed of byte-alterable units 510*aa*, 510*ab*, . . . , 510*mn* of two-transistor NAND-like FLOTOX-based NOR nonvolatile memory cells 512. The two-transistor NAND-like FLOTOX-based NOR nonvolatile memory cells 512 are structured as either the two-transistor NAND-like FLOTOX-based NOR nonvolatile memory cells of FIGS. 5*a* and 5*b* or FIG. 7*a* or 7*b*. The two-transistor NAND-like FLOTOX-based NOR nonvolatile memory cells 512 are arranged in rows and columns and sub-divided into byte-alterable units 510*aa*, 510*ab*, . . . , 510*mn*. On each row of the two-transistor NAND-like FLOTOX-based NOR nonvolatile memory cells 512 the gates of the two-transistor NAND-like FLOTOX-based NOR nonvolatile memory cells 512 are connected to paired word lines WL0 and WL1, ..., WLI and WLm.

The bit lines BL00, BL01, ..., BL07, BL10, ..., BL17, ..., BLn0, ..., BLn7 are connected to the drains of the two-transistor NAND-like FLOTOX-based NOR nonvolatile memory cells 512 on the associated column. The sources of the two-transistor NAND-like FLOTOX-based NOR nonvolatile memory cells 512 are connected to a source line SL that is associated with the column of the two-transistor NAND-like FLOTOX-based NOR nonvolatile memory cells 512. Each of the bit lines BL00, BL01, ..., BL07, BL10, ..., BL17, ..., BLn0, ..., BLn7 and the source lines SL00, SL01, ..., SL07, SL10, ..., SL17, ..., SLn0, ..., SLn7 are formed as metal lines in parallel with the columns of the two-transistor NAND-like FLOTOX-based NOR nonvolatile memory cells 512.

The bit lines BL00, BL01, ..., BL07, BL10, ..., BL17, ..., BLn0, ..., BLn7 and the source lines SL00, SL01, ..., SL07, SL10, ..., SL17, ..., SLn0, ..., SLn7 are connected to the column voltage control circuit 575 to receive the necessary voltage levels for reading, erasing, and programming the selected two-transistor NAND-like FLOTOX-based NOR nonvolatile memory cells 512 within chosen byte-alterable units 510aa, 510ab, ..., 510mn. The paired word lines WL0 and WL1, ..., WLI and WLm. are connected to a row voltage control circuit 515 and the row voltage control circuit 515 similarly provides the necessary voltage levels for the reading, erasing, and programming of the selected two-transistor NAND-like FLOTOX-based NOR nonvolatile memory cells 512 of the chosen byte-alterable units 510aa, 510ab, ..., 510mn. A state machine 520 receives the external command signals 525 (program PGM, erase ERS, Read RD, and operation size OP SIZE). The program signal PGM commands the state machine 520 to generate the necessary timing, command, and control signals 555 for programming selected byte-alterable units 510aa, 510ab, ..., 510mn. The erase signal ERS commands the state machine 520 to generate the necessary timing, command, and control signals 555 for erasing selected byte-alterable units 510aa, 510ab, ..., 510mn. The read signal RD commands the state machine 520 to generate the necessary timing, command, and control signals 555 for reading selected byte-alterable units 510aa, 510ab, ..., 510mn. The operation size signal OP SIZE determines the number of byte-alterable units 510aa, 510ab, ..., 510mn to be programmed, erased, or read. The timing, command, and control signals 555 for the programming, erasing, or reading the selected byte-alterable units 510aa, 510ab, ..., 510mn are transferred to the row voltage control circuit 515 and the column voltage control circuit 575.

The charge pump 530 receives the timing, command, and control signals 555 and based on the timing, command, and control signals 555 in some embodiments generates a large positive programming voltage, a large negative programming voltage, the very large positive erasing voltage, and any other voltage levels required that are larger than the voltage level of the power supply voltage source. The programming, erasing, and reading voltage levels 560 are transferred to the row voltage control circuit 515 and the column voltage control circuit 575 for transfer to the selected two-transistor NAND-like FLOTOX-based NOR nonvolatile memory cells 512 of the byte-alterable units 510aa, 510ab, ..., 510mn. The address 540 is the input signals to the address decoder 535. The address decoder 535 decodes the address 540 to provide the necessary selection signals 565 for steering the timing, command, and control signals 555 and programming, erasing, and reading voltage levels 560 to the byte-alterable units 510aa, 510ab, ..., 510mn.

The data 550 to be written to the array 505 is received by the data driver 545. The data driver 545 conditions the received data 550 and transfers the internal data 570 to the row voltage controller 515 and column voltage control circuit 575. The data state of each bit of the selected byte-alterable units 510aa, 510ab, ..., 510mn determines whether bits are to be erased and reprogrammed or just erased.

The source lines SL00, SL01, ..., SL07, SL10, ..., SL17, ..., SLn0, ..., SLn7 are connected through the column voltage control circuit 575 to the input of the sense amplifier/driver 580 for determining the logic state of selected FLOTOX EEPROM nonvolatile memory cells and creating the data output signal 585.

The programmed threshold voltage level $VT_{PRG}$ and the erase threshold voltage level $VT_{ERS}$ of the two-transistor NAND-like FLOTOX-based NOR nonvolatile memory cells 512 embodying the concepts of the present invention is as shown in the plot of FIG. 8b.

FIG. 9b is a table of various embodiments of voltage conditions applied to an array 505 of two-transistor NAND-like FLOTOX-based NOR nonvolatile memory cells 512 in a method of operation embodying the concepts of the present invention. Refer now to FIGS. 9a and 9b, for the explanation of the method of operation of the FLOTOX EEPROM memory device 500. The BYTE00 510aa of the array 505 of the two-transistor NAND-like FLOTOX-based NOR nonvolatile memory cells 512 contains the selected cells for the erasing procedure, the programming procedure, and the reading procedure and the remaining two-transistor NAND-like FLOTOX-based NOR nonvolatile memory cells 512 of the array 505 are the unselected cells. In an erase procedure of the method of operation embodying the concepts of this invention, the selected word line WL0 is set to a very large erasing voltage level VPP1 that has a voltage level of from approximately 14.0V to approximately 16.0V. The unselected paired word lines WL1 ..., WLI, WLm are set to the voltage level of the ground reference voltage level (0.0V) to inhibit erasure of the unselected two-transistor NAND-like FLOTOX-based NOR nonvolatile memory cells 512. All the bit lines BL00, BL01, ..., BL07, BL10, ..., BL17, ..., BLn0, ..., BLn7 and the source lines SL00, SL01, ..., SL07, SL10, ..., SL17, ..., SLn0, ..., SLn7 of the array 505 are similarly set to the voltage level of the ground reference voltage level (0.0V).

In the programming procedure of the method of operation of the present embodiment, the selected word line WL0 is connected to the selected two-transistor NAND-like FLOTOX-based NOR nonvolatile memory cells 512 is set to the ground reference voltage level (0.0V). The unselected word lines WL1, ..., WLI, WLm are set to the large program inhibit voltage level VPP2 that is from approximately 8.0V to approximately 10V. The bit lines BL00, BL01, ..., BL07 connected to the selected two-transistor NAND-like FLOTOX-based NOR nonvolatile memory cells 512 in the BYTE00 510aa are set to the very large programming voltage level VPP1 that is from approximately 14.0V to approximately 16.0V. The bit lines BL10, ..., BL17, ..., BLn0, ..., BLn7 connected to the unselected two-transistor NAND-like FLOTOX-based NOR nonvolatile memory cells 512 are set to the lower program inhibit voltage level VPP3 that is from approximately 3.0V to approximately 4.0V. All the source lines SL00, SL01, ..., SL07, SL10, ..., SL17, ..., SLn0, ..., SLn7 of the array are disconnected and allowed to float.

In the read procedure of the method of operation of the present embodiment, the selected word line WL0 is set to the read voltage level Vread that is from approximately 1.8V to approximately 3.0V. Because the floating gate transistors FT1 on the unselected paired word line WL1 is series with the floating gate transistors FT0 on the selected paired word line WL0, in the read procedure, the floating gate transistors FT1 on the unselected paired word line WL1 are turned on to conduct current in order for the floating gate transistors FT0 on the selected word lines WL0 are able to be read. Therefore, the pass voltage level Vpass that is greater than the threshold voltage level of the paired unselected floating gate transistors FT1 regardless if the paired unselected floating gate transistors FT1 are in the programmed state or the erased state. The paired unselected word lines WL1 is set to a voltage level of Vpass that is from approximately 4.0V to approximately 5V to insure that the paired unselected floating gate transistors FT1 are turned on.

The unselected word lines ..., WLI, WLm are set to the ground reference voltage level (0.0V). The bit lines BL00, BL01, ..., BL07 connected to the selected two-transistor NAND-like FLOTOX-based NOR nonvolatile memory cells 512 in the BYTE00 510aa are set to the read sense voltage level that is less than 1.0V. The bit lines BL10, ..., BL17, ..., BLn0, ..., BLn7 connected to the unselected two-transistor NAND-like FLOTOX-based NOR nonvolatile memory cells 512 are disconnected and allowed to float. All the source lines SL00, SL01, ..., SL07, SL10, ..., SL17, ..., SLn0, ..., SLn7 connected to the sources of the two-transistor NAND-like FLOTOX-based NOR nonvolatile memory cells 512 are connected to an input of a sense amplifier 580 that has a voltage level that is essentially the ground reference voltage level (0.0V). The sense amplifier determines the logic state of the selected two-transistor NAND-like FLOTOX-based NOR nonvolatile memory cells 512 and generates an output signal 585.

FIG. 9c is a table of the embodiments of voltage conditions applied to an array of two-transistor NAND-like FLOTOX-based NOR nonvolatile memory cells 512. Refer now to FIGS. 9a and 9c, for the explanation of the method of operation of the FLOTOX EEPROM memory device 500. The BYTE00 510aa of the array 505 of the two-transistor NAND-like FLOTOX-based NOR nonvolatile memory cells 512 contains the selected cells for the erasing procedure, the programming procedure, and the reading procedure and the remaining two-transistor NAND-like FLOTOX-based NOR nonvolatile memory cells 512 of the array 505 are the unselected cells. The erase procedure of the method of operation of the present embodiment of the concepts of this invention is identical to the embodiment illustrated in FIG. 9b.

In the programming procedure of the method of operation of the present embodiment, the selected word line WL0 connected to the selected two-transistor NAND-like FLOTOX-based NOR nonvolatile memory cells 512 is set to a negative programming voltage level VNN1 that is from approximately −3.0V to approximately −5.0V. The unselected word lines WL1, ..., WLm are set to the moderate program inhibit voltage level VPP3 that is from approximately 3.0V to approximately 5.0V. The bit lines BL00, BL01, ..., BL07 connected to the selected two-transistor NAND-like FLOTOX-based NOR nonvolatile memory cells 512 in the BYTE00 510aa are set to a large programming voltage level VPP2 that is from approximately 8.0V to approximately 10.0V. The bit lines BL10, ..., BL17, ..., BLn0, ..., BLn7 connected to the unselected two-transistor NAND-like FLOTOX-based NOR nonvolatile memory cells 512 are set to the ground reference voltage level (0.0V). All the source lines SL00, SL01, ..., SL07, SL10, ..., SL17, ..., SLn0, ..., SLn7 of the array are disconnected and allowed to float.

The read procedure of the method of operation of the present embodiment is identical to that of the read procedure of FIG. 9b explained above.

The negative program voltage level VNN1 applied to the selected word line WL0 connected to the selected two-transistor NAND-like FLOTOX-based NOR nonvolatile memory cells 512 and the large positive programming voltage level VPP2 coupled to the bit lines BL00, BL01, ..., BL07 of the selected two-transistor NAND-like FLOTOX-based NOR nonvolatile memory cells 512 provide an effective voltage drop between the floating gate and the channel region across tunneling oxide window layer of the selected two-transistor NAND-like FLOTOX-based NOR nonvolatile memory cells 512 is equal to the programming voltage of the prior art. The large program voltage applied to the bit lines BL00, BL01, ..., BL07 results in a voltage level of from approximately 8.0V to approximately 10V in the channel between the drain and source of the selected one-transistor FLOTOX-based NOR nonvolatile memory cells FT. The selected one-transistor FLOTOX-based NOR nonvolatile memory cells FT must endure a drain-to-source voltage that is approximately 6.0V less than that of the prior art. This means that the drain-to-source breakdown voltage $BV_{Ds}$ requirement may be lower allowing for the channel length to be shorter while maintaining a longer program/erase endurance cycle performance. An advantage for the programming procedure of the present embodiment is that the moderate programming inhibit voltage level VPP3 is reduced to a voltage level that is approximately one half the large programming voltage level VPP2 (from approximately 8.0V to approximately 10.0V).

A method for verifying programming of selected two-transistor NAND-like FLOTOX-based NOR nonvolatile memory cells 512 includes executing the program procedure iteratively with a verify procedure executed between each iteration of the program operation until the selected two-transistor NAND-like FLOTOX-based NOR nonvolatile memory cells 512 have a threshold voltage level of the positive program voltage level. The verify operation has the selected word line WL0 connected to the control gates of the selected floating gate transistors FT0 of the selected two-transistor NAND-like FLOTOX-based NOR nonvolatile memory cells 512 is set to a first verify voltage level that is approximately 0.5V followed by a second verify operation where a second verify voltage level is approximately 1.0V. The word line WL1 connected to the unselected floating gate transistor FT1 of the selected two-transistor NAND-like FLOTOX-based NOR nonvolatile memory cells 512 is set to the read pass voltage level Vpass that is greater than the threshold voltage level of the unselected floating gate transistors FT1 regardless if the paired unselected floating gate transistors FT1 are in the programmed state or the erased state. The unselected word lines ..., WLI, WLm connected to the control gates of the unselected two-transistor NAND-like FLOTOX-based NOR nonvolatile memory cells 512 are set to the ground reference voltage level (0.0V). The bit lines BL00, BL01, ..., BL07 connected to the drains of the selected two-transistor NAND-like FLOTOX-based NOR nonvolatile memory cells 512 are set to a voltage level that is less than 1.0V. The bit lines BL10, ..., BL17, ..., BLn0, BLn7 connected to the drains of the unselected two-transistor NAND-like FLOTOX-based NOR nonvolatile memory cells 512 are essentially disconnected and allowed to float. The source lines SL00, SL01, ..., SL07, SL10, ..., SL17, ..., SLn0, ..., SLn7 connected to the sources of the selected two-transistor NAND-like FLOTOX-based NOR nonvolatile memory cells 512 are connected through the column voltage control circuit 575 to the input of the sense amplifier/driver 580 for determining the logic state of selected FLOTOX EEPROM nonvolatile memory cells and creating the data output signal 585. The source lines SL00, SL01, . . . , SL07, SL10, . . . , SL17, . . . , SLn0, . . . , SLn7 connected to the unselected two-transistor NAND-like FLOTOX-based NOR nonvolatile memory cells 512 are set to the ground reference voltage level (0.0V). The verify operation insures that the programmed threshold voltage level is never negative to prevent an over program negative voltage level that will lead to read errors in the two-transistor NAND-like FLOTOX-based NOR nonvolatile memory cell array 505.

Figure 10A:
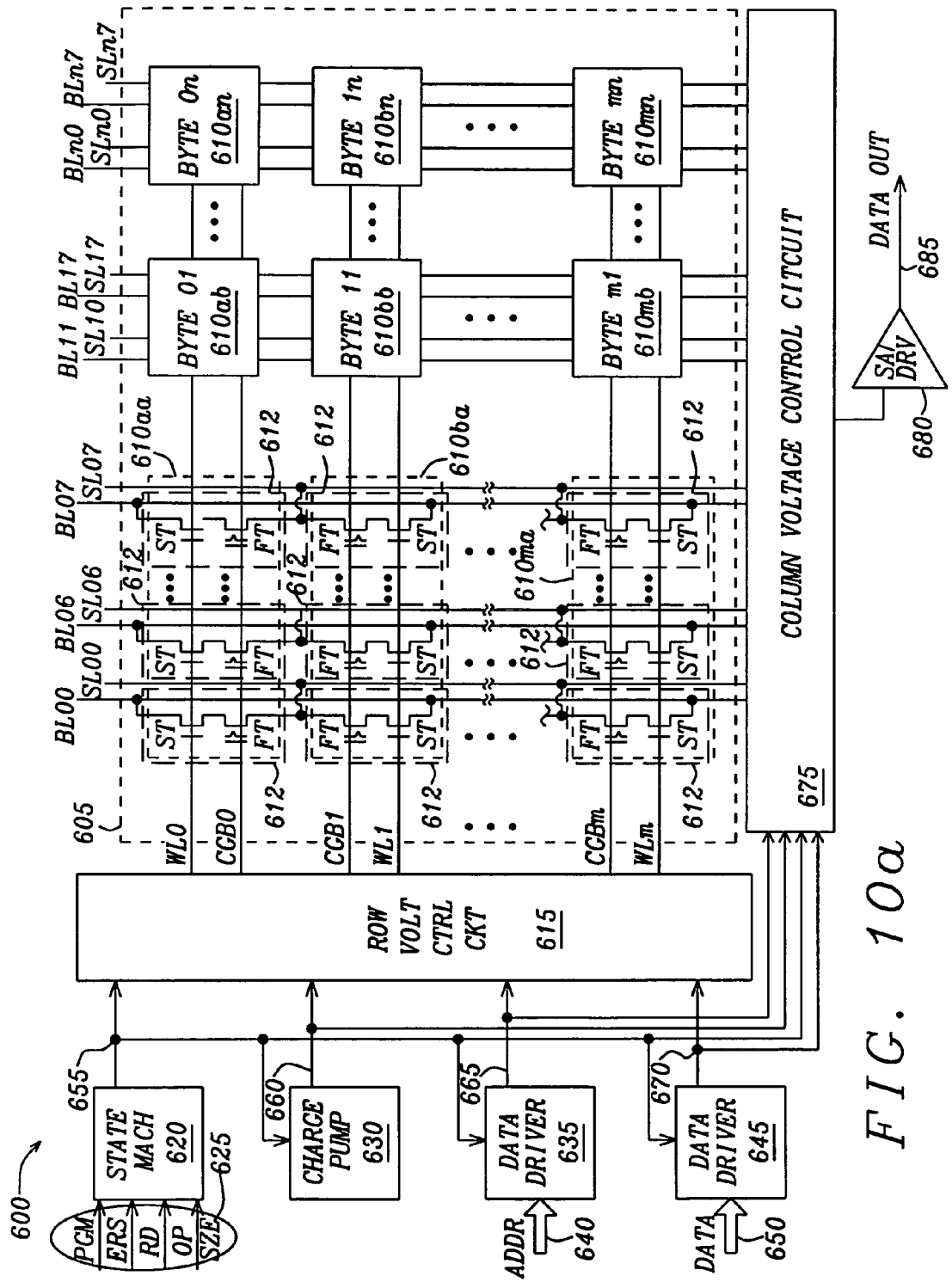
FIG. 10a is block diagram of a FLOTOX EEPROM memory device that is formed of byte-alterable units of two transistor FLOTOX EEPROM nonvolatile memory cells embodying the principles of this invention.

FIG. 10a is block diagram of a FLOTOX EEPROM memory device 600 that is formed of byte-alterable units 610aa, 610ab, . . . , 610mn of two-transistor FLOTOX-based EEPROM nonvolatile memory cells 612 embodying the principles of this invention. The two-transistor FLOTOX-based EEPROM nonvolatile memory cells 612 are structured as described in FIGS. 1a, 1b, and 1c, except the floating gate transistor FT is structured as described in FIGS. 4a, 4b, and 4c or FIGS. 6a, 6b, 6c. The array 605 of the FLOTOX EEPROM memory device 600 is formed of byte-alterable units 610aa, 610ab, . . . , 610mn of two-transistor FLOTOX-based EEPROM nonvolatile memory cells 612. The two-transistor FLOTOX-based EEPROM nonvolatile memory cells 612 are arranged in rows and columns and sub-divided into byte-alterable units 610aa, 610ab, . . . , 610mn. On each row of the two-transistor FLOTOX-based EEPROM nonvolatile memory cells 612, the gates of the select transistors ST of the two-transistor FLOTOX-based EEPROM nonvolatile memory cells 612 are connected to word lines WL0, WL1, . . . , and WLm. The gates of the floating gate transistors FT of the two-transistor FLOTOX-based EEPROM nonvolatile memory cells 612 are connected to control gate biasing lines CGB0, CGB1, . . . , and CGBm.

The bit lines BL00, BL01, . . . , BL07, BL10, . . . , BL17, . . . , BLn0, . . . , BLn7 are connected to the drains of the select transistors ST of the two-transistor FLOTOX-based EEPROM nonvolatile memory cells 612 on the associated column. The sources of the FLOTOX transistor FT of the two-transistor FLOTOX-based EEPROM nonvolatile memory cells 612 are connected to a source line SL00, SL01, . . . , SL07, SL10, . . . , SL17, SLn0, . . . , SLn7 that is associated with the column of the two-transistor FLOTOX-based EEPROM nonvolatile memory cells 612. Each of the bit lines BL00, BL01, . . . , BL07, BL10, . . . , BL17, . . . , BLn0, . . . , BLn7 and the source lines SL00, SL01, . . . , SL07, SL10, . . . , SL17, . . . , SLn0, . . . , SLn7 are formed as metal lines in parallel with the columns of the two-transistor FLOTOX-based EEPROM nonvolatile memory cells 612.

The bit lines BL00, BL01, . . . , BL07, BL10, . . . , BL17, . . . , BLn0, . . . , BLn7 and the source lines SL00, SL01, . . . , SL07, SL10, . . . , SL17, . . . , SLn0, . . . , SLn7 are connected to the column voltage control circuit 675 to receive the necessary voltage levels for reading, erasing, and programming the selected two-transistor FLOTOX-based EEPROM nonvolatile memory cells 612 within chosen byte-alterable units 610aa, 610ab, . . . , 610mn. The word lines WL0, WL1, . . . , and WLm and the control gate biasing lines CGB0, CGB1, . . . , and CGBm are connected to a row voltage control circuit 615 and the row voltage control circuit 615 similarly provides the necessary voltage levels for the reading, erasing, and programming of the selected two-transistor FLOTOX-based EEPROM nonvolatile memory cells 612 of the chosen byte-alterable units 610aa, 610ab, . . . , 610mn. A state machine 620 receives the external command signals 625 (program PGM, erase ERS, Read RD, and operation size OP SIZE). The program signal PGM commands the state machine 620 to generate the necessary timing, command, and control signals 655 for programming selected byte-alterable units 610aa, 610ab, . . . , 610mn. The erase signal ERS commands the state machine 620 to generate the necessary timing, command, and control signals 655 for erasing selected byte-alterable units 610aa, 610ab, . . . , 610mn. The read signal RD commands the state machine 620 to generate the necessary timing, command, and control signals 655 for reading selected byte-alterable units 610aa, 610ab, . . . , 610mn. The operation size signal OP SIZE determines the number of byte-alterable units 610aa, 610ab, . . . , 610mn to be programmed, erased, or read. The timing, command, and control signals 655 for the programming, erasing, or reading the selected byte-alterable units 610aa, 610ab, . . . , 610mn are transferred to the row voltage control circuit 615 and the column voltage control circuit 675.

The charge pump 630 receives the timing, command, and control signals 655 and based on the timing, command, and control signals 655 in some embodiments generates a very large positive programming voltage, the very large positive erasing voltage, and any other voltage levels required that will be larger than the voltage level of the power supply voltage source. In other embodiments, the charge pump 630 generates a large positive programming voltage, a large negative programming voltage, the very large positive erasing voltage, and any other voltage levels required that are larger than the voltage level of the power supply voltage source. The programming, erasing, and reading voltage levels 660 are transferred to the row voltage control circuit 615 and the column voltage control circuit 675 for transfer to the selected two-transistor FLOTOX-based EEPROM nonvolatile memory cells 612 of the byte-alterable units 610aa, 610ab, . . . , 610mn. The address 640 is the group of input signals to the address decoder 635. The address decoder 635 decodes the address 640 to provide the necessary selection signals 665 for steering the timing, command, and control signals 655 and programming, erasing, and reading voltage levels 660 to the byte-alterable units 610aa, 610ab, . . . , 610mn.

The data 650 to be written to the array 605 is received by the data driver 645. The data driver 645 conditions the received data 650 and transfers the internal data 670 to the row voltage controller 615 and column voltage control circuit 675. The data state of each bit of the selected byte-alterable units 610aa, 610ab, . . . , 610mn determines whether bits are to be erased and reprogrammed or just erased. The programmed threshold voltage level $VT_{PRG}$ and the erase threshold voltage level $VT_{ERS}$ of the two-transistor FLOTOX-based EEPROM nonvolatile memory cells 612 embodying the concepts of the present invention is as shown in the plot of FIG. 8b where the threshold voltage level for an erase operation is approximately +2.0V and the threshold voltage level for a program operation is approximately −2.0V. There is no bit line leakage current possible with the negative threshold voltage level of the charge retaining transistors of the unselected two-transistor FLOTOX-based EEPROM nonvolatile memory cells 612 during a read operation. The bit line select transistor 612 is turned off during the read operation preventing the leakage of the unselected two-transistor FLOTOX-based EEPROM nonvolatile memory cells 612.

The output of the column voltage control circuit 675 is applied to the sense amplifier/driver 680. The source lines SL00, SL01, . . . , SL07, SL10, . . . , SL17, . . . , SLn0, . . . , SLn7 are connected through the column voltage control circuit 675 to the input of the sense amplifier/driver 680 for determining the logic state of selected FLOTOX EEPROM nonvolatile memory cells and creating the data output signal 685.

FIG. 10*b* is a table of the embodiments of voltage conditions applied to an array 605 of two-transistor FLOTOX-based EEPROM nonvolatile memory cells 612 in a method of operation embodying the concepts of the present invention. Refer now to FIGS. 10*a* and 10*b*, for the explanation of the erasing procedure, the programming procedure, the reading procedure, and inhibiting the remaining unselected FLOTOX-based NOR nonvolatile memory cells 612 of the method of operation of the FLOTOX EEPROM memory device 600. The BYTE00 610*aa* of the array 605 of the selected FLOTOX-based NOR nonvolatile memory cells 612 contains the selected cells for the erasing procedure, the programming procedure, the reading procedure, and inhibiting the remaining selected FLOTOX-based NOR nonvolatile memory cells 612 of the array 605 are the unselected cells. In the erase procedure of the method of operation embodying the concepts of this invention, the selected word line WL0 connected to the gate of the select transistors ST and the selected control gate biasing line CGB0 connected to the control gate of the floating gate transistors FT of selected FLOTOX-based NOR nonvolatile memory cells 612 in the BYTE00 610*aa* are set to a very large erasing voltage level VPP1 that has a voltage level of from approximately 14.0V to approximately 16.0V. The unselected word lines WL1 . . . , WLm connected gates of the select transistors ST of the unselected FLOTOX-based NOR nonvolatile memory cells 612 in the bytes BYTE00 610*ab*, . . . , BYTE00 610*mn* are set to a low erase inhibit voltage level VPP3 of from approximately the voltage level of the ground reference voltage level (0.0V) to approximately the voltage level of the power supply voltage source Vdd (approximately 1.8V to approximately 3.0V) to inhibit erasure of the unselected FLOTOX-based NOR nonvolatile memory cells 612 in the bytes BYTE00 610*ab*, . . . , BYTE00 610*mn*. The unselected control gate biasing lines CGB1 . . . , CGBm connected to the control gates of the floating gate transistors FT of the bytes BYTE00 610*ab*, . . . , BYTE00 610*mn* are set to the voltage level of the ground reference voltage source (0.0V). The bit lines BL00, BL01, . . . , BL07 connected to drains of the selected FLOTOX-based NOR nonvolatile memory cells 612 in the BYTE00 610*aa* are set to the voltage level of the ground reference voltage level (0.0V). The unselected bit lines BL10, . . . , BL17, . . . , BLn0, . . . , BLn7 connected to the drains of the unselected FLOTOX-based NOR nonvolatile memory cells 612 in the bytes BYTE00 610*ab*, . . . , BYTE00 610*mn* are set to an large inhibit voltage level VPP2 of from approximately 8.0V to approximately 16.0V. All the source lines SL00, SL01, . . . , SL07, SL10, . . . , SL17, . . . , SLn0, . . . , SLn7 connected to the sources of the floating gate transistors of the array 605 are essentially disconnected and allowed to float.

In the programming procedure of the method of operation of the present embodiment, the selected word line WL0 is connected to the gate of the select transistor ST of the selected FLOTOX-based NOR nonvolatile memory cells 612 in the BYTE00 610*aa* is set to the very large programming voltage level VPP1 of from approximately 14.0V to approximately 16.0V. All the selected control gate biasing lines CGB0, CGB1 . . . , CGBm connected to the control gates of the floating gate transistors FT of the memory cells 612 of the bytes BYTE00 610*aa*, BYTE00 610*ab*, . . . , BYTE00 610*mn* are set to the voltage level of the ground reference voltage source (0.0V). The unselected word lines WL1, . . . , WLI, WLm connected to gates of the select transistors ST of the unselected FLOTOX-based NOR nonvolatile memory cells 612 in the bytes BYTE00 610*ab*, . . . , BYTE00 610*mn* are set to the moderate program inhibit voltage level VPP3 that is from approximately the voltage level of the ground reference voltage level (0.0V) to approximately the voltage level of the power supply voltage source Vdd to inhibit the programming of the FLOTOX-based NOR nonvolatile memory cells 612. The bit lines BL00, BL01, . . . , BL07 connected to the drains of the selected FLOTOX-based NOR nonvolatile memory cells 612 in the BYTE00 610*aa* are set to the very large programming voltage level VPP1 that is from approximately 14.0V to approximately 16.0V. The bit lines BL10, . . . , BL17, . . . , BLn0, . . . , BLn7 connected to drains of the unselected FLOTOX-based NOR nonvolatile memory cells 612 off the bytes BYTE00 610*ab*, . . . , BYTE00 610*mn* are set to the lower program inhibit voltage level VPP3 that is from approximately 3.0V to approximately 4.0V. All the source lines SL00, SL01, . . . , SL07, SL10, . . . , SL17, . . . , SLn0, . . . , SLn7 are connected through the column voltage control circuit 675 to the input of the sense amplifier/driver 680 for determining the logic state of selected FLOTOX-based NOR nonvolatile memory cells 612 and creating the data output signal 685.

In the read procedure of the method of operation of the present embodiment, the selected word line WL0 connected to the select gates ST of the selected FLOTOX-based NOR nonvolatile memory cells 612 in the BYTE00 610*aa* is set to the voltage level of the power supply voltage source Vdd. The control gate biasing line CGB0 connected to the control gates of the FLOTOX-based NOR nonvolatile memory cells 612 of the array 605 is set to the read voltage level Vread that is from approximately the voltage level of the ground reference level to approximately 1.0V. The bit lines BL00, BL01, . . . , BL07 connected to drains of the selected FLOTOX-based NOR nonvolatile memory cells 612 in the BYTE00 610*aa* are set to the read sense voltage level that is less than 1.0V. The unselected word lines WL1, . . . , WLm connected to the drains the unselected FLOTOX-based NOR nonvolatile memory cells 612 in the bytes BYTE00 610*ab*, . . . , BYTE00 610*mn* are set to the ground reference voltage level (0.0V). The bit lines BL10, . . . , BL17, . . . , BLn0, . . . , BLn7 connected to drains of the unselected FLOTOX-based NOR nonvolatile memory cells 612 in the bytes BYTE00 610*ab*, . . . , BYTE00 610*mn* are disconnected and allowed to float. All the source lines SL00, SL01, . . . , SL07, SL10, . . . , SL17, . . . , SLn0, . . . , SLn7 of the array 605 are connected to an input of a sense amplifier that has a voltage level that is approximately the ground reference voltage level (0.0V).

FIG. 10*c* is a table of the embodiments of voltage conditions applied to an array 605 of two-transistor FLOTOX-based EEPROM nonvolatile memory cells 612 in a method of operation embodying the concepts of the present invention. Refer now to FIGS. 10*a* and 10*c*, for the explanation of the erasing procedure, the programming procedure, the reading procedure, and inhibiting the remaining unselected FLOTOX-based NOR nonvolatile memory cells 612 of the method of operation of the FLOTOX EEPROM memory device 600. The BYTE00 610*aa* of the array 605 of the selected FLOTOX-based NOR nonvolatile memory cells 612 contains the selected cells for the erasing procedure, the programming procedure, the reading procedure, and inhibiting the remaining unselected FLOTOX-based NOR nonvolatile memory cells 612 of the array 605 are the unselected cells. The erase procedure of the method of operation of FIG. 10*c*, is identical to that of FIG. 10*b* and develops a very large erasing voltage level VPP1 that has a voltage level of from approximately 14.0V to approximately 16.0V is connected between the drains of the selected FLOTOX-based NOR non-volatile memory cells 612 in the BYTE00 610*aa* and the control gates of the selected FLOTOX-based NOR nonvolatile memory cells 612 in the BYTE00 610aa. Similarly, the unselected FLOTOX-based NOR nonvolatile memory cells 612 in the bytes BYTE00 610ab, ..., BYTE00 610mn are inhibited from erasure by keeping the voltage level between the drains and control gates of the unselected memory cells 612 at an erase inhibit voltage level of approximately the ground reference voltage level.

In the programming procedure of the method of operation of the present embodiment, the selected word line WL0 connected to the gate of the select transistors ST of the selected FLOTOX-based NOR nonvolatile memory cells 612 in the BYTE00 610aa is set to the very large programming voltage level VPP1 of from approximately 14.0V to approximately 16.0V. The selected control gate biasing line CGB0 connected to the control gates of the floating transistors FT of the selected FLOTOX-based NOR nonvolatile memory cells 612 in the BYTE00 610aa is set to moderate negative program voltage level VNN1 of from approximately −3.0V to approximately −5.0V. The unselected word lines WL1, ..., WLI, WLm connected to the gates of the select transistors ST of the unselected FLOTOX-based NOR nonvolatile memory cells 612 in the bytes BYTE00 610bb, ..., BYTE00 610mn are set to the moderate program inhibit voltage level VPP3 that is from approximately the voltage level of the ground reference voltage level (0.0V) to approximately the voltage level of the power supply voltage source Vdd to inhibit the programming of the FLOTOX-based NOR nonvolatile memory cells 610ab, ..., 610mn. The unselected control gate biasing lines CGB1 ..., CGBm connected to the control gates of the floating gate transistors FT unselected FLOTOX-based NOR nonvolatile memory cells 612 of the unselected of the bytes BYTE00 610ab, ..., BYTE00 610mn are set to the voltage level of the ground reference voltage source (0.0V) to inhibit programming of the unselected floating gate transistors FT. The bit lines BL00, BL01, ..., BL07 connected to the drains of the select transistors ST of the selected FLOTOX-based NOR nonvolatile memory cells 612 in the BYTE00 610aa are set to the large programming voltage level VPP5 that is from approximately 8.0V to approximately 10.0V to develop the very large programming voltage level between the drains and control gates of floating gate transistors of the selected FLOTOX-based NOR nonvolatile memory cells 612. The bit lines BL10, ..., BL17, ..., BLn0, ..., BLn7 connected to the drains of the select transistors ST the unselected FLOTOX-based NOR nonvolatile memory cells 612 of the bytes BYTE00 610ab, ..., BYTE00 610mn are disconnected and allowed to float. All the source lines SL00, SL01, ..., SL07, SL10, ..., SL17, ..., SLn0, ..., SLn7 of the array 612 are disconnected and allowed to float.

The read procedure of the method of operation of the present embodiment shown in FIG. 10c, is identical to that shown in FIG. 10b.

The negative program voltage level VNN1 applied to the control gate biasing line CGB0 connected to the control gates of the floating gate transistors of the selected two-transistor FLOTOX-based EEPROM nonvolatile memory cells 612 and the large positive programming voltage level VPP2 coupled to the bit lines BL00, BL01, ..., BL07 of the selected two-transistor FLOTOX-based EEPROM nonvolatile memory cells 612 provide an effective voltage drop between the floating gate and the channel region across tunneling oxide window layer of the selected two-transistor FLOTOX-based EEPROM nonvolatile memory cells 612 is equal to the programming voltage of the prior art. The large program voltage applied to the bit lines BL00, BL01, ..., BL07 results in a voltage level of approximately 10V in the channel between the drain and source of the selected two-transistor FLOTOX-based EEPROM nonvolatile memory cells 612. The selected two-transistor FLOTOX-based EEPROM nonvolatile memory cells 612 must endure a drain-to-source voltage that is approximately 6.0V less than that of the prior art. This means that the drain-to-source breakdown voltage $BV_{DS}$ requirement may be lower allowing for the channel length to be shorter while maintaining a longer program/erase endurance cycle performance. An advantage for the programming procedure of the present embodiment is that the moderate programming inhibit voltage level VPP3 is reduced to a voltage level that is less than one half the large programming voltage level VPP5 (approximately 8.0V).

Figure 11:
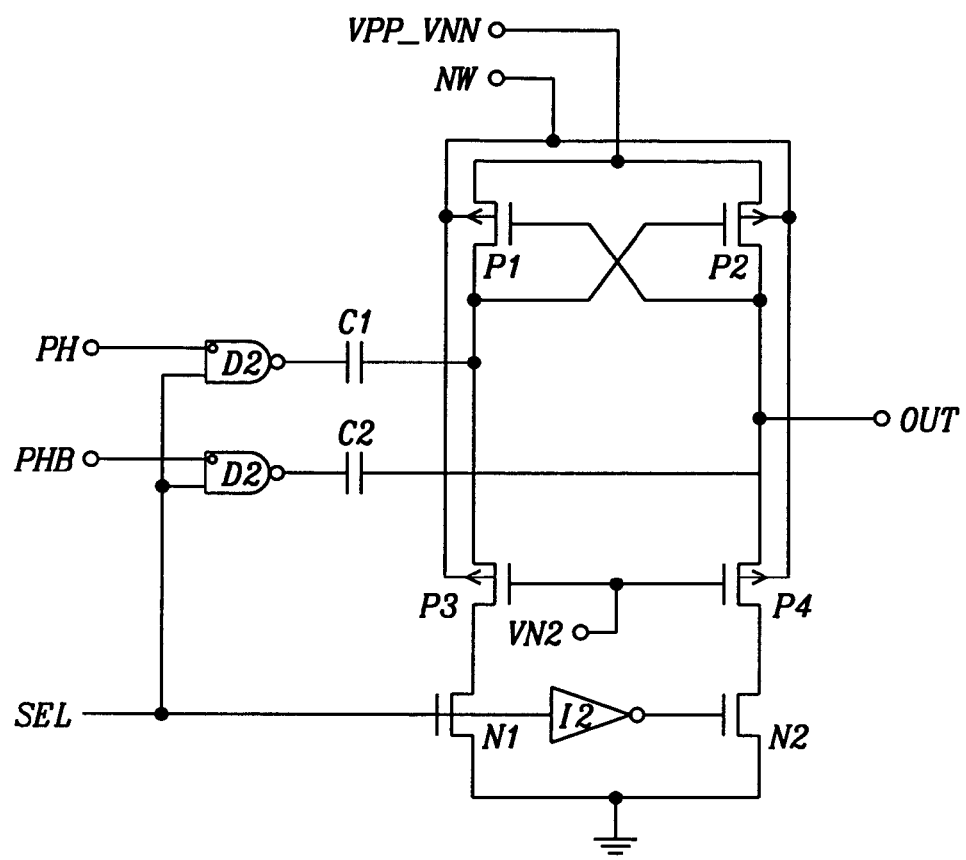
FIG. 11 is a schematic drawing of a level-shifter with local pump embodying the principles of the current invention.

FIG. 11 is a schematic drawing of a level-shifter with local pump 700 embodying the principles of the current invention that can switch both a positive high voltage level (VPP) and negative high voltage (VNN) in the erase and program procedures. A level shifter circuit of the prior art using twin-well technology (PMOS located inside N-well, and NMOS located inside P-substrate) can only switch positive voltage. A negative voltage applied to the source/drain of the NMOS causes a forward current from the P-type substrate that is connected to GND to the N-type source/drain diffusion of the NMOS transistors used for the design of a negative voltage level shifter in the manufacturing process of the prior art. This would cause the negative pump to fail to maintain the negative voltage. One solution for this problem is a complicated triple-well process with the NMOS transistors located in an isolated P-well that is inside a 'deep' N-well). This structure is used in the flash memory that normally requires negative high voltage in erase and program. The triple-well process increases manufacturing cost is not desirable for the current standard manufacturing process for EEPROM nonvolatile memory devices of the prior art that only uses positive high voltage.

The level shifter as shown in FIG. 11 is manufactured with the current manufacturing process for EEPROM nonvolatile memory devices with a twin-well structure. The level shifter embodying the concepts of the present invention does not require any process modification and thus eliminates added any manufacturing process costs. The circuit contains three sub-circuits—a positive level shifter, a negative level shifter, and an isolation circuit.

The positive level shifter is formed by the interconnection of the PMOS transistors P1 and P2, the NMOS transistors N1 and N2, and inverter 11 for switching positive high voltage. The negative level shifter is formed by the interconnection of the PMOS transistors P1 and P2, the capacitors C1 and C2, and the NAND gates D1 and D2. The negative level shifter forms a PMOS 'local pump' circuit for switching negative voltage levels. The isolation circuit is formed by the PMOS transistors P3 and P4 to isolate the negative voltage of the negative level shifter from reaching the NMOS transistors N1 and N2 to prevent the forward current from the forward current as described earlier.

The bulk regions of the PMOS transistors P1, P2, P3 and P4 are formed of the N-type well NW. The sources of the PMOS transistors P1 and P2 are connected to the terminal VPP_VNN to receive the very large programming and erasing voltage levels. The drain of the PMOS transistor P1 connected to the gate of the PMOS transistor P2 and the drain of the PMOS transistor P2 connected to the gate of the PMOS transistor P1.

The out-of-phase inputs of the NAND gate D1 is connected to the in-phase clocking signal PH and the out-of-phase inputs of the NAND gate D2 is connected to the out-of-phase clocking signal PHB. The in-phase input of the NAND gates D1 and D2 are connected to receive a select signal SEL. The output of the NAND gate D1 is connected to a first terminal of the capacitor C1 and the output of the NAND gate D2 is connected to a first terminal of the capacitor C2. The second terminal of the capacitor C1 is connected to the drain of the PMOS transistors P1 and the second terminal of the capacitor C2 is connected to the drain of the PMOS transistors P2.

The drain of the PMOS transistor P1 is connected to the source of the PMOS transistors P3 and the drain of the PMOS transistor P1 is connected to the source of the PMOS transistors P3. The gates of the PMOS transistors P3 and P4 are connected the gating signal VN2. The drain of the PMOS transistor P3 is connected to the drain of the NMOS transistors N1 and the drain of the PMOS transistors P4 is connected to the drain of the NMOS transistors N2. The gate of the NMOS transistor N1 and the input of inverter 12 are connected to receive the select signal SEL. The output of the inverter 12 is connected to the gate of the transistor N2. The sources of the NMOS transistors N1 and N2 are connecting the ground reference voltage source. The output terminal OUT is connected to the drains of the PMOS transistor P2 and the NMOS transistor N2. The output terminal OUT is connected to the array of the FLOTOX EEPROM memory cells.

In the negative program procedures using the negative program voltage level VNN1, the level shifter switches the negative program voltage level VNN1 to the word lines or control gate bias lines of the selected FLOTOX EEPROM memory cells. The negative programming voltage level VNN1 is applied to the terminal VPP_VNN. The ground reference voltage level applied to the N-type well NW to prevent the forward current from negative programming voltage level VNN1 at the terminal VPP_VNN flowing to the N-type well NW. The in-phase clocking signal PH out-of-phase clocking signal PHB are activated such that the out-of-phase clocking PHB enables a local pump circuit within the negative level shifter. The select signal SEL is activated to allow in-phase clocking PH and the out-of-phase clocking PHB to be applied to the first terminals of the capacitors C1 and C2. The capacitors C1 and C2 couple the nodes A and B to apply a negative voltage level to the gate of the PMOS transistors P1 and P2 to turn on the PMOS transistors P1 and P2. The activation of PMOS transistors P1 and P2 allows the negative program voltage level VNN1 present at the terminal VPP_VNN node to pass to the nodes A and B. The gating signal VN2 is activated to approximately the ground reference voltage level to turn off the PMOS transistors P3 and P4 to prevent the negative program voltage level VNN1 being coupled to the drains of the NMOS transistors N1 and N2.

When the negative level shifter is not selected, the select signal SEL is deactivated. The select signal SEL is inverted by the inverter circuit 11 and turns on the gate of the NMOS transistor N2. This causes the NMOS transistor N2 to pull down the output terminal OUT to the ground reference voltage level. The gating select signal VN2 is applied to the gates of the PMOS transistors P3 and P4 with a low negative voltage level of from approximately 1.0V to approximately 2.0V. This causes the ground reference voltage level (0.0V) to be fully passed to the output terminal OUT. This enables the negative level shifter to provide either the negative programming voltage level VNN1 or the ground reference voltage level to the word lines of the FLOTOX EEPROM based nonvolatile memory structures of this invention through the row decoder 415, 515, and 615 of FIGS. 8a, 9a, and 10a respectively.

When the level shifter is functioning a the positive level shifter, the positive programming or erasing voltage level is applied to the terminal VPP_VNN and to the N-type well NW. The in-phase clocking PH and out-of-phase clocking PHB are deactivated such that the capacitors C1 and C2 are not coupled to the nodes A and B respectively and function as passive capacitors. The negative pump circuit of the negative level shifter becomes inactive. The gating signal VN2 applied to the gates of the PMOS transistors P3 and P4 is a negative low voltage of from approximately −1.0V to approximately 2.0V to activate the PMOS transistors P3 and P4 to fully pass VDD/GND to the NMOS transistors N1 and N2. When the level shifter is selected, the select signal SEL is activated high to turn on the NMOS transistor N1 and the PMOS transistor P2 and to turn off the NMOS N2 and the PMOS transistor P1. The positive programming or erasing voltage level is coupled from the terminal VPP_VNN to the output terminal OUT. When select signal SEL is deactivated, the level shifter is de-selected such that the NMOS transistor N1 and the PMOS transistor P2 are turned off and the NMOS N2 and the PMOS transistor P1 are turned on. The output terminal OUT is coupled to the ground reference voltage level.

Each of the EEPROM based devices as described FIGS. 8a, 9a, and 10a maybe combined on a single substrate for form a combination nonvolatile memory device and be in keeping with the concepts of the present invention. The combination nonvolatile memory device will have an mixture of a two-transistor FLOTOX EEPROM memory of FIG. 10a for byte alterable operation retaining data, a one-transistor FLOTOX EEPROM-based NOR memory of FIG. 8a for a block and sector alterable operation for retaining program code, a two-transistor NAND-like FLOTOX EEPROM based NOR memory of FIG. 9a for a similar block and sector alterable operation for retaining program code.

In some embodiments, a FLOTOX EEPROM-based NAND structure may used in the combination nonvolatile memory device for extremely large block and sector alterable operation for retaining large data structures and be in keeping with the concepts of the present invention. In that case, multiple FLOTOX transistors are serially connected to a switching transistor to form a NAND string of the FLOTOX transistors. With the negative programming voltage applied to the selected word line of the NAND string of the FLOTOX transistors and the very large positive programming voltage level applied to the bit lines and thus to the drains of the selected FLOTOX transistors, the voltage across the channel of the FLOTOX transistors is lowered in comparison to that of the prior art and the size of the FLOTOX transistors is made smaller. With appropriate modification of the cell dimensions, the coupling ratio can be maintained to the levels described above.

Figure 12A:
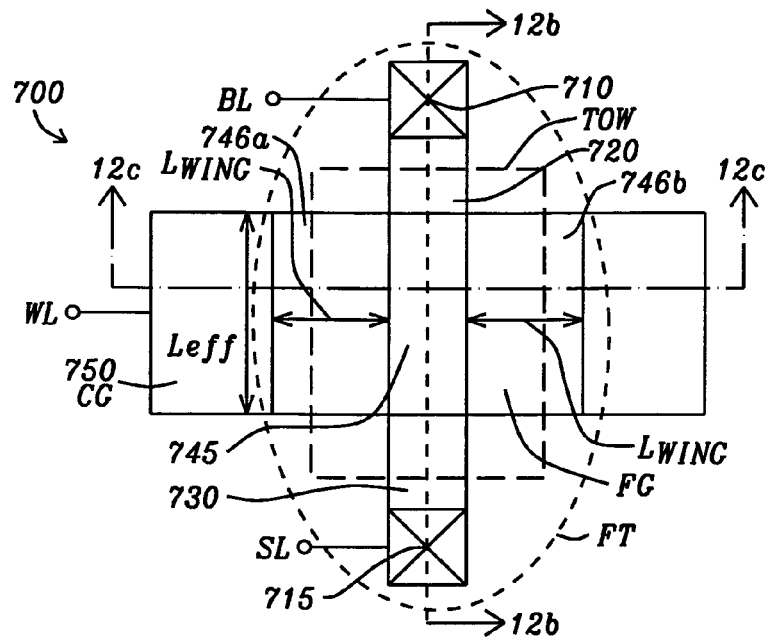
FIG. 12a is a diagram of a top view of a self-aligned one-transistor FLOTOX-based NOR nonvolatile memory cell embodying the concepts of the present invention.
Figure 12B:
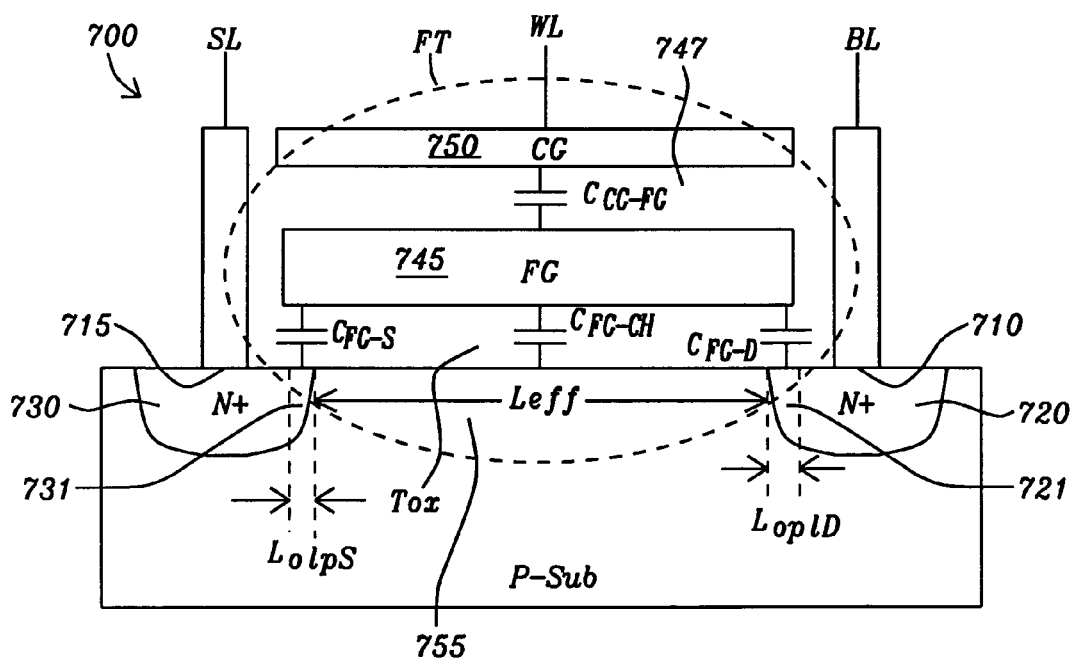
FIG. 12b is a diagram of a longitudinal cross sectional view of the self-aligned one-transistor FLOTOX-based NOR nonvolatile memory cell embodying the concepts of the present invention.
Figure 12C:
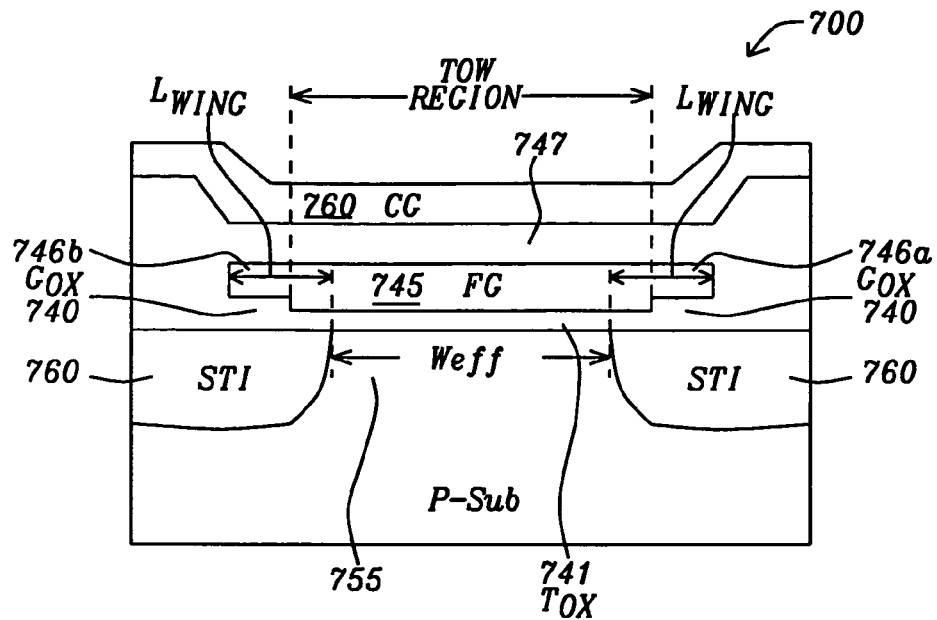
FIG. 12c is a diagram of a lateral cross sectional view of the self-aligned one-transistor FLOTOX-based NOR nonvolatile memory cell embodying the concepts of the present invention.

FIG. 12a is a diagram of a top view of a self-aligned one-transistor FLOTOX-based NOR nonvolatile memory cell 700 embodying the concepts of the present invention. FIG. 12b is a diagram of a longitudinal cross sectional view of the self-aligned one-transistor FLOTOX-based NOR nonvolatile memory cell 700 embodying the concepts of the present invention. FIG. 12c is a diagram of a lateral cross sectional view of the self-aligned one-transistor FLOTOX-based NOR nonvolatile memory cell 700 embodying the concepts of the present invention. In various embodiments, the one-transistor FLOTOX-based NOR nonvolatile memory cell 700 is formed as a self-aligned floating gate transistor. The gate oxide 740 is deposited on the surface of the P-type substrate P-sub. The gate oxide 740 is thinned to about 100 Å thickness to form the tunnel oxide window opening TOW 741 to allow Fowler-Nordheim tunneling during the normal program or erase operation of the one-transistor FLOTOX-based NOR nonvolatile memory cell 700. In this embodiment, the tunneling oxide window TOW 741 is extended from essentially the center of the drain region 720 to the center of the source region and beyond the active region of self-aligned FLOTOX-based NOR nonvolatile memory transistor FT and extended over the two shallow trench isolations 760. The first level of the polycrystalline silicon 745 is deposited on the surface of the gate oxide 740 and the tunnel oxide window opening TOW to form the floating gate FG. The first level of the polycrystalline silicon 745 is further deposited over the two shallow trench isolations 760 by length $L_{WING}$ to form the first overlapping extension wing 746a and second overlapping extensions wing 746b. The length $L_{WING}$ is determined by the capacitance needed between the floating gate FG and the control gate CG for maintaining the constant coupling ratio as the dimensions of the self-aligned one-transistor FLOTOX-based NOR nonvolatile memory cell is decreased and the high program voltage and erase voltages across the channel 755 are reduced.

An interlayer dielectric layer 747 is formed of deposited silicon oxide-silicon nitride-silicon oxide (ONO). A second polycrystalline silicon layer 750 is deposited on the interlayer dielectric layer 747 to form the control gate CG. The control gate is connected to the word line WL in an array of the one-transistor FLOTOX-based NOR nonvolatile memory cells 700. The second polycrystalline silicon layer 750, interlayer dielectric layer 747, first level of the polycrystalline silicon 745, and the gate oxide 740 are collectively etched to form opening for receiving the implantation of an N+ impurity species that forms the N+ drain diffusion 720 and the N+ source diffusion 730. The bit line contact 710 is formed to attach the bit line BL to the N+ drain diffusion 720. The source line contact 715 is formed to attach the source line SL to the N+ source diffusion 730

As in the prior art, the coupling ratio from the second level of the polycrystalline silicon 750 of the control gate CG to the first polycrystalline silicon 745 of the floating gate FG is maintained to be from approximately 60% to approximately 70%. The coupling ratio from drain 720 to the floating gate FG is maintained to be from approximately 10% to approximately 20%. In order to keep the identical coupling ratio from the second level polycrystalline silicon layer 750 of the control gate CG to the first level of the polycrystalline silicon 745 of the floating gate FG, the effective width Weff of the channel, the length $L_{WING}$ of the first and second extensions wing 746a and 746b, the thickness of the interlayer dielectric layer 747 are modified to determine control gate to floating gate capacitance $C_{CG-FG}$. The control gate to floating gate capacitance $C_{CG-FG}$ is determined according to the following formula:

$$C_{CG-FG} = \varepsilon_{0ONO} \frac{A_{FG}}{4\pi d_{ILD}} \qquad \text{Eq. 1}$$

where:
$\varepsilon_{0ONO}$ is the dielectric constant of the interlayer dielectric layer 747.
$A_{FG}$ is the area of the control gate and floating gate and is dependent on the size of channel length Leff, channel width Weff, and the length $L_{WING}$ of the first and second extensions wing 746a and 746b.
$d_{ILD}$ is thickness of the interlayer dielectric layer 747.

The floating gate to channel capacitance $C_{FG-CH}$ is the capacitance of the channel region 755 to first level of the polycrystalline silicon 745 of the floating gate FG and is determined by the formula:

$$C_{FG-CH} = \varepsilon_{0TOX} \frac{A_{CHAN}}{4\pi d_{TOX}} \qquad \text{Eq. 2}$$

where:
$\varepsilon_{0TOX}$ is the dielectric constant of the tunneling oxide layer 741.
$A_{CHAN}$ is the area of the channel and is dependent on the size of channel length Leff and channel width Weff.
$d_{TOX}$ is thickness of the tunneling oxide layer 741.

The floating gate to the drain capacitance $C_{FG-D}$ is the capacitance between the floating gate FG and the area 721 that the floating gate FG overlaps the drain region 720.

$$C_{FG-D} = \varepsilon_{0TOX} \frac{A_{OLPD}}{4\pi d_{TOX}} \qquad \text{Eq. 3}$$

where:
$\varepsilon_{0TOX}$ is the dielectric constant of the tunneling oxide layer 741.
$A_{OLPD}$ is the area of the channel and is dependent on the length $L_{olpD}$ of the Floating gate FG to drain 720 overlap and the channel width Weff.
$d_{TOX}$ is thickness of the tunneling oxide layer 741.

The floating gate to the source capacitance $C_{FG-S}$ is the capacitance between the floating gate FG and the area 731 that the floating gate FG overlaps the source region 730.

$$C_{FG-S} = \varepsilon_{0TOX} \frac{A_{OLPS}}{4\pi d_{TOX}} \qquad \text{Eq. 4}$$

where:
$\varepsilon_{0TOX}$ is the dielectric constant of the tunneling oxide layer 741.
$A_{OLPS}$ is the area of the channel and is dependent on the length $L_{olpS}$ of the Floating gate FG to source 730 overlap and the channel width Weff.
$d_{TOX}$ is thickness of the tunneling oxide layer 741.

The coupling ratio $CR_{CG-FG}$ for the control gate to floating gate capacitance is determined by the formula:

$$CR_{CG-FG} = \frac{C_{CG-FG}}{C_{TOTAL}} \qquad \text{Eq. 5}$$

where:
$C_{CG-FG}$ is the control gate to floating gate capacitance determined above.
$C_{TOTAL}$ is the sum of the capacitances from the control gate to the substrate P-Sub is determined by the formula:

$$C_{TOTAL} = C_{CG-FG} + C_{FG-CHAN} + C_{FG-D} + C_{FG-S}.$$

The coupling ratio $CR_{FG-D}$ for the floating gate capacitance to drain capacitance $C_{FG-D}$ is determined by the formula:

$$CR_{FG-D} = \frac{C_{FG-D}}{C_{TOTAL}} \qquad \text{Eq. 6}$$

where:
$C_{FG-D}$ is the floating gate to drain 720 capacitance; and
$C_{TOTAL}$ is the total capacitance determined above.

The dimensions of the length $L_{WING}$ of the first and second extensions wing 746a and 746b, the channel length Leff, the channel width Weff, and length Lolp the floating gate FG to drain 720 are determined from the above formulas to maintain the coupling ratios $CR_{DG-FG}$ and $CR_{FG-D}$ at constant values. The dielectric constant $\in_{OONO}$ for the interlayer dielectric 747 and the dielectric constant $\in_{OTOX}$ for the tunneling oxide 741 are different and are determined by the materials (Oxide-Nitride-Oxide for the interlayer dielectric 747 and silicon oxide for the tunneling oxide 741) of each layer 747 and 741.

The tunneling window TOW is shown to cover only the self-aligned FLOTOX-based NOR nonvolatile memory transistor FT, but may be expanded to even cover the entire memory array area with one big open window to reduce manufacturing process complexity and enhance the manufacturing yield.

Increasing the tunneling region of the self-aligned FLOTOX-based NOR nonvolatile memory transistor FT reduces the coupling ratio $CR_{CG-FG}$ from the control gate CG to the floating gate FG due to the capacitance $C_{FG-SUB}$ between floating gate FG to the p-type substrate P-SUB is increased. To compensate, the length $L_{WING}$ of the first and second extensions wing 746a and 746b is increased. By increasing the length $L_{WING}$ of the first and second extension wings 746a and 746b, the coupling ratio $CR_{CG-FG}$ can be increased and the required very large erase voltage level and very large program voltage level is not increased. The operation voltages of the self-aligned one-transistor FLOTOX-based NOR nonvolatile memory cell 700 is identical to the operational voltages of the self-aligned one-transistor FLOTOX-based NOR nonvolatile memory cell 700 of FIGS. 4a, 4b, and 4c.

Figure 13A:
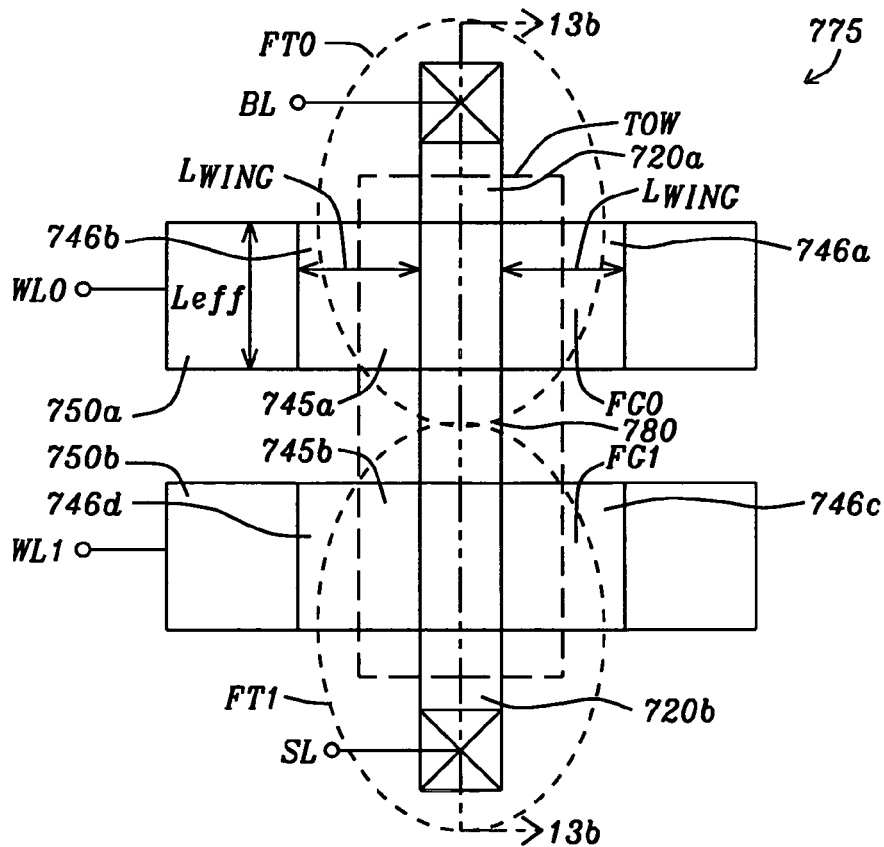
FIG. 13a is a diagram of a top view of a self-aligned two-transistor NAND-like FLOTOX-based NOR nonvolatile memory cell embodying the concepts of the present invention.
Figure 13B:
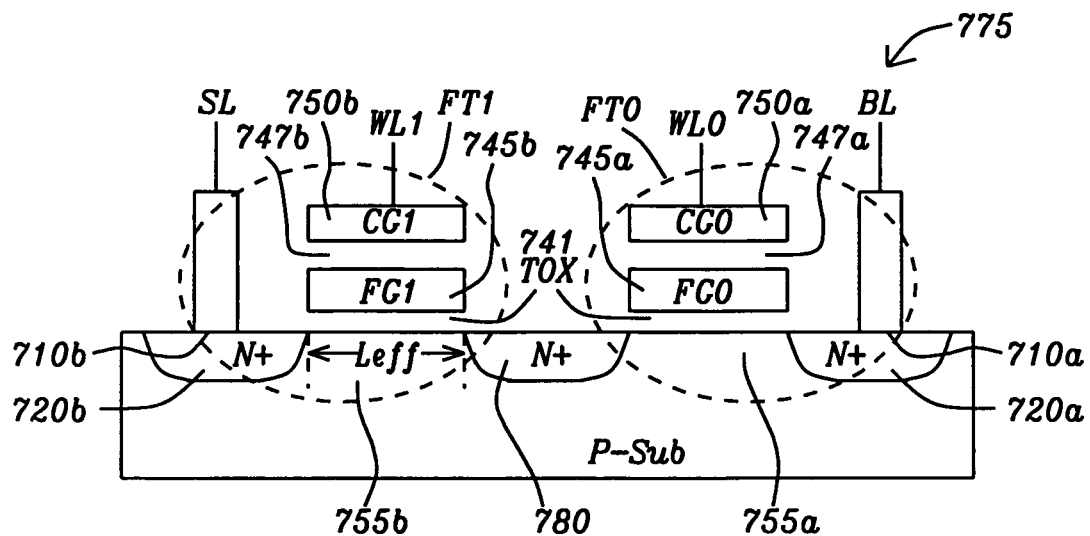
FIG. 13b is a diagram of a cross sectional view of the self-aligned two-transistor NAND-like FLOTOX-based NOR nonvolatile memory cell embodying the concepts of the present invention.

FIG. 13a is a diagram of a top view of a self-aligned two-transistor NAND-like FLOTOX-based NOR nonvolatile memory cell 775 embodying the concepts of the present invention. FIG. 13b is a diagram of a longitudinal cross sectional view of the self-aligned two-transistor NAND-like FLOTOX-based NOR nonvolatile memory cell 775 embodying the concepts of the present invention. Two of the self-aligned one-transistor FLOTOX-based NOR nonvolatile memory cells 700 of FIGS. 4a and 4b are mirrored and connected in series to form the self-aligned two-transistor NAND-like FLOTOX-based NOR nonvolatile memory cell 775. A first of the self-aligned one-transistor FLOTOX-based NOR nonvolatile memory cell FT0 has its drain connected to the contact metallurgy 710a that is connected to an associated bit line BL. The tunneling oxide window opening TOW0 area is placed adjacent the drain diffusion 720a. The drain diffusion of the second self-aligned one-transistor FLOTOX-based NOR nonvolatile memory cell FT1 is connected to the contact metallurgy 710b that is connected to an associated source line SL. In this embodiment, the tunneling oxide window opening TOW is has one edge approximately at the center of the drain diffusion 720a that is connected to the bit line BL. A second edge of the tunneling oxide window opening TOW is approximately at the center of drain diffusion 720b that is connected to the source line SL.

Two regions 750a and 750b of the second level polycrystalline silicon layer form the control gates CG0 and CG1 respectively. The control gate CG0 is connected to the word line WL0 and the control gate CG1 is connected to the word line WL1. Two regions 745a and 745b of the first level polycrystalline silicon layer form the floating gates FG0 and FG1 respectively. Each of the floating gates FG0 and FG1 has first and second extensions wing 746a, 746b, 746c, and 746b as shown in FIGS. 12a and 12c. The length $L_{WING}$ of the first and second extensions wing 746a, 746b, 746c, and 746b are determined as described above for FIGS. 12a-12c. The floating gates FG0 and FG1 are separated from the P-type substrate by the gate oxide 740. The gate oxide 740 is thinned as described above to form the tunneling oxide region TOW.

The two self-aligned one-transistor FLOTOX-based NOR nonvolatile memory cells FT0 and FT1 have a common source diffusion 780. The common source diffusion 780 has no contact metallurgy for connecting externally and therefore permits the size of the joint cell to be smaller than two separate self-aligned one-transistor FLOTOX-based NOR nonvolatile memory cell 700 of FIGS. 12a and 12b. The self-aligned two-transistor NAND-like FLOTOX-based NOR nonvolatile memory cell 775 requires only one bit line BL and one source line SL for the operation of the two self-aligned one-transistor FLOTOX-based NOR nonvolatile memory cells FT0 and FT1. The lack of contact for the common source diffusion 780 and the single bit line BL and the single source line SL permits a reduction in cell size of approximately 15% over two self-aligned one-transistor FLOTOX-based NOR nonvolatile memory cells 700 of FIGS. 12a and 12b.

The effective length $L_{eff}$ and width $W_{eff}$ of channels 755a and 755b, are determined as shown for the self-aligned one-transistor FLOTOX-based NOR nonvolatile memory cell 700 of FIGS. 12a, 12b, and 12c. The operational voltages are essentially the same for programming and erasing operations. Since one of the two self-aligned one-transistor FLOTOX-based NOR nonvolatile memory cells FT0 and FT1 functions as a select transistor during a read operation, the select voltage differs from the select voltage of a two-transistor FLOTOX-based nonvolatile memory cell 700 of the prior art. In the read operation, the word line WL0 and WL1 for the self-aligned one-transistor FLOTOX-based NOR nonvolatile memory cell FT0 and FT1 functioning as the select transistor is set to a read select voltage level of from approximately 4.0V to approximately 5.0V. As a consequence of the read select voltage level the row read control circuitry is more complicated than that of the prior art.

Figure 14A:
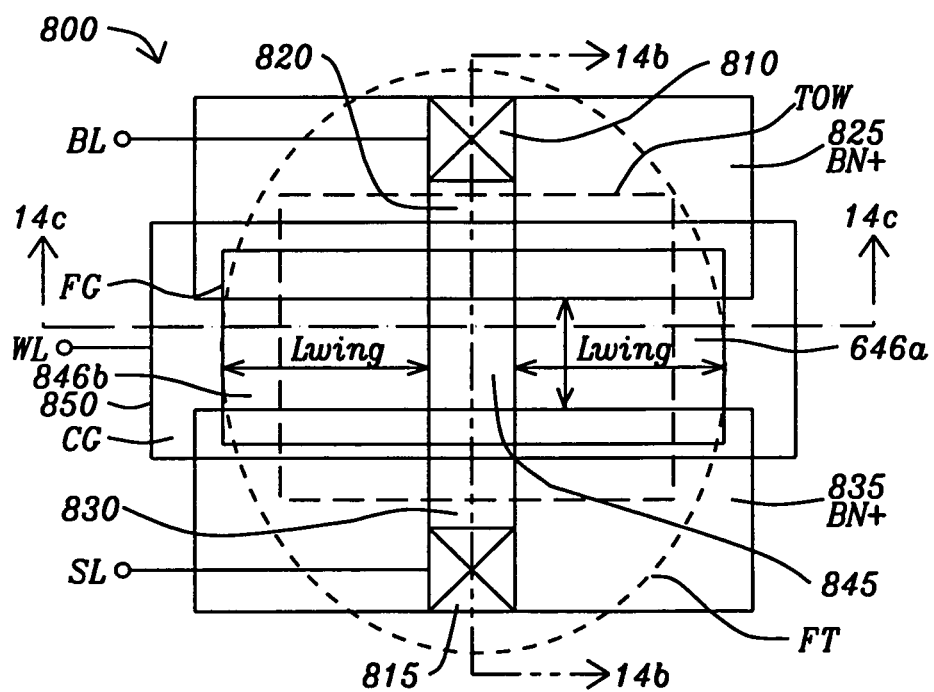
FIG. 14a is a diagram of a top view of a non-self-aligned one-transistor FLOTOX-based NOR nonvolatile memory cell embodying the concepts of the present invention.
Figure 14B:
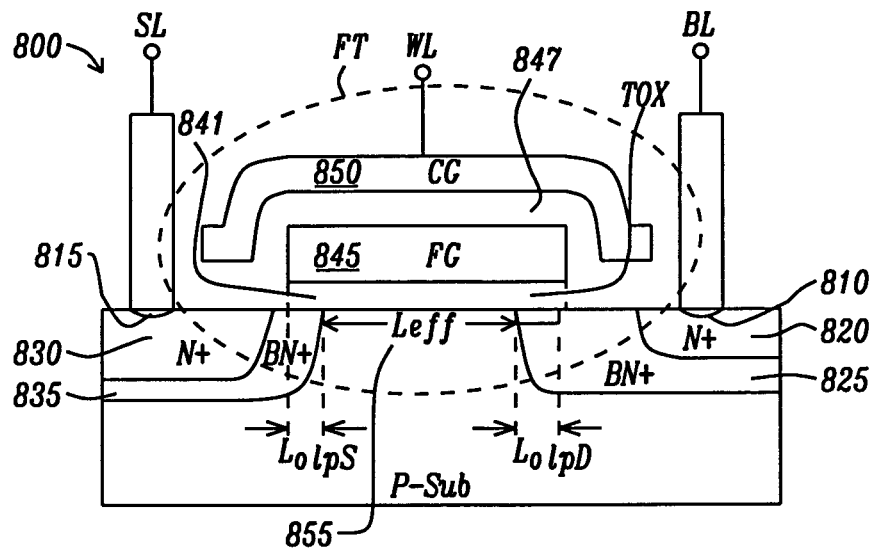
FIG. 14b is a diagram of a longitudinal cross sectional view of the non-self-aligned one-transistor FLOTOX-based NOR nonvolatile memory cell embodying the concepts of the present invention.
Figure 14C:
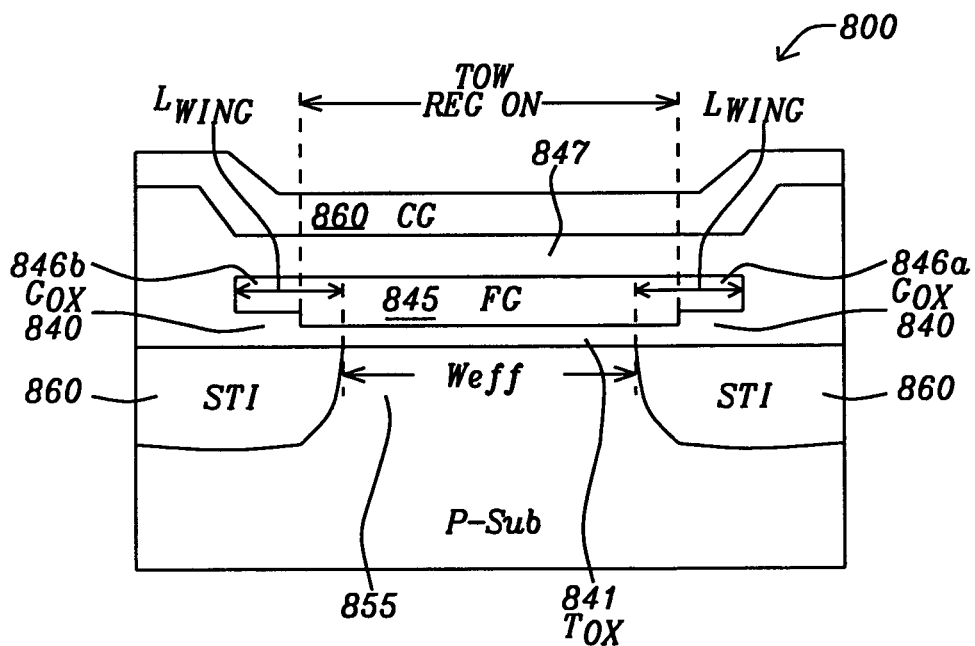
FIG. 14c is a diagram of a lateral cross sectional view of the non-self aligned one-transistor FLOTOX-based NOR nonvolatile memory cell embodying the concepts of the present invention.

FIG. 14a is a diagram of a top view of a non-self-aligned one-transistor FLOTOX-based NOR nonvolatile memory cell embodying the concepts of the present invention. FIG. 14b is a diagram of a longitudinal cross sectional view of the non-self-aligned one-transistor FLOTOX-based NOR nonvolatile memory cell embodying the concepts of the present invention. FIG. 14c is a diagram of a lateral cross sectional view of the non-self-aligned one-transistor FLOTOX-based NOR nonvolatile memory cell embodying the concepts of the present invention. In various embodiments, the one-transistor FLOTOX-based NOR nonvolatile memory cell 800 is formed as a non-self-aligned floating gate transistor FT. A P-type substrate P-sub is has a shallow trench removed and filled with an insulating material to form the shallow trench isolation 860 that defines the width of the non-self-aligned floating gate transistor. An implantation of an N+ impurity species into the surface of the P-type substrate P-sub forms the N+ drain diffusion 820 and the N+ source diffusion 830. The bit line contact 810 is formed to attach the bit line BL to the N+ drain diffusion 820. The source line contact 815 is formed to attach the source line SL to the N+ source diffusion 830.

The first level of the polycrystalline silicon 845 is further deposited over the two shallow trench isolations 860 by length $L_{WING}$ to form the first overlapping extension wing 846a and second overlapping extensions wing 846b. The length $L_{WING}$ is determined by the capacitance needed between the floating gate FG and the control gate CG for maintaining the constant coupling ratio as the dimensions of the self-aligned one-transistor FLOTOX-based NOR nonvolatile memory cell is decreased and the high program voltage and erase voltages across the channel 855 are reduced.

The tunneling oxide window opening TOW is formed under the floating gate and extended on a first edge from a approximate midpoint of the buried implant layer BN+ 825 and drain diffusion 820 to the approximate midpoint of the buried implant layers BN+ 835 and source diffusion 830 at a second edge. The third and fourth edges of the tunneling oxide window TOW are extended into a portion of the shallow trench isolations 860. An interlayer dielectric layer 847 is formed of deposited silicon oxide-silicon nitride-silicon oxide (ONO) is deposited on the floating gate FG to form an insulation layer for the floating gate FG. A second polycrystalline silicon layer 850 is deposited on the interlayer dielectric layer 747 to form the control gate CG. The control gate CG is connected to the word line WL in an array of the one-transistor FLOTOX-based NOR nonvolatile memory cells 800. The bit line contact 710 is formed to attach the bit line BL to the N+ drain diffusion 720. The source line contact 715 is formed to attach the source line SL to the N+ source diffusion 730.

As in the prior art, the coupling ratio $CR_{CG-FG}$ from the second level of the polycrystalline silicon 850 of the control gate CG to the first polycrystalline silicon 845 of the floating gate FG is maintained to be from approximately 60% to approximately 70%. The coupling ratio $CR_{FG-D}$ from drain 820 to the floating gate FG is maintained to be from approximately 10% to approximately 20%. With voltage levels of the method of operation for programming and erasing the one-transistor FLOTOX-based NOR nonvolatile memory cell 800, the length of the channel 855 is reduced from that of the prior art shown in FIGS. 1b and 1c. In order to keep the identical coupling ratio as described above from the control gate CG to the floating gate FG or from the channel region 855 to the floating gate FG, the effective width Weff of the channel, the length $L_{WING}$ of the first and second extensions wing 846a and 846b, the thickness of the interlayer dielectric layer 847 are modified to determine control gate to floating gate capacitance $C_{CG-FG}$. The control gate to floating gate capacitance $C_{CG-FG}$ is determined according to the following formula:

$$C_{CG-FG} = \varepsilon_0 \frac{A_{FG}}{4\pi d_{ILD}}$$

where:
$\varepsilon_0$ is the dielectric constant of the interlayer dielectric layer 847.
$A_{FG}$ is the area of the control gate and floating gate and is dependent on the size of channel length Leff, channel width Weff, and the length $L_{WING}$ of the first and second extensions wing 846a and 846b.
$d_{ILD}$ is thickness of the interlayer dielectric layer 847.

The floating gate to channel capacitance $C_{FG-CH}$ is the capacitance of the channel region 855 to first level of the polycrystalline silicon 845 of the floating gate FG and is determined by the formula:

$$C_{FG-CH} = \varepsilon_0 \frac{A_{CHAN}}{4\pi d_{TOX}}$$

where:
$\varepsilon_0$ is the dielectric constant of the tunneling oxide layer 841.
$A_{CHAN}$ is the area of the channel and is dependent on the size of channel length Leff and channel width Weff.
$d_{TOX}$ is thickness of the tunneling oxide layer 841.

The floating gate to the drain capacitance $C_{FG-D}$ is the capacitance between the floating gate FG and the area 821 that the floating gate FG overlaps the drain region 820.

$$C_{FG-D} = \varepsilon_0 \frac{A_{OLPD}}{4\pi d_{TOX}}$$

where:
$\varepsilon_0$ is the dielectric constant of the tunneling oxide layer 841.
$A_{OLPD}$ is the area of the channel and is dependent on the length $L_{olpD}$ of the Floating gate FG to drain 820 overlap and the channel width Weff.
$d_{TOX}$ is thickness of the tunneling oxide layer 841.

The floating gate to the source capacitance $C_{FG-S}$ is the capacitance between the floating gate FG and the area 831 that the floating gate FG overlaps the source region 830.

$$C_{FG-S} = \varepsilon_0 \frac{A_{OLPS}}{4\pi d_{TOX}}$$

where:
$\varepsilon_0$ is the dielectric constant of the tunneling oxide layer 841.
$A_{OLPS}$ is the area of the channel and is dependent on the length $L_{olpS}$ of the Floating gate FG to source 830 overlap and the channel width Weff.
$d_{TOX}$ is thickness of the tunneling oxide layer 841.

The coupling ratio $CR_{CG-FG}$ for the control gate to floating gate capacitance is determined by the formula:

$$CR_{CG-FG} = \frac{C_{CG-FG}}{C_{TOTAL}}$$

where:
$C_{CG-FG}$ is the control gate to floating gate capacitance determined above.
$C_{TOTAL}$ is the sum of the capacitances from the control gate CG to the substrate P-Sub is determined by the formula:

$$C_{TOTAL} = C_{CG-FG} + C_{FG-CHAN} + C_{FG-D} + C_{FG-S}.$$

The coupling ratio $CR_{FG-D}$ for the floating gate capacitance to drain capacitance $C_{FC-D}$ is determined by the formula:

$$CR_{FG-D} = \frac{C_{FG-D}}{C_{TOTAL}}$$

where:
$C_{FC-D}$ is the floating gate to drain 820 capacitance; and
$C_{TOTAL}$ is the total capacitance determined above The dimensions of the length $L_{WING}$ of the first and second extensions wing 746a and 746b, the channel length Leff, the channel width Weff, and length Lolp the floating gate FG to drain 72 are determined from the above formulas to maintain the to coupling ratios $CR_{CG-FG}$ and $CR_{FG-D}$ at constant values. The dielectric constant $\varepsilon_{0ONO}$ for the interlayer dielectric 747 and the dielectric constant $\varepsilon_{0TOX}$ for the tunneling oxide 741 are different and are determined by the materials (Oxide-Nitride-Oxide for the interlayer dielectric 747 and silicon oxide for the tunneling oxide 741) of each layer 747 and 741.

The tunneling window TOW is shown to cover only the self-aligned FLOTOX-based NOR nonvolatile memory transistor FT, but may be expanded to even cover the entire memory array area with one big open window to reduce manufacturing process complexity and enhance the manufacturing yield.

Increasing the tunneling region of the self-aligned FLOTOX-based NOR nonvolatile memory transistor FT reduces the coupling ratio $CR_{CG-FG}$ from the control gate CG to the floating gate FG due to the capacitance $C_{FG-SUB}$ between floating gate FG to the p-type substrate P-SUB is increased. To compensate, the length $L_{WING}$ of the first and second extensions wing 746a and 746b is increased. By increasing the length $L_{WING}$ of the first and second extension wings 746a and 746b, the coupling ratio $CR_{CG-FG}$ can be increased and the required very large erase voltage level and very large program voltage level is not increased. The operation voltages of the non-self-aligned one-transistor FLOTOX-based NOR nonvolatile memory cell 800 is identical to the operational voltages of the self-aligned one-transistor FLOTOX-based NOR nonvolatile memory cell 700 of FIGS. 6a, 6b, and 6c.

Figure 15A:
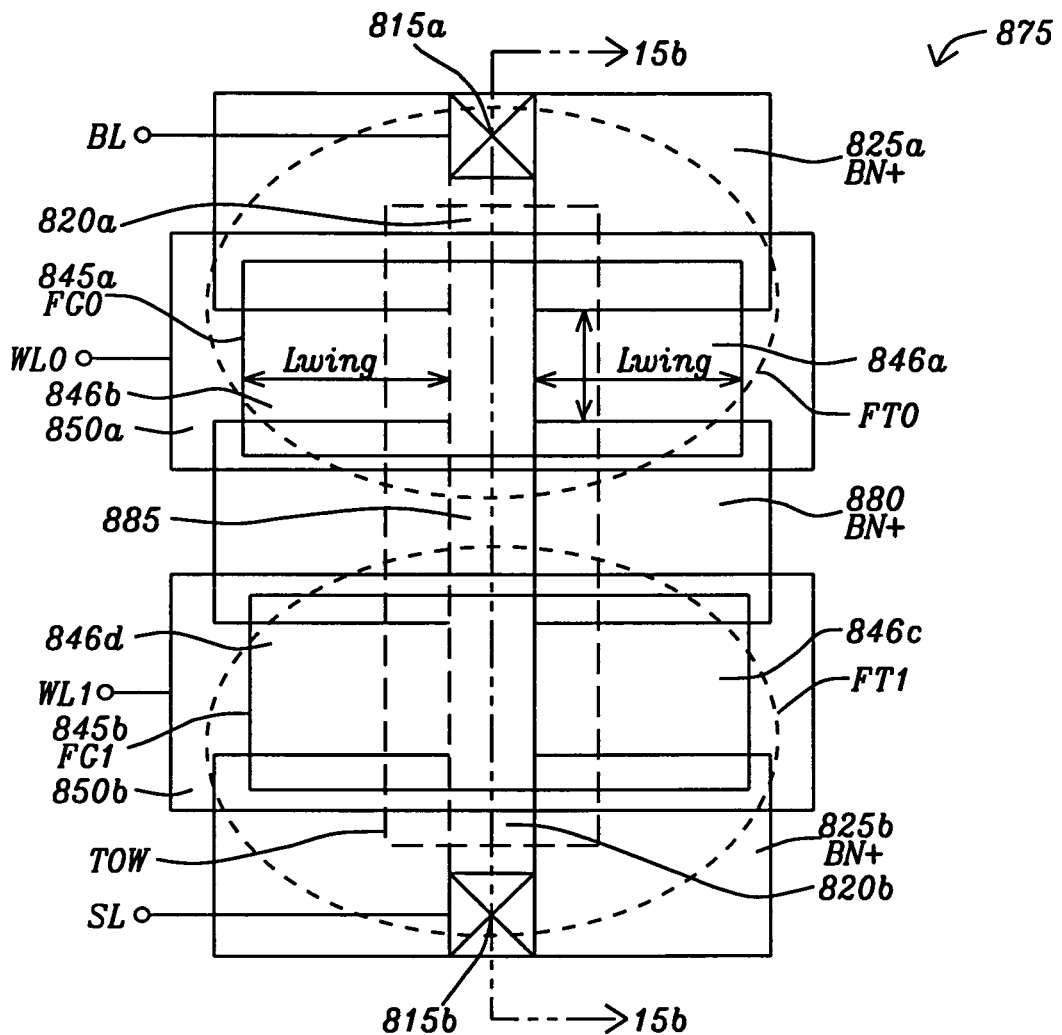
FIG. 15a is a diagram of a top view of a non-self-aligned two-transistor NAND-like FLOTOX-based NOR nonvolatile memory cell embodying the concepts of the present invention.
Figure 15B:
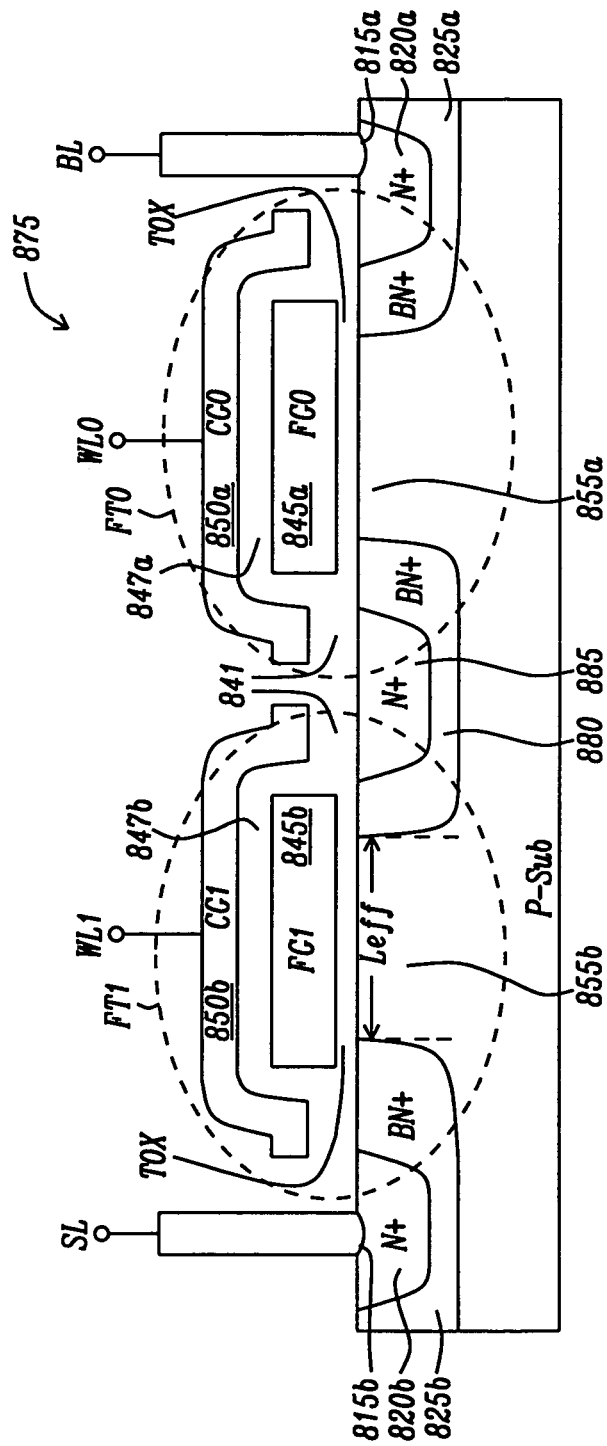
FIG. 15b is a diagram of a cross sectional view of the non-self-aligned two-transistor NAND-like FLOTOX-based NOR nonvolatile memory cell embodying the concepts of the present invention.

FIG. 15a is a diagram of a top view of a non-self-aligned two-transistor NAND-like FLOTOX-based NOR nonvolatile memory cell 875 embodying the concepts of the present invention. FIG. 15b is a diagram of a cross sectional view of the non-self-aligned two-transistor NAND-like FLOTOX-based NOR nonvolatile memory cell 875 embodying the concepts of the present invention. Two of the non-self-aligned one-transistor FLOTOX-based NOR nonvolatile memory cells 800 of FIGS. 14a and 14b are mirrored and connected in series to form the non-self-aligned two-transistor NAND-like FLOTOX-based NOR nonvolatile memory cell 875. A first of the non-self-aligned one-transistor FLOTOX-based NOR nonvolatile memory cell FT0 has its N+ drain diffusion 820a connected to the contact metallurgy 815a that is connected to an associated bit line BL and surrounded by the buried implant layers BN+ 825a. The tunneling oxide window opening TOW has one edge approximately at the center of the drain diffusion 820a that is connected to the bit line BL. A second edge of the tunneling oxide window opening TOW is approximately at the center of drain diffusion 820b that is connected to the source line SL.

Two regions 850a and 850b of the second level polycrystalline silicon layer form the control gates CG0 and CG1 respectively. The control gate CG0 is connected to the word line WL0 and the control gate CG1 is connected to the word line WL1. Two regions 845a and 845b of the first level polycrystalline silicon layer form the floating gates FG0 and FG1 respectively. Each of the floating gates FG0 and FG1 has first and second extensions wing 846a, 846b, 846c, and 846b as shown in FIGS. 12a and 12c. The length $L_{WING}$ of the first and second extensions wing 846a, 846b, 846c, and 846b are determined as described above for FIGS. 14a-14c. The floating gates FG0 and FG1 are separated from the P-type substrate by the gate oxide 840. The gate oxide 840 is thinned as described above to form the tunneling oxide regions TOW.

The two non-self-aligned one-transistor FLOTOX-based NOR nonvolatile memory cells FT0 and FT1 have a common source diffusion 880 surrounded by the buried implant layer BN+ 885. The common source diffusion 880 has no contact metallurgy for connected externally and therefore permits the size of the joint cell to be smaller than two separate non-self-aligned one-transistor FLOTOX-based NOR nonvolatile memory cell 800 of FIGS. 6a and 6b. The non-self-aligned two-transistor NAND-like FLOTOX-based NOR nonvolatile memory cell 875 requires only one bit line BL and one source line SL for the operation of the two non-self-aligned one-transistor FLOTOX-based NOR nonvolatile memory cells FT0 and FT1. The lack of contact for the common source diffusion 880 and the single bit line BL and the single source line SL permits a reduction in cell size of approximately 15% over two non-self-aligned one-transistor FLOTOX-based NOR nonvolatile memory cells 800 of FIGS. 6a and 6b.

The effective length $L_{eff}$ and width Weff of channels 855a and 855b are determined as shown for the non-self-aligned one-transistor FLOTOX-based NOR nonvolatile memory cell 800 of FIGS. 14a and 14b. The operational voltages are essentially the same for programming and erasing operations. Since one of the two non-self-aligned one-transistor FLOTOX-based NOR nonvolatile memory cells FT0 and FT1 functions as a select transistor during a read operation, the select voltage differs from the select voltage of a two-transistor FLOTOX-based nonvolatile memory cell 800 of the prior art. In the read operation, the word line WL0 and WL1 for the non-self-aligned one-transistor FLOTOX-based NOR nonvolatile memory cell FT0 and FT1 functioning as the select transistor is set to a read select voltage level of from approximately 4.0V to approximately 5.0V. As a consequence of the read select voltage level the row read control circuitry is more complicated than that of the prior art.

Figures 1, 16C:
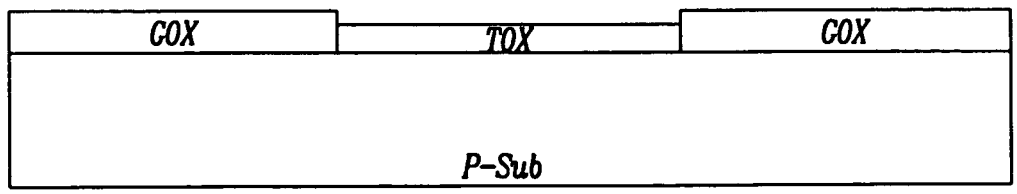
Figures 2, 16C:
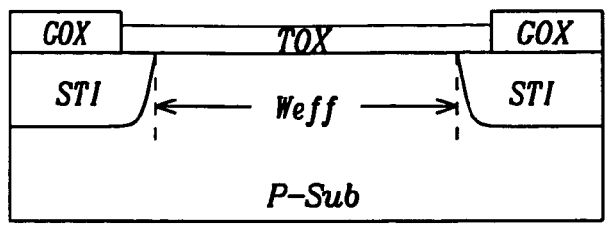
Figures 3, 16C:
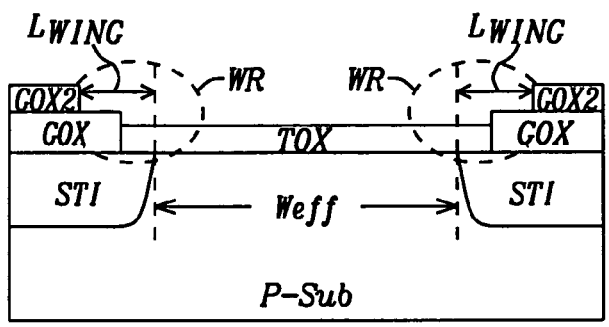

FIGS. 16a, 16b-1, 16b-2, 16c-1, 16c-2, 16c-3, 16d-1, 16d-2, 16e-1, 16e-2, 16f-1, 16f-2, 16g-1, 16g-2, 16h-1, 16h-2, and 16i are cross sectional drawings of a process for forming a one-transistor FLOTOX-based NOR nonvolatile memory cell embodying the concepts of the present invention. In FIG. 16a, the surface of a provided P-type substrate P-Sub is ion etched to form shallow trenches. The width Weff is designed to be the channel width of the FLOTOX-based NOR nonvolatile transistor. The shallow trenches are then filled with an insulation material such as silicon dioxide. The silicon dioxide is then polished with chemical-mechanical planarization to remove the excess silicon dioxide from the surface of the P-type substrate P-Sub to form the shallow trench isolation regions STI. Referring to FIGS. 16b-1 and 16b-2, a gate oxide GOX is thermally grown on the surface of the sub P-type substrate P-Sub and the shallow trench isolation areas. Referring to 16c-1, 16c-2 the gate oxide GOX is etched to thin the gate oxide GOX to a thickness of approximately 100 Å to form the tunneling oxide layer TOX that defines the tunneling oxide window region. In FIG. 16c-3, an additional layer of gate oxide GOX2 is deposited to define the extension wings WR over the shallow trench isolation regions STI.

Figures 1, 16D:
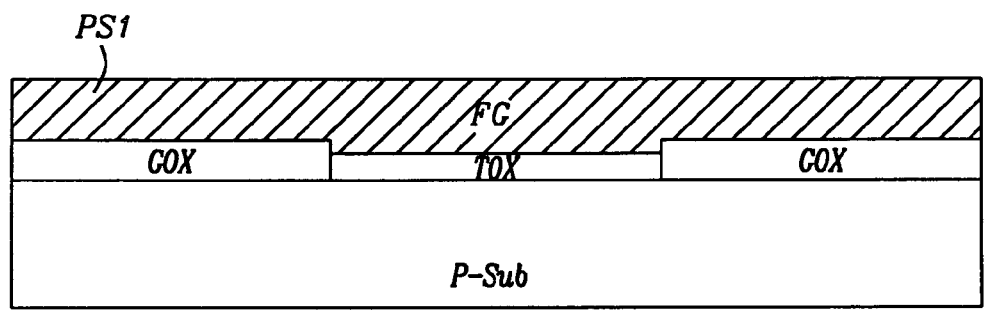
Figures 2, 16D:
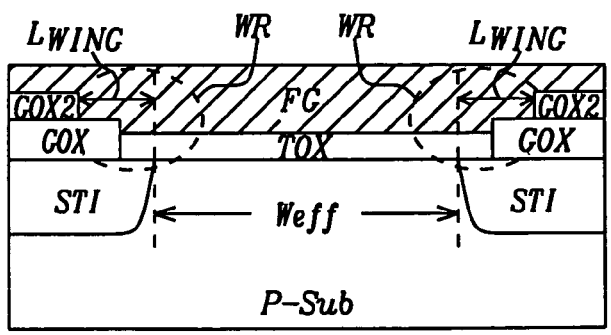
Figures 1, 16E:
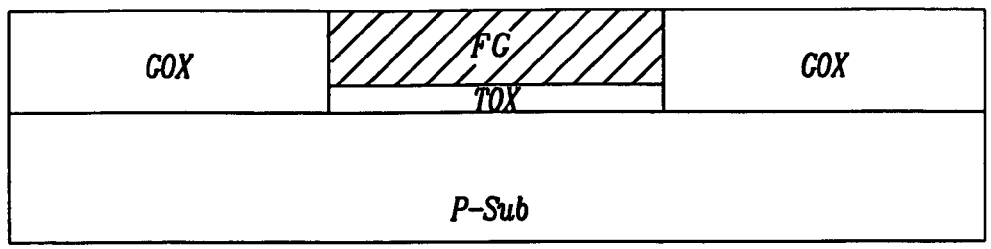
Figures 2, 16E:
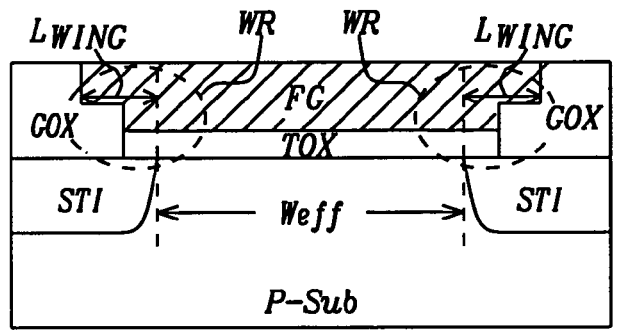
Figures 1, 16F:
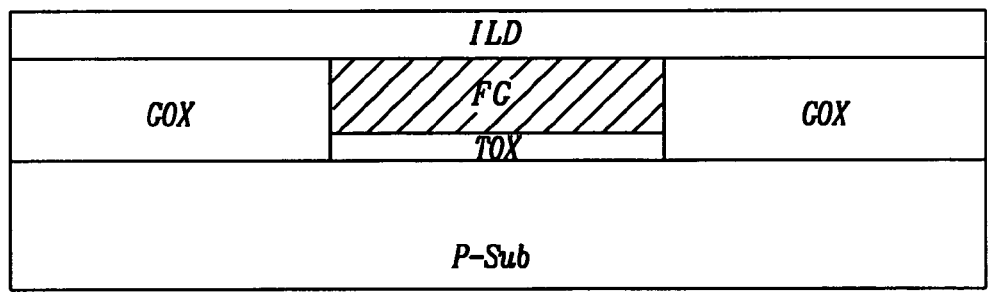
Figures 2, 16F:
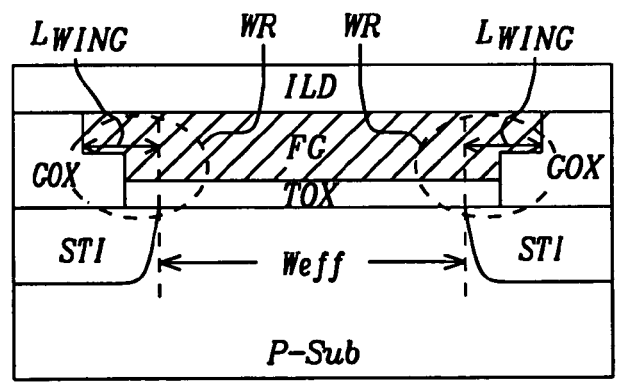
Figures 1, 16G:
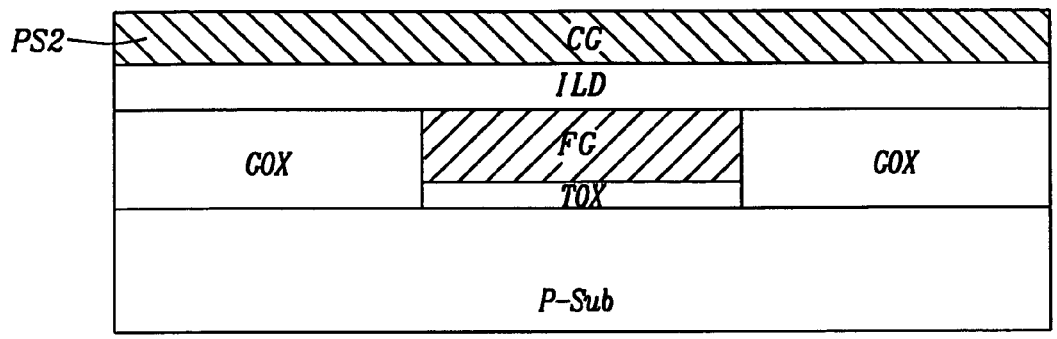
Figures 2, 16G:
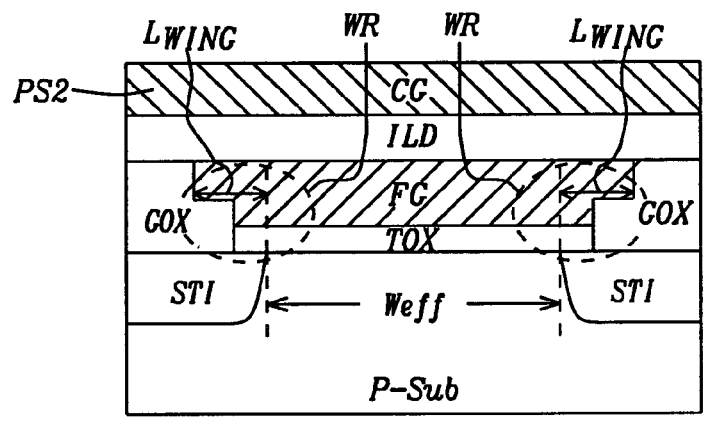

In FIGS. 16d-1 and 16d-2, a first polycrystalline silicon layer PS1 that will define the floating gate FG of the FLOTOX-based NOR nonvolatile transistor is deposited on the surface of the P-type substrate P-Sub. The first polycrystalline silicon layer PS1 is coated with photoresistive material to define the floating gate FG of the FLOTOX-based NOR nonvolatile transistor. The first polycrystalline silicon layer FG is then etched to eliminate the excess material of the first polycrystalline silicon layer FG and leaving the floating gate FG of the FLOTOX-based NOR nonvolatile transistor with the extension wings WR over the shallow trench isolation regions STI, as shown in FIGS. 16e-1 and 16e-2. Referring to FIGS. 16f-1 and 16f-2, an interlayer dielectric ILD is formed on the surface of the P-type substrate P-Sub. A second polycrystalline silicon layer PS2 is then deposited on the surface of the interlayer dielectric ILD, as shown in FIGS. 16g-1 and 16g-2.

Figures 1, 16H:
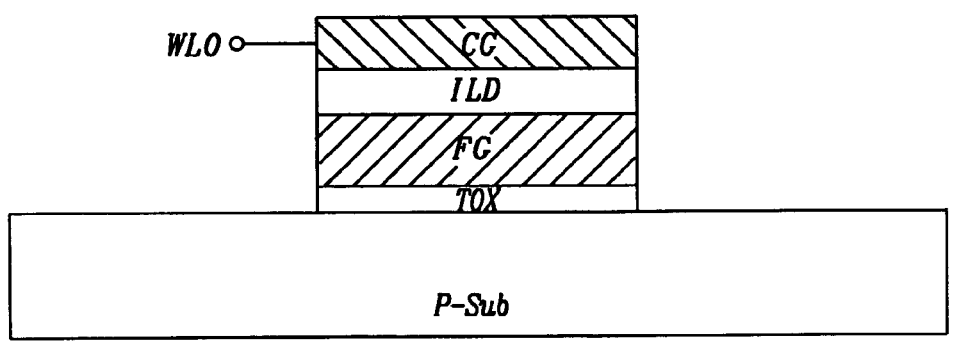
Figures 2, 16H:
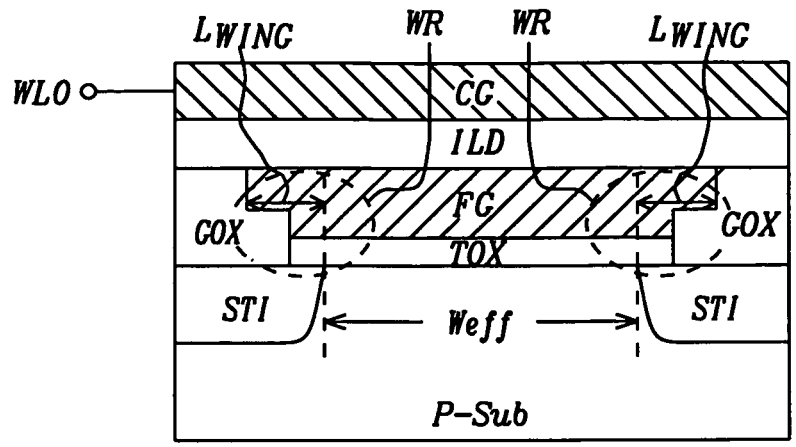
Figure 16I:
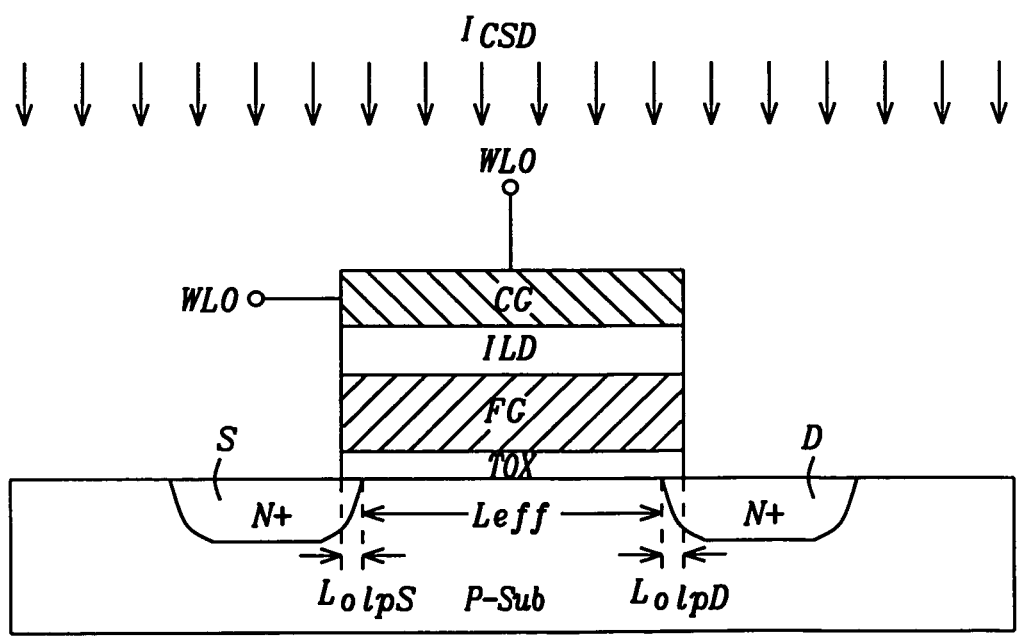

The surface of the P-type substrate is then coated with a photoresistive material to define the source and drain regions of the FLOTOX-based NOR nonvolatile transistor. The second polycrystalline silicon layer PS2, the interlayer dielectric ILD, first polycrystalline silicon layer PS1 that is the floating gate FG, and the tunneling oxide TOX are etched to expose the surface of the P-type substrate P-Sub as shown in FIGS. 16h-1 and 16h-2. Referring to FIG. 16i, an N-type impurity material $I_{CSD}$ is implanted into the surface of the P-type substrate P-Sub to form the drain and source of the FLOTOX-based NOR nonvolatile transistor. The factors for the implant of the N-type impurity material $I_{CSD}$ determine an overlap length Lolp of the drain and source beneath the floating gate FG.

The distance Leff between the drain D and the source S is one of the factors that determines the drain to source breakdown voltage BVDS of the FLOTOX-based NOR nonvolatile transistor. To decrease the distance Leff, the very large program voltage level and the very large erase voltage level must be decreased. The very large program voltage level and the very large erase voltage level have to be sufficiently large to initiate the Fowler-Norheim tunneling phenomenon for programming and erasing the FLOTOX-based NOR nonvolatile transistor.

As described above, to maintain the performance of the FLOTOX-based NOR nonvolatile transistor, the coupling ratio $CR_{CG-FG}$ from the control gate CG to the floating gate FG is maintained to be from approximately 60% to approximately 70%. The coupling ratio $CR_{FG-D}$ from drain 820 to the floating gate FG is maintained to be from approximately 10% to approximately 20%. With voltage levels of the method of operation for programming and erasing the FLOTOX-based NOR nonvolatile transistor, the length Leff of the channel region between the drain D and the source S is reduced from that of the prior art shown in FIGS. 1b and 1c. In order to keep the identical coupling ratio as described above for Eq. 5 and Eq. 6 from the control gate CG to the floating gate FG or from the channel region between the drain D and the source S to the floating gate FG, the effective width Weff of the channel region between the drain D and the source S, the length $L_{WING}$ of the first and second extensions wings WR, the thickness of the interlayer dielectric layer ILD is modified to determine control gate to floating gate capacitance $C_{CG-FG}$ as described in equation Eq. 1. The floating gate to drain capacitance $C_{FG-CHAN}$ is the capacitance from the floating gate FG and the channel region 855 and is determined by the length Leff of the channel 855 and the width of the channel Weff, as described in equation Eq. 2 above. The floating gate to drain capacitance $C_{FG-D}$ is the capacitance from the overlap region of the floating gate FG and the drain region D and is determined by the length of the overlap $L_{olpD}$ and the width of the channel Weff, as described in equation Eq. 3 above. The floating gate to source capacitance $C_{FG-s}$ is the capacitance from the overlap region of the floating gate FG and the Source region D and is determined by the length of the overlap $L_{ows}$ and the width of the channel Weff, as described in equation Eq. 4 above.

The process steps as defined in FIGS. 16a, 16b-1, 16b-2, 16c-1, 16c-2, 16c-3, 16d-1, 16d-2, 16e-1, 16e-2, 16f-1, 16f-2, 16g-1, 16g-2, 16h-1, 16h-2, and 16i define the fabrication of a self-aligned FLOTOX-based NOR nonvolatile transistor. It would be apparent to one skilled in the art that a non-self-aligned FLOTOX-based NOR nonvolatile transistor would be constructed by forming the drain region D and the source region S prior to the deposition of the insulation material to form the gate oxide GOX of FIGS. 16b-1 and 16b-2. The processes that determine the length Leff and width Weff of the channel, the thickness of the tunneling oxide TOX, the structure and length $L_{wing}$ of the extension wings WR over the shallow trench isolation regions STI remain as described above. The dimensions of these structures are appropriately modified to maintain a constant coupling ratio while decreasing the dimensions of the FLOTOX-based NOR nonvolatile transistor to embody the concepts of the present invention. Further the processes as shown are for a single FLOTOX-based NOR nonvolatile transistor. However, the process steps as described are applicable to the NAND-like NOR circuits of FIGS. 13a and 13b and FIGS. 15a and 15b.

While this invention has been particularly shown and described with reference to the preferred embodiments thereof, it will be understood by those skilled in the art that various changes in form and details may be made without departing from the spirit and scope of the invention.

The invention claimed is:

1. A method for forming a FLOTOX-based nonvolatile memory cell comprising:
    forming at least one floating gate tunneling oxide transistor on a substrate diffused with an impurity of a first conductivity type, wherein forming the floating gate tunneling oxide transistor comprises:
        diffusing an impurity of a second conductivity type to form a drain region,
        diffusing an impurity of a second conductivity type to form a source region,
        forming a channel region by separating the drain region and the source region,
        forming a gate insulation layer on the substrate over the drain region, the source region and the channel region,
        thinning an area of the gate insulation layer to form a tunneling insulation window over the channel region overlapping a portion of the drain region and the source region,
        forming a floating gate as a first conductive layer formed over the tunneling insulation window to allow charges to tunnel between the floating gate and the channel region and the drain region during a programming procedure and an erasing procedure of the FLOTOX-based nonvolatile memory cell, such that a floating gate to drain capacitance is determined by the width of the channel region and an overlap length of the floating gate over the drain region and a thickness of the tunneling oxide,
        forming an interlayer dielectric layer on the floating gate for providing electrical insulation to the floating gate, and
        forming a control gate of a second conductive layer on the interlayer dielectric layer such that a control gate to floating gate capacitance is determined by an area of the floating gate with a wing extension and a thickness of the interlayer dielectric layer;
    wherein a coupling ratio of the control gate to the floating gate and a coupling ratio of the floating gate to the drain are maintained as a constant as a space occupied by the FLOTOX-based nonvolatile memory cell is decreased by adjusting the length and width of the channel region and a length of the wing extensions.

2. The method for forming the FLOTOX-based nonvolatile memory cell of claim 1 wherein the coupling ratio of the control gate to the floating gate of the floating gate tunneling oxide transistor is from approximately 60% to approximately 70% and the coupling ratio of the floating gate to the drain region of the floating gate tunneling oxide transistor is maintained as a constant of from approximately 10% to approximately 20% and such that the length of the channel region is decreased and a drain-to-source voltage during programming does not exceed a drain-to-source breakdown voltage.

3. The method for forming the FLOTOX-based nonvolatile memory cell of claim 1 wherein diffusing the drain region and the source region comprises etching the control gate, the interlayer dielectric, the floating gate, and the gate insulation layer to form a self-aligned structure.

4. The method for forming the FLOTOX-based nonvolatile memory cell of claim 1 wherein forming the control gate comprises overlapping the drain region and the source region by covering the floating gate to form a non-self-aligned structure of the floating gate tunneling oxide transistor.

5. The method for forming the FLOTOX-based nonvolatile memory cell of claim 1 wherein a programmed threshold voltage level and an erased voltage threshold voltage level are positive voltage levels with the erased threshold voltage level is more positive than the programmed threshold voltage level.

6. The method for forming the FLOTOX-based nonvolatile memory cell of claim 5 wherein the programmed threshold voltage level is from approximately 0.5 V to approximately 1.0V.

7. The method for forming the FLOTOX-based nonvolatile memory cell of claim 5 wherein the erase threshold voltage level is from greater than 3.0V.

\* \* \* \* \*